(12) United States Patent
Watanabe et al.

(10) Patent No.: US 7,439,010 B2
(45) Date of Patent: *Oct. 21, 2008

(54) ALKALI-SOLUBLE SILOXANE POLYMER, POSITIVE TYPE RESIST COMPOSITION, RESIST PATTERN, PROCESS FOR FORMING THE SAME, ELECTRONIC DEVICE AND PROCESS FOR MANUFACTURING THE SAME

(75) Inventors: Keiji Watanabe, Kawasaki (JP); Miwa Kozawa, Kawasaki (JP); Shoichi Suda, Kawasaki (JP); Fumi Yamaguchi, Ibaraki (JP); Isao Yahagi, Ibaraki (JP); Michitaka Morikawa, Ibaraki (JP)

(73) Assignee: Fujitsu Limited, Kawasaki (JP)

( * ) Notice: Subject to any disclaimer, the term of this patent is extended or adjusted under 35 U.S.C. 154(b) by 71 days.

This patent is subject to a terminal disclaimer.

(21) Appl. No.: 11/124,121

(22) Filed: May 9, 2005

(65) Prior Publication Data

US 2005/0221227 A1 Oct. 6, 2005

Related U.S. Application Data

(62) Division of application No. 10/329,992, filed on Dec. 27, 2002, now Pat. No. 6,949,324.

(30) Foreign Application Priority Data

Dec. 28, 2001 (JP) ............................ 2001-398856
Dec. 25, 2002 (JP) ............................ 2002-375658

(51) Int. Cl.
*G03F 7/20* (2006.01)
*G03F 7/30* (2006.01)
*G03F 7/36* (2006.01)
*G03F 7/039* (2006.01)

(52) U.S. Cl. .................. 430/313; 430/311; 430/317; 430/326

(58) Field of Classification Search .................. None
See application file for complete search history.

(56) References Cited

U.S. PATENT DOCUMENTS

| 4,564,579 | A | 1/1986 | Morita et al. |
| 4,615,782 | A | 10/1986 | Namatsu et al. |
| 4,946,921 | A | 8/1990 | Shirahata et al. |
| 5,389,492 | A | 2/1995 | Kokubo et al. |
| 5,422,223 | A | 6/1995 | Sachdev et al. |
| 5,882,844 | A | 3/1999 | Tsuchiya et al. |
| 6,342,562 | B1 | 1/2002 | Kozawa et al. |
| 6,541,077 | B1 | 4/2003 | Kozawa et al. |
| 7,208,423 | B2 * | 4/2007 | Hashimoto et al. .......... 438/717 |
| 2002/0025495 | A1 | 2/2002 | Ogata et al. |

FOREIGN PATENT DOCUMENTS

| JP | S64-46746 | 2/1989 |
| JP | H01-292036 | 11/1989 |
| JP | H05-27441 | 2/1993 |
| JP | H05-265218 | 10/1993 |
| JP | H06-27671 | 2/1994 |
| JP | H09-249749 | 9/1997 |
| JP | H10-319594 | 12/1998 |
| JP | 2001-154366 | 6/2001 |

* cited by examiner

*Primary Examiner*—Sin J. Lee
(74) *Attorney, Agent, or Firm*—Westerman, Hattori, Daniels & Adrian, LLP.

(57) ABSTRACT

A positive type resist composition having an alkali-soluble siloxane polymer expressed by the following Formula (1), a photosensitive compound, and a 1 μm thick resist film formed of the positive type resist composition which has 5% to 60% of transmittance to i-line radiation;

Formula (1)

$$(SiO_{4/2})_a(O_{1/2}Si\underset{R^2}{\overset{R^1}{-}}A)_b(O_{3/2}SiOH)_c$$

in the Formula (1), $R^1$ and $R^2$ express a monovalent organic group, and may be identical or different;

"A" is a group expressed by the following Formula (2) having at least one phenolic hydroxyl group; and "a", "b," and "c" satisfy the following relation; a+b+c=1,

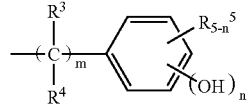

Formula (2)

in the Formula (2), $R^3$, $R^4$, and $R^5$ express one of a hydrogen atom and a monovalent organic group, and may be identical or different, "m" expresses an integer, and "n" expresses an integer of 1 to 5.

Preferably, $0.25 \leqq a \leqq 0.60$, and $0 \leqq c \leqq 0.25$. The composition is preferably used in a resist film undergoing oxygen plasma etching.

15 Claims, 26 Drawing Sheets

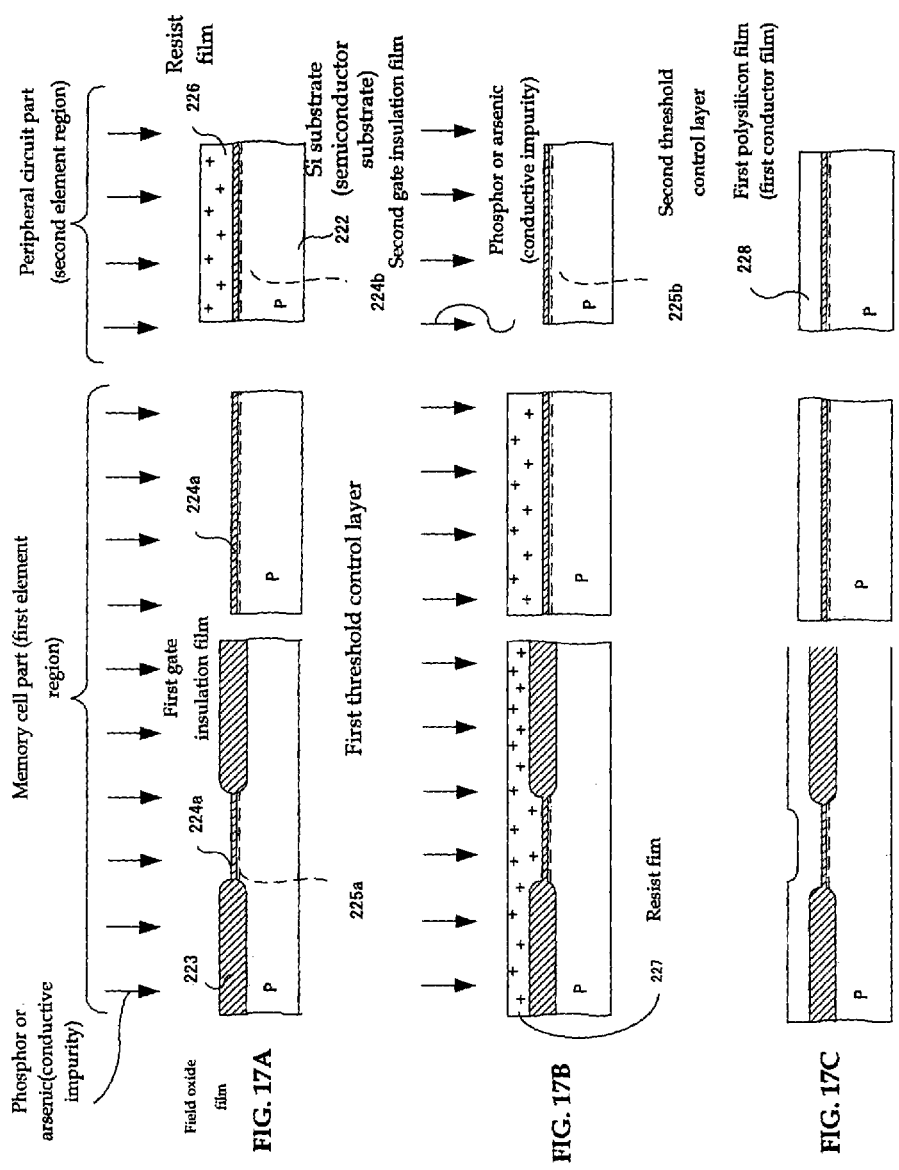

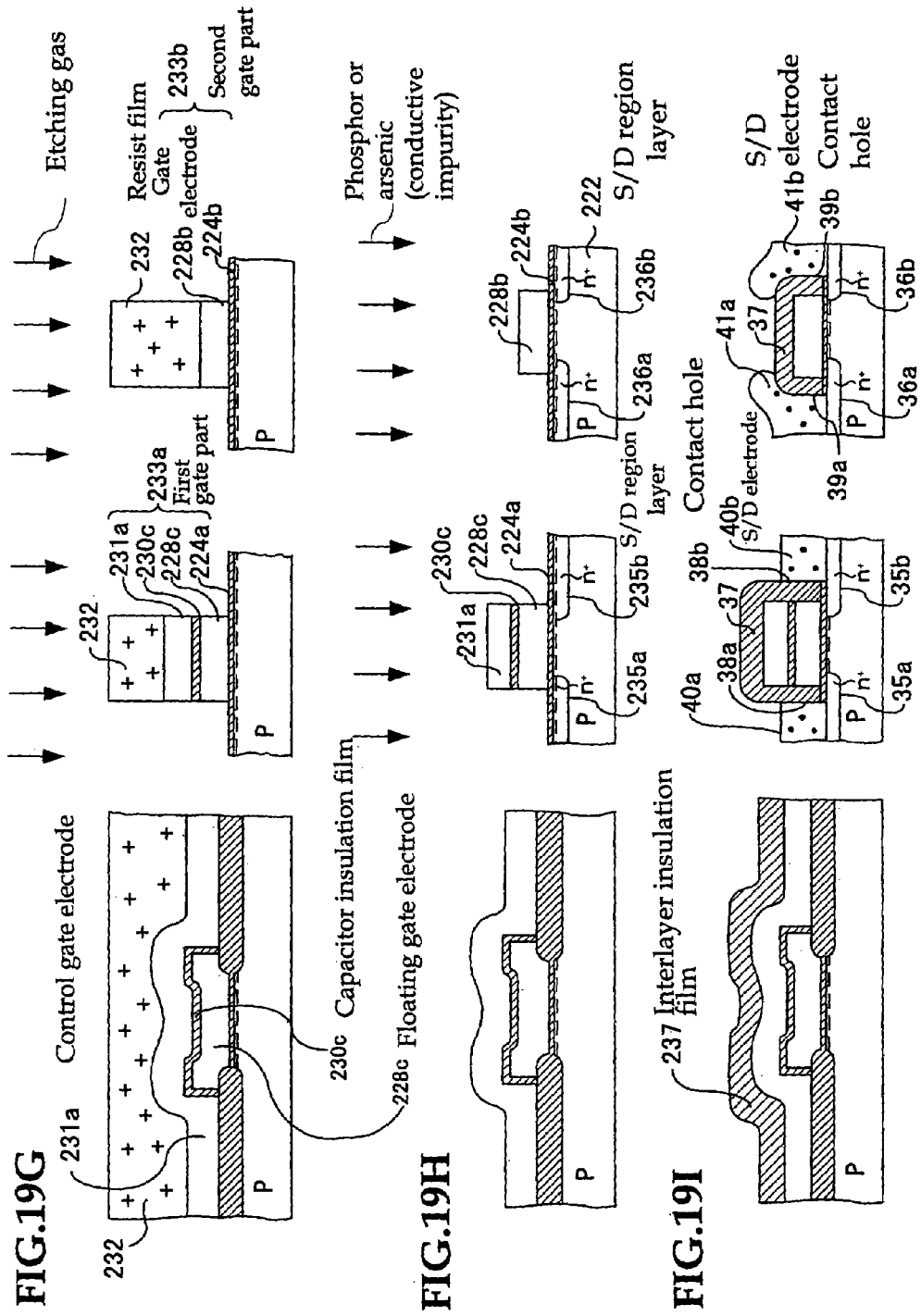

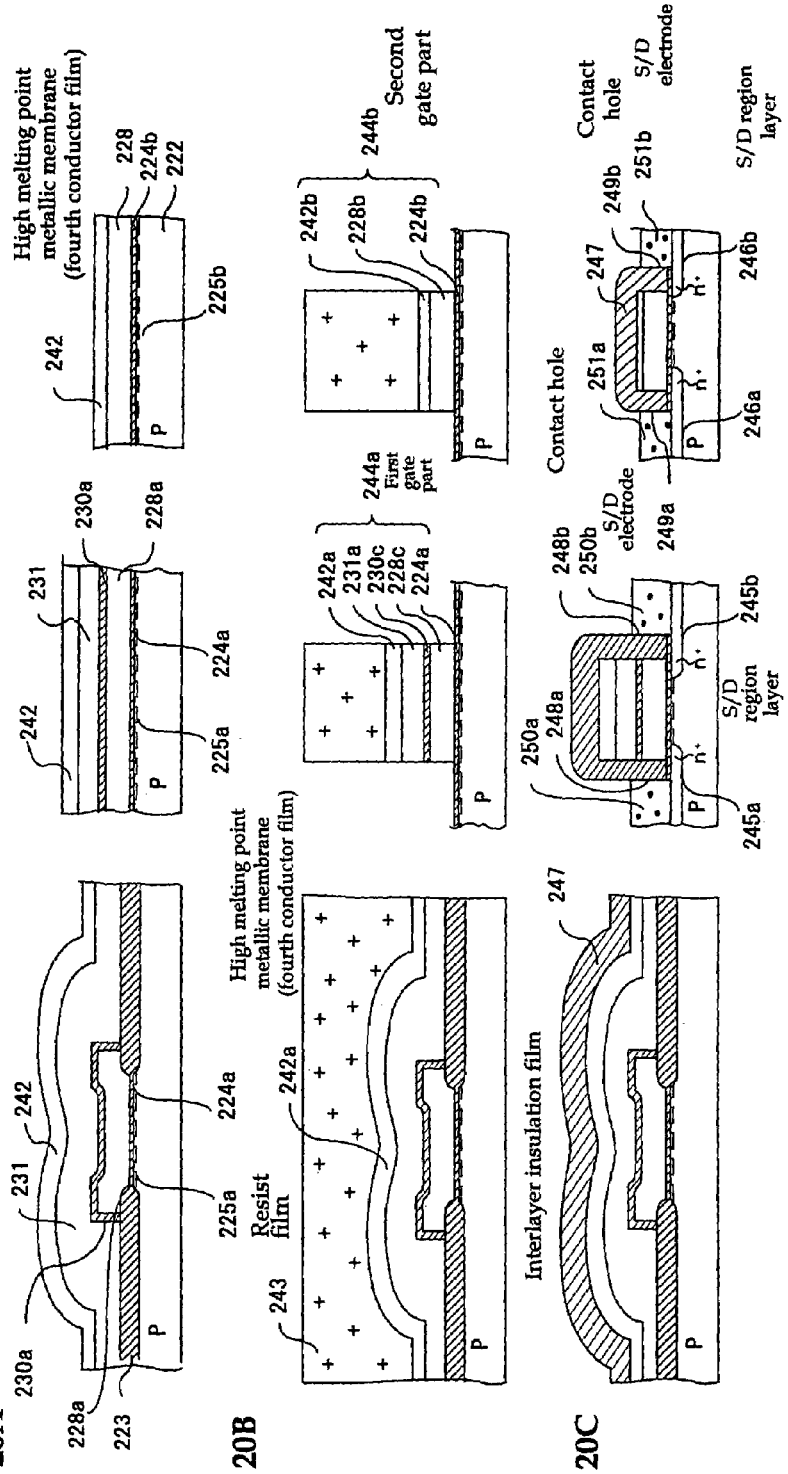

US 7,439,010 B2

ALKALI-SOLUBLE SILOXANE POLYMER, POSITIVE TYPE RESIST COMPOSITION, RESIST PATTERN, PROCESS FOR FORMING THE SAME, ELECTRONIC DEVICE AND PROCESS FOR MANUFACTURING THE SAME

This application is a divisional application of prior application Ser. No. 10/329,992 filed Dec. 27, 2002 now U.S. Pat. No. 6,949,324.

CROSS-REFERENCE TO RELATED APPLICATIONS

This application is based upon and claims the benefit of priority from the prior Japanese Patent Application No. 2001-398856 filed on Dec. 28, 2001, and No. 2002-375658, filed on Dec. 25, 2002, the entire contents of which are incorporated herein by reference.

BACKGROUND OF THE INVENTION

1. Field of the Invention

The present invention relates to a resist pattern that can form a fine pattern (fine traces) useful for manufacturing magnetic heads, semiconductor devices, and other electronic devices, to a process for forming a resist pattern which can efficiently form the resist pattern in a short time, to a positive type resist composition that is useful for the formation of the resist pattern, is typically useful as a material for an upper resist in a two-layer resist process using i-line radiation and can contribute to a higher integration of electronic devices, to an alkali-soluble siloxane polymer that is useful for the positive type resist composition, to an electronic device having a fine pattern (fine traces) formed by the use of the resist pattern, and to a process for manufacturing an electronic device which enables efficient manufacture of the electronic device in a short time.

2. Description of the Related Art

Resist processes have been often used in manufacturing semiconductor devices, magnetic bubble memory devices, surface bubble memory devices, and other electronic devices having a fine pattern (fine traces). Positive type resist compositions generally have higher resolution than negative resist compositions (e.g., Japanese Patent Application Laid-Open (JP-A) No. 03-103855 and JP-A No. 05-53316). Certain compositions containing an alkali-soluble resin having photosensitivity to radiation having wavelengths of 300 nm to 500 nm and a compound having a quinonediazido group are known as such positive type resist compositions (e.g., JP-A No. 05-53316). With increasing densities of electronic devices and with increasing layers of wiring thereof, the heights of steps on the surface of substrates increase. Thus, conventional single-layer resist processes cannot yield sufficient resolution even by using the positive type resist compositions.

Under these circumstances, a two-layer resist process has been proposed, in which an organic resin layer as an underlying layer is formed to flatten steps on a substrate; a thin film of a resist layer as an upper layer is formed on the organic resin layer, is patterned to form an upper pattern, and the upper pattern is transferred to the lower layer by oxygen plasma etching. The two-layer resist process can significantly improve the resolution, since the underlying layer can flatten the steps on the substrate and can prevent light reflection from the substrate, and the upper layer can be formed as a thin layer. Organosilicon polymers that are highly resistant to oxygen plasma have been used as the material for the upper resist layer in the two-layer resist process, since the upper resist layer is subjected to oxygen plasma etching. However, from the viewpoint of obtaining high quality electronic devices, a demand has been made on materials for a resist layer to be excellent in resolution and storage stability as well as oxygen plasma resistance.

When a resist film prepared from a resist composition including a silicon-containing polymer is patterned using a halftone mask, a ghost pattern called "side lobe" is formed on the periphery of a target resist pattern. The side lobe is formed by action of light transmitting through a halftone portion in the halftone mask. Therefore, a demand has also been made on the resist composition to overcome the aforementioned problem.

An organosilicon compound and a positive type resist composition containing thereof, that has high oxygen plasma resistance and can form a resist film with fewer side lobes when it is patterned using a halftone mask, has not been provided yet.

SUMMARY OF THE INVENTION

Under these circumstances, an object of the present invention is to solve the problems of conventional technologies. Specifically, one of the objects of the present invention is to provide a resist pattern that can form a fine pattern (fine traces) useful for manufacturing magnetic heads, semiconductor devices, and other electronic devices, a process for forming a resist pattern which can efficiently form the resist pattern in a short time, to provide a positive type resist composition that is useful for the formation of the resist pattern, is excellent in oxygen plasma resistance, resolution, storage stability, and other properties and is typically useful as a material for an upper resist in a two-layer resist process using i-line radiation, is useful for forming a resist film that prevents side lobes in a case of patterning using a half-tone mask, and further contributes to more highly integrated electronic devices. It is also an object of the present invention to provide an electronic device having a fine pattern (fine traces) formed by the use of the resist pattern and a process for manufacturing an electronic device which can efficiently manufacture the electronic device in a short time.

A positive type resist composition according to the first aspect of the present invention comprises an alkali-soluble siloxane polymer expressed by the following Formula (1); a photosensitive compound; and a 1 µm thick resist film formed of the positive type resist composition which has 5% to 60% of transmittance to i-line radiation.

The positive type resist composition is excellent in resolution, storage abilities, and the like, and is useful for an upper resist by the two-layer-resist process, which is formed by an i-line radiation. The positive type resist composition is also useful for a resist film that prevents side lobes, in a case of patterning with a half-tone mask.

A positive type resist composition according to the second aspect of the present invention comprises a surfactant selected at least from a polycarboxylate surfactant and a nonionic surfactant having a hydrophile-lypophile balance (HLB) value of 9 or less, an alkali-soluble siloxane polymer having silicon atoms in which 19% or less of a total silicon atoms are directly bonded to a hydroxy group, and a photosensitive compound, or the positive type resist composition comprises a surfactant selected at least from a polycarboxylate surfactant, a sorbitan ester surfactant, a poly ethyleneglycol monoester surfactant and a poly ethyleneglycol monoether surfactant, an alkali-soluble siloxane polymer having silicon atoms in which 19% or less of a total silicon atoms are directly bonded to a hydroxy group, and a photosensitive compound.

The positive type resist composition is able to maintain high oxygen plasma resistance. In a case of patterning by using a halftone mask, the positive type resist composition enables a resist pattern to have a resist film having fewer side lobes.

The alkali-soluble siloxane polymer of the present invention is expressed in the Formula (1), is contained in a positive type resist composition, and a 1 μm thick resist film formed of the positive type resist composition has 5% to 60% of transmittance to i-line radiation;

$$(SiO_{4/2})_a(O_{1/2}Si\underset{R^2}{\overset{R^1}{-}}A)_b(O_{3/2}SiOH)_c \qquad \text{Formula (1)}$$

in the Formula (1), $R^1$ and $R^2$ express a monovalent organic group, and may be identical or different;

"A" expresses a group having a phenolic hydroxyl group expressed by the Formula (2); and "a," "b," and "c" satisfy the following relation: a+b+c=1;

$$-(\underset{R^4}{\overset{R^3}{\underset{|}{\overset{|}{C}}}})_m\!\!\!-\!\!\!\underset{(OH)_n}{\bigcirc}\!\!\!R_{5-n}^5 \qquad \text{Formula (2)}$$

in the Formula (2), $R^3$, $R^4$, and $R^5$ express one of a hydrogen atom and a monovalent organic group, and may be identical or different;

"m" expresses an integer; and

"n" expresses an integer of 1 to 5.

The alkali-soluble siloxane polymer is excellent in oxygen plasma resistance, resolution, storage stability, and other properties and is typically useful as a material for an upper resist in the two-layer resist process using i-line radiation. The alkali-soluble siloxane polymer is particularly useful for a positive type resist composition that forms a resist film causing fewer side lobes in a case of patterning.

The process for forming a resist pattern of the present invention comprises; a step for forming a resist film utilizing the positive type resist composition of the present invention; and a step for forming a resist pattern by developing. The step for forming a resist film allows for forming the resist film which comprises the positive type resist composition. The resist film is developed, and then is formed in the step for forming a resist pattern.

The resist pattern of the present invention is formed by the process for forming a resist pattern of the present invention. The resist pattern is excellent in oxygen plasma resistance, resolution, storage stability, and the like. The resist pattern is typically useful as an upper resist in the two-layer resist process using i-line radiation and can be suitably used for manufacturing magnetic heads, semiconductor devices, and other electronic devices.

The electronic device of the present invention comprises a pattern, which is formed of the resist pattern of the present invention. The electronic device is therefore of high performance.

The process for manufacturing an electronic device of the present invention comprises a step for forming a resist pattern on an underlying layer by the process for forming the resist pattern, and a step for patterning the underlying layer by one of etching and lift-off, using the resist pattern as a mask. In the process for manufacturing the electric device of the present invention, a resist pattern is formed on an underlying layer at the step for forming a resist pattern, and then, using the resist pattern as a mask in the patterning process, the underlying layer is patterned by etching or lift-off at the step for patterning.

BRIEF DESCRIPTION OF THE DRAWINGS

FIGS. 11E, 11F, and 11G are views which show one example of processes for manufacturing an MR element of a magnetic head (MR head) by a milling process;

FIGS. 14E, 14F and 14G are views which show examples of processes for the formation of barrier ribs in a plasma display panel;

FIGS. 17A, 17B, and 17C are schematic sectional views showing one example of a process for manufacturing a flash EPROM as the electronic device of the present invention;

FIGS. 19G, 19H and 19I are schematic sectional views showing one example of a process for manufacturing a flash EPROM as the electronic device of the present invention;

FIGS. 20A, 20B, and 20C are schematic sectional views showing other example of a process for manufacturing a EPROM as the electronic device of the present invention;

Figure 1A:
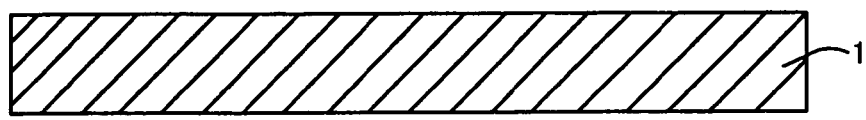
FIGS. 1A, 1B, 1C, and 1D show one example of a process for the formation of a resist pattern using the positive type resist composition of the present invention as an upper layer in the two-layer resist process.

DESCRIPTION OF THE PREFERRED EMBODIMENTS (Positive Type Resist Compositions and Alkali-Soluble Siloxane Polymers)

The positive type resist composition of the present invention includes a positive type resist composition according to the first aspect, and a positive type resist composition according to the second aspect.

A positive type resist composition according to the first aspect comprises an alkali-soluble siloxane polymer expressed by the Formula (1), a photosensitive compound, and a 1 μm thick resist film formed of the positive type resist composition has 5% to 60% of a transmittance to i-line radiation.

A positive type resist compositions according to the second aspect comprises a surfactant selected at least from a polycarboxylate surfactant and a nonionic surfactant having a hydrophile-lypophile balance (HLB) value of 9 or less, an alkali-soluble siloxane polymer having silicon atoms in which 19% or less of a total silicon atoms are directly bonded to a hydroxy group, and a photosensitive compound.

In the positive type resist compositions according to the first aspect, a 1 μm thick resist film formed of the positive type resist composition is required to have a transmittance to i-line radiation from 5% to 60%, preferably from 10% to 50%, and more preferably from 14% to 39%. A transmittance to i-line radiation for the positive type resist compositions according to the second aspect is preferably from 5% to 60%, more preferably from 10% to 50%, and still more preferably from 14% to 39%.

If the transmittance to i-line radiation of the 1 μm thick resist film is less than 5%, the resolution may deteriorate due to the different amount of irradiated light between the upper part and the lower part of the resist film. If the transmittance exceeds 60%, the difference in dissolution rate between exposed and unexposed areas may be insufficient. If the transmittance is 10% to 50%, both the resolution and the difference in dissolution rate are particularly sufficient. If the transmittance is 14% to 39%, the resolution and the difference in dissolution rate are more particularly sufficient.

The transmittance to i-line radiation (hereinafter, referred to as "i-line transmittance") of the 1 μm thick resist film can be determined, for example, by calculation according to the following equations. In the equations, "T" is a measured value of the i-line transmittance (%) of 0.55 μm thick resist film, in which the resist film is formed by coating and by applying a 2-heptanone solution (solid content: 25% by mass) containing 100 parts by weight of the alkali-soluble siloxane polymer, 50 parts by weight of a photosensitive compound having a 1,2-naphthoquinonediazido group, and 1.5 parts by weight of a phenolic compound expressed by the Formula (15) mentioned later to a glass substrate by spin coating. The i-line transmittance T (%) can be determined by using a spectrophotometer (available from Hitachi, Ltd. under the trade name of U-3500) with an i-line transmittance of the glass substrate as a subject. An absorbance to i-line radiation (hereinafter briefly referred to as "i-line absorbance") "A" of a 1 μm thick resist film prepared from the photosensitive compound having a 1,2-naphthoquinonediazido group can be determined by calculation according to the following equation based on the measured i-line transmittance T (%). Next, an i-line absorbance A' of a 1 μm thick resist film prepared from the positive type resist composition is determined by calculation according to the subsequent equation based on the i-line absorbance "A" and a weight ratio "W" of the photosensitive compound having a 1,2-naphthoquinonediazido group to the total solid contents in the positive type resist composition. Ultimately, the i-line transmittance T' (%) of the 1 μm thick resist film prepared from the positive type resist composition can be determined by calculation according to the subsequent equation based on the i-line absorbance A'.

$$A = \frac{1}{0.55} \times \frac{151.5}{50} \times \log_{10} \frac{100}{T} \quad \text{Equation (1)}$$

$$A' = \sum (A \times W)$$

$$T' = 10^{-A'} \times 100$$

The positive type resist compositions of the present invention according to the first aspect each comprise the alkali-soluble siloxane polymer and the photosensitive compound and may further comprise a surfactant and other additional components appropriately selected according to necessity. The positive type resist compositions according to the second aspect comprise the alkali-soluble siloxane polymer, the photosensitive compound, and the surfactant and may further comprise additional components suitably selected according to necessity.

Alkali-Soluble Siloxane Polymers

The term "alkali-soluble" in the alkali-soluble siloxane polymer as used herein means that the alkali-soluble siloxane polymer itself is soluble in alkalis, and also means that the alkali-soluble siloxane polymer becomes soluble in alkalis by action of the photosensitive compound. Hereinafter, the alkali-soluble siloxane polymer may be referred to as "alkali-soluble polyorganosiloxane resin."

The term, "alkali-soluble," also means that the polymer is soluble in more than pH 7.

The alkali-soluble siloxane polymer may have any molecular skeleton unit or structure according to the purpose. Examples of the structures include, a straight chain structure, a cage structure, a ladder structure, a mixture of these structures, and the like.

The alkali-soluble siloxane polymer in the positive type resist composition according to the first aspect is expressed by the following Formula (1).

Of those alkali-soluble siloxane polymers expressed by the Formula (1), the alkali-soluble siloxane polymers used in a positive type resist composition in which a 1 μm thick resist film prepared from the positive type resist composition has 5% to 60% of an i-line transmittance are used for the alkali-soluble siloxane polymers of the present invention.

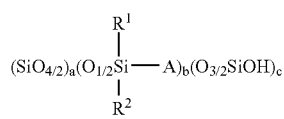

Formula (1)

In the Formula (1), $R^1$ and $R^2$ express a monovalent organic group, and may be identical or different.

The structure of the monovalent organic group may be any one of straight-chain, branched-chain and cyclic monovalent organic groups.

The carbon number of the monovalent organic group is not particularly limited and can be appropriately selected according to the intended purpose. The carbon number of the monovalent organic group is preferably from 1 to 20 for a straight-chain structured group, preferably from 3 to 20 in a branched-chain structured group, and preferably from 3 to 20 for a cyclic structured group. Of those cyclic structured groups, those having an aromatic ring preferably contain from 6 to 20 carbon atoms.

Suitable examples of the monovalent organic groups include an aliphatic hydrocarbon group, an aromatic hydrocarbon group, and the like. Each of those groups may be substituted with a halogen atom, an alkyl group, or the like.

Example of the aliphatic hydrocarbon group include a methyl group, an ethyl group, a propyl group, a butyl group, a pentyl group, a hexyl group, an isopropyl group, an isobutyl group, a t-butyl group, a cyclopropyl group, a cyclobutyl group, a cyclopentyl group, a cyclohexyl group, and the like.

Example of the aromatic hydrocarbon groups include a phenyl group, a naphthyl group, an anthryl group, a tolyl group, a xylyl group, a dimethylphenyl group, a trimethylphenyl group, an ethylphenyl group, a diethylphenyl group, a triethylphenyl group, a propylphenyl group, a butylphenyl group, a methylnaphthyl group, a dimethylnaphthyl group, a trimethylnaphthyl group, a vinylnaphthyl group, an ethenylnaphthyl group, a methylanthryl group, an ethylanthryl group, and the like.

In the Formula (1), "A" expresses a group having a phenolic hydroxyl group expressed by the following Formula (2). The "A" is preferably a group expressed by one of following the Formulae (6) and (7):

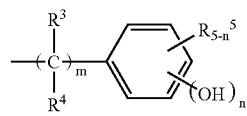

Formula (2)

in the Formula (2), $R^3$, $R^4$, and $R^5$ express one of a hydrogen atom and the monovalent organic group, may be identical or different;

"m" expresses an integer and is preferably an integer of 1 to 3 for higher coatability; and "n" expresses an integer of 1 to 5.

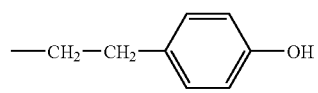

Formula (6)

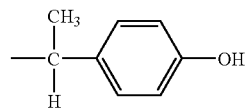

Formula (7)

In the Formula (1), "a," "b," and "c" satisfy the following relation: a+b+c=1. "a", "b," and "c" express a proportion of an individual molecular skeleton unit in the alkali-soluble siloxane polymer. The larger the proportion is, the larger the molecular skeleton unit occupies the entire polymer.

The proportion "a" preferably satisfies a relation of: $0.25 \leq a \leq 0.60$, and more preferably $0.40 \leq a \leq 0.60$. If the proportion "a" exceeds 0.60, the resulting composition may not be sufficiently solved in alkalis and the difference in dissolution rate between exposed and unexposed areas may not be sufficiently large. If it is less than 0.25, the composition may have insufficient oxygen plasma resistance. Within the above-specified range, the larger the proportion "a" is, the higher the composition has oxygen plasma resistance.

The proportion "c" is preferably satisfies $0 \leq c \leq 0.25$, and more preferably $0.02 \leq c \leq 0.20$ or less. If the proportion "c" is out of the above-specified range, the difference in dissolution rate between exposed and unexposed areas may not be sufficiently large and the composition may have decreased storage stability. Within the above-specified range, the higher the proportion "c" is, the higher the coatability is. In contrast, the lower the proportion "c" is, the higher the storage stability is.

The alkali-soluble siloxane polymer in the positive type resist composition according to the second aspect has silicon atoms in which 19% or less of a total silicon atoms are directly bonded to a hydroxy group. The alkali-soluble siloxane polymer is preferably a polymer expressed by the Formula (I).

The proportion of silicon atoms directly bonded to a hydroxyl group to the total silicon atoms is not specifically limited, as long as it is 19% or less, and can be appropriately selected according to the purpose. The proportion is preferably 2% to 15% or less, and more preferably 2% to 13% or less.

If the proportion exceeds 19%, the side lobes may not be sufficiently effectively prevented. In contrast, if it is 19% or less, the side lobes can be sufficiently prevented. If it is from 2% to 15% or less, and more preferably from 2% to 13% or less, the side lobes can be more effectively prevented.

The proportion of silicon atoms directly bonded to a hydroxyl group to the total silicon atoms can be determined, for example, by $^{29}$Si-NMR.

$$(R_A)_d(O_{1/2}SiR^{17}R^{18}-B)_e(O_{1/2}SiR^{19}R^{20}OH)_f(O_{1/2}SiR^{19}R^{20}OR^{21})_g \qquad \text{Formula (I)}$$

in the Formula (I), $R_A$ expresses an organosiloxane residue expressed by any one of following Formulae (II), (III), (IV), and (V);

B expresses a group expressed by one of the following Formulae (VI) and (VII);

$R^{17}$, $R^{18}$, $R^{19}$, and $R^{20}$ express one of a hydrogen atom, an oxygen atom, and a monovalent organic group, and may be identical or different;

$R^{21}$ is one of a monovalent organic group and a silyl group; and

"d," "e," "f," and "g" satisfy d+e+f+g=1, when $0.25 \leq d \leq 0.60$ and $f \leq 0.19$.

The monovalent organic group herein has the same meaning as defined above. When any of $R^{17}$, $R^{18}$, $R^{19}$, and $R^{20}$ is an oxygen atom, both sides of the oxygen atom are silicon atoms.

$(O_{4/2}Si)$   Formula (II)

$(O_{3/2}Si)$   Formula (III)

$(O_{2/2}Si)$   Formula (IV)

$(O_{1/2}Si)$   Formula (V)

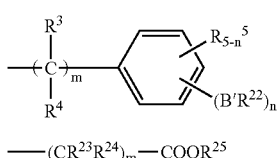

Formula (VI)

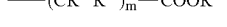

Formula (VII)

In the Formula (VI) and (VII), $R^3$, $R^4$, $R^5$, $R^{22}$, $R^{23}$, $R^{24}$, and $R^{25}$ express one of a hydrogen atom and a monovalent organic group, may be identical or different. The monovalent organic group herein has the same as described above. B' is one of —O— and —COO—. When there is a plurality of B's, these B's may be identical or different. "m" expresses an integer of 0 to 3; and "n" expresses an integer of 1 to 5.

In the Formula (I), "d," "e," "f," and "g" satisfy the following relations: d+e+f+g=1. These "d," "e," "f," and "g" are each a proportion of an individual molecular skeleton unit in the alkali-soluble siloxane polymer. The larger the proportion is, the larger the molecular skeleton unit occupies the entire polymer.

The proportion "d" preferably satisfies $0.25 \leq d \leq 0.60$, and more preferably $0.35 \leq d \leq 0.60$. If the proportion "d" exceeds 0.60, the composition may not be sufficiently dissolved in alkalis and the difference in dissolution rate between exposed and unexposed areas may not be sufficiently large. In contrast, if it is less than 0.25, the composition may have insufficient oxygen plasma resistance. Within the above-specified range, the larger the proportion "d" is, the higher the oxygen plasma resistance is.

The proportion "f" should be 0.19 or less and preferably satisfies a relation of $0.02 \leq f \leq 0.13$. If the proportion "f" exceeds 0.19, the side lobes may not be sufficiently and effectively prevented. Within the above-specified range, the higher the proportion "f" is, the higher the sensitivity is. In contrast, the lower the proportion "f" is, the higher the storage stability is.

When the group $R^{21}$ is a silyl group, the silyl group is not specifically limited and can be appropriately selected according to the intended purpose. Examples of the silyl group include a trimethylsilyl group, a triethylsilyl group, an isopropyldimethylsilyl group, a t-butyldimethylsilyl group, a (triphenylmethyl)dimethylsilyl group, a t-butyldiphenylsilyl group, a methyldiisopropylsilyl group, a methyldi-t-butylsilyl group, a tribenzylsilyl group, a triisopropylsilyl group, a triphenylsilyl group, a chloromethyldimethylsilyl group, and the like.

$R_A$, the organosiloxane residue, in Formula (I) is obtained by condensing at least one of organosilicon compounds expressed by following Formula (II'), (III'), and (IV'), or by condensing an organosilicon compound expressed by following Formula (V') with at least one of organosilicon compounds expressed by following Formulae (II'), (III'), and (IV').

$(R^{26}O)_4Si$   Formula (II')

$(R^{26}O)_3SiR^{27}$   Formula (III')

$(R^{26}O)_2SiR^{28}R^{29}$   Formula (IV')

$(R^{26}O)SiR^{30}R^{31}R^{32}$   Formula (V')

In the Formulae (II'), (III'), (IV') and (V'), $R^{26}$ expresses one of a methyl group and an ethyl group; and $R^{27}$, $R^{28}$, $R^{29}$, $R^{30}$, $R^{31}$, and $R^{32}$ express a hydrogen atom or a monovalent organic group.

The alkali-soluble siloxane polymers expressed by Formula (I) correspond to the alkali-soluble siloxane polymers expressed by Formula (1), when both of the Formulae satisfy the relations of; g=0; and d+e+f=1; $R_A$ expresses the organosiloxane residue expressed by Formula (II); $R^{17}$ and $R^{18}$ express a monovalent organic group; $R^{19}$ and $R^{20}$ express an oxygen atom; "B" expresses the group expressed by Formula (VI); B' expresses —O—; and $R^{22}$ expresses a hydrogen atom.

The weight-average molecular weight of the alkali-soluble siloxane polymer is not specifically limited, can be appropriately selected according to the intended purpose. Preferable weight-average molecular weight is from 1000 to 50000, more preferably from 2000 to 20000, and particularly preferably from 4000 to 15000.

If the weight-average molecular weight is less than 1000, the difference in dissolution rate between exposed and unexposed areas may not be sufficiently large. If it exceeds 50000, the composition may have a deteriorated resolution. If it is from 2000 to 20000, the side lobes can be sufficiently and effectively prevented and the composition may have a good resolution and sensitivity.

The molecular weight distribution Mw/Mn, can be appropriately selected according to the intended purpose. The preferable molecular weight distribution is from 1 to 5, and more preferably from 1 to 3 for a larger difference in dissolution rate between exposed and unexposed areas.

The alkali-soluble siloxane polymer for use herein is not specifically limited and can be appropriately selected from those suitably synthesized and those commercially available.

A synthesizing method for the alkali-soluble siloxane polymer is not specifically limited and can be appropriately selected from any known methods. When the positive type resist composition is a chemically amplified resist, the alkali-soluble siloxane polymer is preferably synthesized by one of the methods <1> and <2>. If it is a non-chemically-amplified resist, the alkali-soluble siloxane polymer is preferably synthesized by one of the methods <3> and <4>.

In the method <1>, an organoalkoxysilane is condensed by catalysis of an acid catalyst or an alkali catalyst under the provision of water. Thereafter, a terminal silanol group of the organoalkoxysilane is capped with a chlorosilane compound having an alkali-soluble group protected by a protecting group.

In the method <2>, an organoalkoxysilane having an alkali-soluble group protected by a protecting group is condensed by catalysis of an acid catalyst or an alkali catalyst under the provision of water.

In the method <3>, an organoalkoxysilane is condensed by catalysis of an acid catalyst or an alkali catalyst under the provision of water. Thereafter, a terminal silanol group of the organoalkoxysilane is capped with a chlorosilane compound having an alkali-soluble group protected by a protecting group, and the alkali-soluble group is then deprotected (if necessary, a part of the alkali-soluble group may be protected again for controlling the solubility in alkalis).

In the process <4>, an organoalkoxysilane having an alkali-soluble group protected by a protecting group is condensed by catalysis of an acid catalyst or an alkali catalyst under the provision of water, and the alkali-soluble group is then deprotected (if necessary, part of the alkali-soluble group may be protected again for controlling the solubility in alkalis).

The organoalkoxysilane for use herein is not specifically limited and can be appropriately selected according to the intended purpose. Examples of the organoalkoxysilane include organomethoxysilane such as tetramethoxysilane, methyltrimethoxysilane, dimethyldimethoxysilane, trimethylmethoxysilane, ethyltrimethoxysilane, diethyldimethoxysilane, triethylmethoxysilane, phenyltrimethoxysilane, diphenyldimethoxysilane, triphenylmethoxysilane, methylphenyldimethoxysilane, dimethylphenylmethoxysilane, and the like; organoethoxysilane such as tetraethoxysilane, methyltriethoxysilane, dimethyldiethoxysilane, trimethylethoxysilane, ethyltriethoxysilane, diethyldiethoxysilane, triethylethoxysilane, phenyltriethoxysilane, diphenyldiethoxysilane, triphenylethoxysilane, methylphenyldiethoxysilane, dimethylphenylethoxysilane, and the like.

The chlorosilane having an alkali-soluble group protected by a protecting group can be easily manufactured by hydrosilating a compound having a vinyl group, an allyl group or another unsaturated bond and a protected alkali-soluble group in its molecule with a dialkylchlorohydrosilane compound under the provision of a transition metal catalyst. Alternatively, it can be easily prepared by condensation between an organometallic compound having the protected alkali-soluble group protected by a protecting group and a dialkyldichlorosilane compound.

Examples of the alkali-soluble group include a phenolic hydroxyl group, a carboxyl group, and the like. Of these, a phenolic hydroxyl group is preferred when the resist composition is used in photolithography or photofabrication using g-line radiation or i-line radiation as exposure light.

Examples of the protecting group in the protected alkali-soluble group includes a methoxymethyl group, a benzyloxymethyl group, a t-butoxymethyl group, 2-methoxyethoxymethyl group, 2,2,2-trichloroethoxymethyl group, 2-(trimethylsilyl)ethoxymethyl group, a tetrahydropyranyl group, 3-bromotetrahydropyranyl group, a tetrahydrothiopyranyl group, 4-methoxytetrahydropyranyl group, a tetrahydrofuranyl group, 1-ethoxyethyl group, 1-methyl-1-methoxyethyl group, 1-(isopropoxy)ethyl group, 2,2,2-trichloroethyl group, 2-(phenylselenyl)ethyl group, a t-butyl group, a benzyl group, 3-methyl-2-picolyl-N-oxide group, a diphenylmethyl group, 5-dibenzosuberyl group, a triphenylmethyl group, 9-anthryl group, a trimethylsilyl group, a triethylsilyl group, an isopropyldimethylsilyl group, a t-butyldimethylsilyl group, (triphenylmethyl)dimethylsilyl group, a t-butyldiphenylsilyl group, a methyldiisopropylsilyl group, a methyldi-t-butylsilyl group, a tribenzylsilyl group, a triisopropylsilyl group, a triphenylsilyl group, a chloromethyldimethylsilyl group, a formyl group, an acetyl group, a methoxycarbonyl group, an ethoxycarbonyl group, 2,2,2-trichloroethoxycarbonyl group, an isobutyloxycarbonyl group, a carbonate group, a benzylcarbonate group, an adamantyl group, and the like.

The acid catalyst includes, but is not limited to, hydrochloric acid, acetic acid, and the like. The alkaline catalyst includes, but is not limited to, ammonia, triethylamine, and the like.

Among the alkali-soluble siloxane polymers, the alkali-soluble siloxane polymer expressed by the Formula (1) can be synthesized by, for example, a process in which at least one organosilicon compound expressed by one of the following Formulae (3) and (4) is allowed to react with at least one tetraalkoxysilane. If a t-butyl group remains, the t-butyl group is substituted with a hydrogen atom.

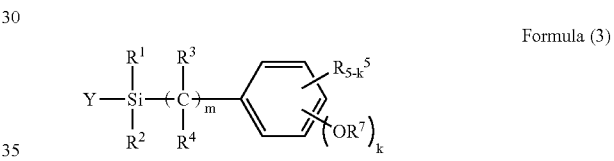

Formula (3)

In the Formula (3), $R^1$ and $R^2$ express the monovalent organic group, and may be identical or different; $R^3$, $R^4$, and $R^5$ express one of a hydrogen atom and the monovalent organic group, and may be identical or different; Y is one of X and $OR^6$; wherein X is a halogen atom; and $R^6$ is one of a hydrogen atom and an alkyl group. The alkyl group just mentioned above is not specifically limited, and can be appropriately selected from alkyl groups according to the intended purpose, of which methyl group and ethyl group are preferred. The group $R^7$ is a t-butyl group when Y is X, and $R^7$ is one of a hydrogen atom and a t-butyl group when Y is $OR^6$; "m" expresses an integer and expresses preferably an integer of 1 to 3; and "k" expresses an integer of 1 to 5.

The organosilicon compounds expressed by the Formula (3) can be synthesized according to a known or conventional procedure. For example, the organosilicon compounds expressed by the Formula (3), where Y=X and $R^7$ is a t-butyl group, can be synthesized by hydrosilylation of a compound expressed by the following Formula (9) and a compound expressed by the following Formula (10) under the provision of a transition metal catalyst.

Formula (9)

In the Formula (9), Y, $R^1$ and $R^2$ have the same as defined above.

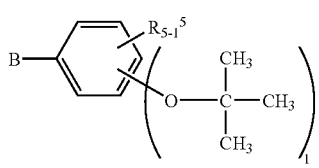

Formula (10)

In the Formula (10), "B" is the monovalent organic group having an unsaturated bond, such as vinyl group and allyl group; "l" expresses an integer of 1 to 5; and $R^5$ has the same as defined above.

The organosilicon compounds expressed by the Formula (3), where Y is $OR^6$, can be prepared by hydrosilylation of the compound of the Formula (9) where Y is $OR^6$ with a compound corresponding to the compound of the Formula (10) except with $R^7$ replacing the t-butyl group under the provision of a transition metal catalyst.

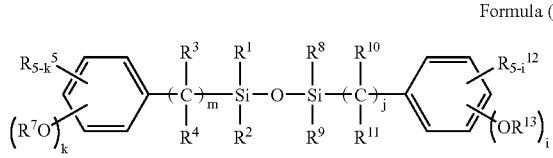

Formula (4)

In the Formula (4), $R^1$, $R^2$, $R^8$, and $R^9$ express the monovalent organic group, and may be identical or different; $R^3$, $R^4$, $R^5$, $R^{10}$, $R^{11}$, and $R^{12}$ express one of a hydrogen atom and the monovalent organic group, and may be identical or different; $R^7$ and $R^{13}$ express one of a hydrogen atom and a t-butyl group, and may be identical or different; "j" and "m" express an integer, preferably an integer of 1 to 3; and "i" and "k" express an integer of 1 to 5.

The organosilicon compounds expressed by the Formula (4) can be synthesized according to any known procedure. For example, the compound of the Formula (4), in which $R^7$ and $R^{13}$ express t-butyl groups, can be prepared by hydrolysis and condensation of the compound of the Formula (3) in which Y is X and $R^7$ is a t-butyl group at a temperature equal to or lower than room temperature. The compound of the Formula (4) in which $R^7$ and $R^{13}$ are hydrogen atoms can be prepared by hydrolyzing and condensing the compound of the Formula (3) and heating the resulting product under acidic relations. The compounds of the Formula (4) can also be prepared by hydrosilylation of a compound expressed by the following Formula (18), a compound expressed by the following Formula (19) and a compound expressed by the following Formula (20) under the provision of a transition metal catalyst.

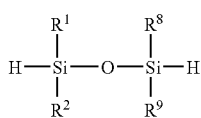

Formula (18)

In the Formula (18), $R^1$, $R^2$, $R^8$ and $R^9$ are the same as defined above.

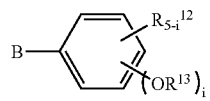

Formula (19)

In the Formula (19), "B" is the monovalent organic group having an unsaturated bond, such as vinyl group and allyl group; and $R^{12}$, $R^{13}$ and "i" are the same as defined above.

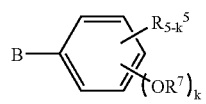

Formula (20)

In the Formula (20), "B" is the monovalent organic group having an unsaturated bond, such as vinyl group and allyl group; and $R^5$. $R^7$ and k are the same as defined above.

The tetraalkoxysilane is not specifically limited, can be appropriately selected according to the intended purpose and is preferably at least one of tetramethoxysilane and tetraethoxysilane.

The reaction between the at least one organosilicon compound expressed by one of the following Formulae (3) and (4) and the at least one tetraalkoxysilane includes, for example, a hydrolysis and condensation reaction under the provision of an acid catalyst.

The acid catalyst includes, but is not limited to, hydrochloric acid and acetic acid.

The alkali-soluble siloxane polymers expressed by the Formula (1) for use in the present invention may have silanol groups part of which may be reacted with a compound expressed by the following Formula (5).

The reaction mentioned above includes, for example, a substitution reaction under the provision of an acid catalyst.

The acid catalyst includes, but is not limited to, hydrochloric acid, acetic acid, and p-toluenesulfonic acid.

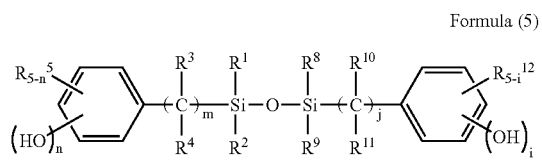

Formula (5)

In the Formula (5), $R^1$, $R^2$, $R^8$, and $R^9$ express the monovalent organic group, and may be identical or different; $R^3$, $R^4$, $R^5$, $R^{10}$, $R^{11}$, and $R^{12}$ express one of a hydrogen atom and the monovalent organic group, and may be identical or different; "j" and "m" express an integer, preferably an integer of 1 to 3; and "i" and "n" express integer of 1 to 5.

The alkali-soluble siloxane polymers expressed by the Formula (1) may also have silanol groups part of which may be reacted with the compound of the Formula (3) where Y=X and $R^7$ is a t-butyl group under the provision of a weak alkali such as pyridine, and the like. Thereafter, the t-butyl group may be substituted with a hydrogen atom by action of an acid.

The acid includes, but is not limited to, hydrochloric acid, acetic acid, p-toluenesulfonic acid, and the like.

The alkali-soluble siloxane polymers expressed by the Formula (1) may have a silanol group, in which a part of hydrogen atoms of the silanol group may be substituted by a group expressed in the following Formula (8).

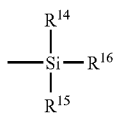

Formula (8)

In the Formula (8), $R^{14}$, $R^{15}$, and $R^{16}$ express the monovalent organic group, and may be identical or different.

When the alkali-soluble siloxane polymers have silanol groups in which a part of hydrogen atoms of the silanol group may be substituted by a group expressed in the following Formula (8), the group expressed by the Formula (8) preferably substitutes 5% to 90%, and more preferably 30% to 70%, of the total hydrogen atoms of the silanol groups.

Photosensitive Compounds

The photosensitive compound (hereinafter may be referred to as "photoreactive compound") is not specifically limited as long as it has an absorption region in wavelengths of the exposure light and can chemically react by absorbing the exposure light, and hence to change the solubility in alkalis of the composition. The photosensitive compound can be appropriately selected depending on the type of the exposure light and other relations.

When the positive type resist composition is non-chemically amplified, the suitable examples include a compound having a 1,2-naphthoquinonediazido group, and the like. When the positive type resist composition is chemically amplified, the suitable examples include a photo-acid generator, and the like.

Specific examples of the compound having a 1,2-naphthoquinonediazido group include an ester compound having a 1,2-naphthoquinonediazido group, of which 1,2-naphthoquinonediazido-4-sulfonic acid ester and 1,2-naphthoquinonediazido-5-sulfonic acid ester, and the like are preferred.

Each of these photosensitive compounds can be used either alone or in combination of two or more.

The photosensitive compounds can be any of those synthesized and those commercially available. For example, the esters having a 1,2-naphthoquinonediazido group as the photosensitive compounds can be synthesized by condensing and reacting a naphthoquinonediazidosulfonyl chloride or another naphthoquinonediazidosulfonyl halide and a compound having a phenolic hydroxyl group under the provision of a weak alkali.

The exposure light includes, but is not limited to, g-line radiation, i-line radiation, a KrF excimer laser radiation, and the like.

When the g-line radiation or i-line radiation is used as the exposure light, the positive type resist composition is preferably a non-chemically amplified resist comprising a quinonediazide compound as the photosensitive compound and an alkali-soluble polyorganosiloxane resin having a phenolic hydroxyl group as the alkali-soluble group as the alkali-soluble siloxane polymer.

The quinonediazide compound is not specifically limited, can be appropriately selected according to the intended purpose and includes, for example, 1,2-benzoquinonediazido-4-sulfonic acid esters, 1,2-naphthoquinonediazido-4-sulfonic acid esters, 1,2-naphthoquinonediazido-5-sulfonic acid esters, and the like.

The quinonediazide compound can be manufactured, for example, by condensing benzoquinonesulfonic acid or 1,2-naphthoquinonediazidosulfonic acid and a compound having a phenolic hydroxyl group under the provision of a weak alkali.

The compound having a phenolic hydroxyl group includes, but is not limited to, hydroquinone, resorcin, phloroglucine, alkyl gallates, a compound expressed by the following Formula (21) described in Japanese Patent Application Laid-Open (JP-A) No. 02-269351, a compound expressed by the following Formula (22) described in JP-A No. 06-236030, a compound expressed by the following Formula (23) described in JP-A No. 05-34918, a compound expressed by the following Formula (24) described in JP-A No. 05-34918, and a compound expressed by one of the following Formulae (25) and (26) described in JP-A No. 10-232493.

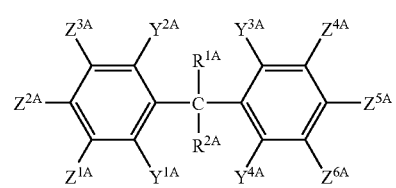

Formula (21)

In the Formula (21), $Y^{1A}$ to $Y^{4A}$ are each a hydrogen atom, an alkyl group, a halogen atom, or a hydroxyl group, where at least one of them is a hydroxyl group; $Z^{1A}$ to $Z^{6A}$ are each a hydrogen atom, an alkyl group, an aryl group, a halogen atom, or a hydroxyl group where at least one of them is a hydroxyl group; $R^{1A}$ and $R^{2A}$ are each a hydrogen atom, an alkyl group, an alkenyl group, a cycloalkyl group, an alkoxy group, or an aryl group, where when at least one of $R^{1A}$ and $R^{2A}$ is a hydrogen atom, the ortho position with respect to a hydrogen atom at the ortho-position of —$(R^{1A})C(R^{2A})$— is an alkyl group or an aryl group.

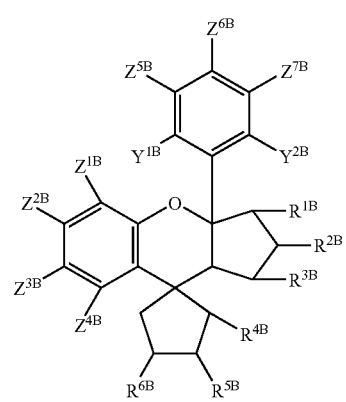

Formula (22)

In the Formula (22), $Y^{1B}$, $Y^{2B}$, and $Z^{1B}$ to $Z^{7B}$ are each an alkyl group containing 1 to 4 carbon atoms a hydrogen atom, or a hydroxyl group, where the alkyl group may be substituted with a halogen atom, and where at least one of $Y^{1B}$ and $Y^{2B}$ is a hydroxyl group, and at least two of $Z^{1B}$ to $Z^{7B}$ are hydroxyl groups; and $R^{1B}$ to $R^{6B}$ are each a hydrogen atom, an alkyl group containing 1 to 10 carbon atoms, an alkenyl group containing 2 to 4 carbon atoms, a cycloalkyl group, or an aryl group.

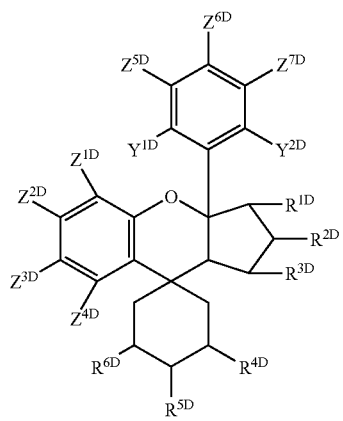

Formula (23)

In the Formula (23), $Y^{1D}$, $Y^{2D}$, and $Z^{1D}$ to $Z^{7D}$ are each a hydrogen atom, a hydroxyl group, or an alkyl group containing 1 to 4 carbon atoms, where at least one of $Y^{1D}$ and $Y^{2D}$ and at least two of $Z^{1D}$ to $Z^{7D}$ are hydroxyl groups; and $R^{1D}$ to $R^{6D}$ are each a hydrogen atom, an alkyl group containing 1 to 10 carbon atoms, an alkenyl group containing 2 to 4 carbon atoms, a cycloalkyl group containing 5 to 8 carbon atoms, or an aryl group.

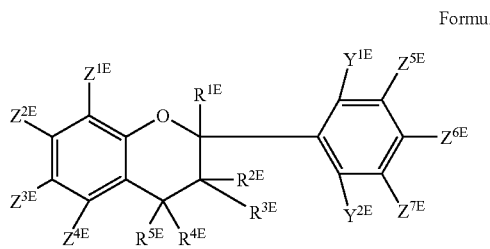

Formula (24)

In the Formula (24), $Y^{1E}$ and $Y^{2E}$ are each a hydrogen atom, a hydroxyl group, or an alkyl group containing 1 to 4 carbon atoms, where at least one of $Y^{1E}$ and $Y^{2E}$ is a hydroxyl group;

$Z^{1E}$ to $Z^{7E}$ are each a hydrogen atom, a halogen atom, a hydroxyl group, an alkyl group containing 1 to 4 carbon atoms, a cycloalkyl group containing 5 to 8 carbon atoms, or an aryl group, where at least two of $Z^{1E}$ to $Z^{7E}$ are hydroxyl groups;

$R^{1E}$ to $R^{5E}$ are each a hydrogen atom, an alkyl group containing 1 to 10 carbon atoms, an alkenyl group containing 2 to 4 carbon atoms, a cyclohexyl group, or an aryl group, where at least one of $R^{4E}$ and $R^{5E}$ is an alkyl group containing 1 to 10 carbon atoms, an alkenyl group containing 2 to 4 carbon atoms, a cyclohexyl group, or an aryl group.

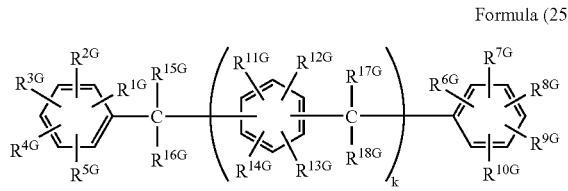

Formula (25)

In the Formula (25), "k" expresses an integer of 0 to 4; $R^{1G}$ to $R^{14G}$, or $R^{1G}$ to $R^{10G}$ when "k" is 0, are each a hydrogen atom, a hydroxyl group, an alkyl group containing 1 to 6 carbon atoms, a cycloalkyl group containing 1 to 6 carbon atoms, or an alkoxy group containing 1 to 6 carbon atoms, where at least one of $R^{1G}$ to $R^{14G}$, or at least one of $R^{1G}$ to $R^{10G}$ when k=0, is a hydroxyl group;

$R^{15G}$ to $R^{18G}$ are each at least one selected from a hydrogen atom, an alkyl group containing 1 to 6 carbon atoms, and a cycloalkyl group containing 1 to 6 carbon atoms, or a phenyl group which may be substituted with at least one selected from a hydroxyl group, an alkyl group containing 1 to 6 carbon atom, a cycloalkyl group containing 1 to 6 carbon atoms, and an alkoxy group containing 1 to 6 carbon atoms.

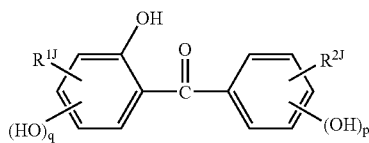

Formula (26)

In the Formula (26), $R^{1J}$ and $R^{2J}$ are each a hydrogen atom, an alkyl group containing 1 to 6 carbon atoms, or an aryl group containing 1 to 10 carbon atoms; and "p" and "q" express each an integer of 0 to 3 and satisfy the following relation: $p+q \geq 1$.

Among these quinonediazide compounds, preferable compounds are those obtained by subjecting the compound of one of the Formulae (21) to (26), and typically preferably the compound of one of the Formulae (22), (23) and (25) with condensing 1,2-quinonediazide-5-sulfonic acid. The condensed compound having, in average, 1.5 to 3 of 1,2-quinonediazido-5-sulfonic acid ester groups.

When KrF excimer laser radiation is used as the exposure light, the positive type resist composition is preferably a chemically-amplified positive type resist composition comprising a photo-acid generator as the photosensitive compound and an alkali-soluble siloxane polymer having an alkali-soluble group protected by a protecting group that is capable of leaving by action of acids as the alkali-soluble siloxane polymer.

The photo-acid generator is not specifically limited and can be appropriately selected according to the intended purpose. Examples of the photo-acid generator include onium salt compounds, organohalogen compounds, sulfone compounds, sulfonate compounds, and the like. Specific examples of the generator include diphenyliodonium trifluoromethanesulfonate, 4-methoxyphenylphenyliodonium hexafluoroantimonate, 4-methoxyphenylphenyliodonium trifluoromethanesulfonate, bis(4-tert-butylphenyl)iodonium tetrafluoroborate, bis(4-tert-butylphenyl)iodonium hexafluorophosphate, bis(4-tert-butylphenyl)iodonium hexafluoroantimonate, bis(4-tert-butylphenyl)iodonium trifluoromethanesulfonate, triphenysulfonium hexafluorophosphate, triphenysulfonium hexafluoroantimonate, triphenysulfonium trifluoromethanesulfonate, 4-methoxyphenyldiphenylsulfonium hexafluoroantimonate, 4-methoxyphenyldiphenylsulfonium trifluoromethanesulfonate, p-tolyldiphenylsulfonium trifluoromethanesulfonate, 2,4,6-trimethylphenyldiphenylsulfonium trifluoromethanesulfonate, 4-tert-butylphenyldiphenylsulfonium trifluoromethanesulfonate, 4-phenylthiophenyldiphenylsulfonium hexafluorophosphate, 4-phenylthiophenyldiphenylsulfonium hexafluoroantimonate, 1-(2-naphthoylmethyl)thiolanium hexafluoroantimonate, 1-(2-naphthoylmethyl) thiolanium trifluoromethanesulfonate, 4-hydroxy-1-naphthyldimethylsulfonium hexafluoroantimonate, 4-hydroxy-1-naphthyldimethylsulfonium trifluoromethanesulfonate, 2-methyl-4,6-bis(trichloromethyl)-1,3,5-triazine, 2,4,6-tris(trichloromethyl)-1,3,5-triazine, 2-phenyl-4,6-bis(trichloromethyl)-1,3,5-triazine, 2-(4-chlorophenyl)-4,6-bis(trichloromethyl)-1,3,5-triazine, 2-(4-methoxyphenyl)-4,6-bis(trichloromethyl)-1,3,5-triazine, 2-(4-methoxy-1-naphthyl)-4,6-bis(trichloromethyl)-1,3,5-triazine, 2-(benzo[d][1,3]dioxolan-5-yl)-4,6-bis(trichloromethyl)-1,3,5-triazine, 2-(4-methoxystyryl)-4,6-bis(trichloromethyl)-1,3,5-triazine, 2-(3,4,5-trimethoxystyryl)-4,6-bis(trichloromethyl)-1,3,5-triazine, 2-(3,4-dimethoxystyryl)-4,6-bis(trichloromethyl)-1,3,5-triazine, 2-(2,4-dimethoxystyryl)-4,6-bis(trichloromethyl)-1,3,5-triazine, 2-(2-methoxystyryl)-4,6-bis(trichloromethyl)-1,3,5-triazine, 2-(4-butoxystyryl)-4,6-bis(trichloromethyl)-1,3,5-triazine, 2-(4-pentyloxystyryl)-4,6-bis(trichloromethyl)-1,3,5-triazine, 1-benzoyl-1-phenylmethyl p-toluenesulfonate (common name: benzoin tosylate), 2-benzoyl-2-hydroxy-2-phenylethyl p-toluenesulfonate (common name: α-methylol benzoin tosylate), 1,2,3-benzenetriyl trismethanesulfonate, 2,6-dinitrobenzyl p-toluenesulfonate, 2-nitrobenzyl p-toluenesulfonate, 4-nitrobenzyl p-toluenesulfonate, diphenyl disulfone, di-p-tolyl disulfone, bis(phenylsulfonyl) diazomethane, bis(4-chlorophenylsulfonyl) diazomethane, bis(p-tolylsulfonyl)diazomethane, bis(4-tert-butylphenylsulfonyl) diazomethane, bis(2,4-xylylsulfonyl)diazomethane, bis(cyclohexylsulfonyl)diazomethane, (benzoyl) (phenylsulfonyl)diazomethane, N-(phenylsulfonyloxy) succinimide, N-(trifluoromethylsulfonyloxy)succinimide, N-(trifluoromethylsulfonyloxy)phthalimide, N-(trifluoromethylsulfonyloxy)-5-norbornene-2,3-dicarboximide, N-(trifluoromethylsulfonyloxy)naphthalimide, N-(10-camphorsulfonyloxy)naphthalimide, and the like.

Each of these compounds can be used either alone or in combination of two or more.

The content of the photosensitive compound in the positive type resist composition is not specifically limited, can be appropriately selected according to the intended purpose. The content is preferably from 10% by mass to 50% by mass relative to the entire solid portion, when the alkali-soluble siloxane polymer is a non-chemically amplified polymer. It is preferably from 0.1% by mass to 10% by mass, when the alkali-soluble siloxane polymer is a chemically amplified polymer.

If the content towards the entire solid portion of the photosensitive compound is less than 10% by mass in a case of the chemically amplified polymer, and is less than 0.1% by mass in a case of the non-chemically amplified polymer, the difference in dissolution rate between exposed and unexposed areas may not be sufficiently large. If it exceeds 50% by mass for the non-chemically amplified polymer, the resulting resist composition may have deteriorated oxygen plasma resistance or may exhibit deteriorated resolution due to a varying amount of light between above and below the resist film. If it exceeds 10% by mass for the chemically amplified polymer, the resulting resist composition may exhibit deteriorated resolution due to considerable amount of oxygen generated.

The i-line absorbance of the photosensitive compound is not specifically limited and can be appropriately selected according to the intended purpose. The i-line absorbance in terms of a 1 μm thick resist film is preferably from 1.00 to 3.50 and more preferably from 1.10 to 2.50.

If the i-line absorbance of the photosensitive compound is out of the above-specified range, a 1 μm thick resist film prepared from the positive type resist composition may not have a transmittance to i-line radiation in the range from 5% to 60%. If it is less than 1.00, the difference in dissolution rate between exposed and unexposed areas may not be sufficiently large. If it exceeds 3.50, the resulting resist composition may exhibit deteriorated resolution due to a varying amount of light between above and below the resist film.

The i-line absorbance of the 1 μm thick resist film prepared from the photosensitive compound can be determined, for example, by actually measuring the transmittance of a coated film prepared by dispersing the photosensitive compound into a binder resin. For example, the i-line absorbance "A" can be determined by calculation according to the following equation. In the equation, "T" is a measured value of the i-line transmittance (%) of a coated film 0.55 μm thick, in which the coated film is formed by applying a 2-heptanone solution containing 100 parts by weight of the alkali-soluble siloxane polymer, 50 parts by weight of the photosensitive compound, and 1.5 parts by weight of the phenolic compound expressed by the Formula (15) mentioned later to a glass substrate by spin coating. The i-line transmittance T (%) can be determined by using a spectrophotometer (e.g., U-3500 available from Hitachi, Ltd.) with the i-line transmittance (%) of the glass substrate as a reference.

$$A = \frac{1}{0.55} \times \frac{151.5}{50} \times \log_{10}\frac{100}{T} \qquad \text{Equation (2)}$$

Surfactants

The surfactant may be suitably used in the first aspect of the present invention. The surfactant may be particularly suitably used in the second aspect of the present invention. The surfactant effectively prevents side lobes from generating by combining with the alkali-soluble siloxane polymers (namely, the alkali-soluble siloxane polymers in which 19% or less of a total silicon atoms are directly bonded to a hydroxy group). The surfactant for use in the present invention is not specifically limited and can be appropriately selected according to the intended purpose. Preferred surfactants are (1) at least one selected from polycarboxy acid surfactants, sorbitan ester surfactants, poly ethyleneglycol monoester surfactants, and poly ethyleneglycol monoether surfactants as a first embodiment, and (2) at least one selected from polycarboxy acid surfactants and nonionic surfactants having a hydrophile-lypophile balance (HLB) of 9 or less.

Each of these surfactants can be used either alone or in combination of two or more.

The HLB of the surfactant is preferably 9 or less and more preferably 8 or less in the first embodiment. The HLB is required to be 9 or less and is preferably 8 or less in the second embodiment.

If the HLB exceeds 9, the side lobes may not be sufficiently prevented.

The HLB can be determined according to an emulsification test process described by Griffin W. C. in "Classification of Surface-Active Agents by HLB," *Journal of the Society of Cosmetic Chemists* 1, p. 311 (1949). If the surfactant is a mixture of surfactants having known HLBs, the HLB of the surfactant can be determined by determining the sum total of the products of HLBs of individual surfactants in the mixture and the weights of the individual surfactants in the mixture as described by Griffin W. C. in "Calculation of HLB Values of Non-Ionic Surfactants", *Journal of the Society of Cosmetic Chemists* 5, 259 (1954).

The polycarboxy acid surfactants are not specifically limited, can be appropriately selected according to the intended purpose and include, for example, maleic anhydride copolymers, and the like. Examples of the commercially available polycarboxy acid surfactants include DEMOL EP produced by Kao Corporation, and the like.

The sorbitan ester surfactants are not specifically limited, can be appropriately selected according to the intended purpose and include, for example, sorbitan fatty acid esters and the like. Among them, typically preferred are sorbitan monooleate, sorbitan trioleate, sorbitan monolaurate, sorbitan monopalmitate, sorbitan monostearate, sorbitan sesquioleate, and the like.

The poly ethyleneglycol monoester surfactants are not specifically limited, and can be appropriately selected according to the intended purpose. Examples of the poly ethyleneglycol monoester include poly ethyleneglycol alkyl fatty acid ester, poly ethyleneglycol fatty acid ester, and the like.

Of those, the preferred are those having a poly ethyleneglycol moiety having 2 to 20 ethylene oxide units. Specific examples of the poly ethyleneglycol monoester surfactant include poly ethyleneglycol monooleate, and the like.

The poly ethyleneglycol monoether surfactants are not specifically limited, and can be appropriately selected according to the intended purpose. Examples of the poly ethyleneglycol monoether surfactant include a condensed product of poly ethyleneglycol and alcohol derivative, a condensed product of poly ethyleneglycol and phenol derivative, and the like. Of those, the preferred are those having a poly ethyleneglycol moiety having 2 to 20 ethylene oxide units. Specific examples of the poly ethyleneglycol monoether surfactant include poly ethyleneglycol monocetyl ether, poly ethyleneglycol monododecyl ether, poly ethyleneglycol monononylphenyl ether, poly ethyleneglycol monooctylphenyl ether, poly ethyleneglycol benzyl ether, and the like.

The content of the surfactant in the positive type resist composition is preferably from 0.1% by mass to 30% by mass and more preferably from 0.3% by mass to 10% by mass relative to the solid mass of the positive type resist composition.

If the content is less than 0.1% by mass, the side lobes may not be sufficiently prevented. If it exceeds 30% by mass, the positive type resist composition may have deteriorated sensitivity and resolution.

Other Components

The additional components are not specifically limited and can be appropriately selected according to the intended purpose. Preferable examples of the additional components include solvents, low-molecular compounds having a phenolic hydroxyl group, and the like.

The solvents are not specifically limited and can be appropriately selected according to the intended purpose, as long as they can dissolve the alkali-soluble siloxane polymer, the photosensitive compound, the surfactant, and other components added according to necessity. Preferable examples of the solvents include glycol esters such as methyl cellosolve acetate, propylene glycol monomethyl ether acetate, and the like; esters such as ethyl pyruvate, n-amyl acetate, ethyl lactate, methyl-3-methoxypropionate, ethyl-3-ethoxypropionate, and the like; ketones such as 2-heptanone, γ-butyrolactone, ethyl amyl ketone, and the like.

Each of these solvents can be used either alone or in combination of two or more.

The low-molecular compounds having a phenolic hydroxyl group are not specifically limited, can be appropriately selected according to the intended purpose. Examples of the low-molecular compounds include phenolic compounds expressed by one of the following Formulae (13), (14), (15), (16), and (17).

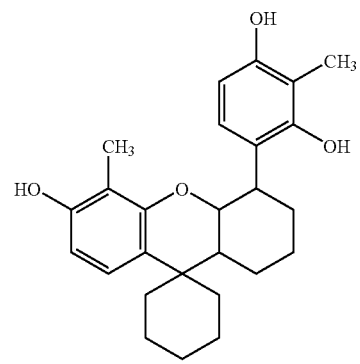

Formula (13)

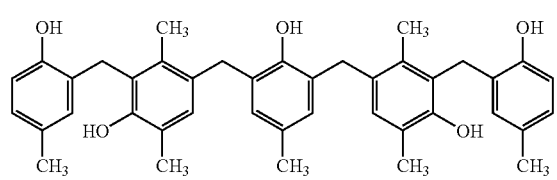

Formula (14)

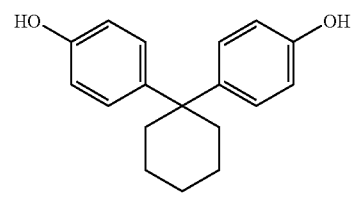

Formula (15)

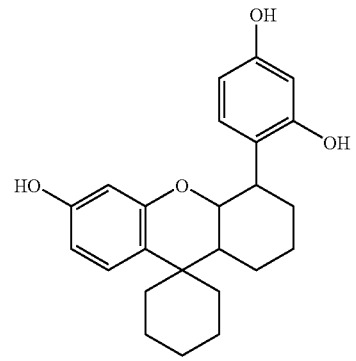

Formula (16)

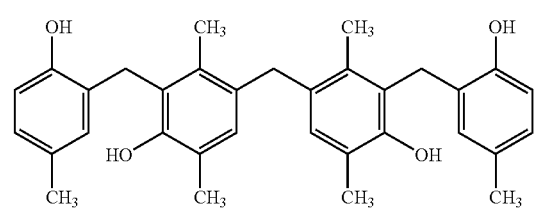

Formula (17)

Preparation of Positive Type Resist Compositions

The preparation process of the positive type resist composition is not specifically limited and can be appropriately selected from conventional or known processes. For example, the composition in the form of liquid can be prepared by mixing the alkali-soluble siloxane polymer, the photosensitive compound, the surfactant and other components or by dissolving these components in the solvent.

More specifically, the positive type resist composition can be prepared, for example, by: (1) a process in which, with stirring, the alkali-soluble siloxane polymer, the photosensitive compound, the surfactant and other components are, either subsequently or at once, added into and dissolved in the solvent in a vessel, or by: (2) a process in which the solvent is added to the alkali-soluble siloxane polymer, the photosensitive compound, the surfactant and other components and is stirred and dissolved.

The solid concentration of the positive type resist composition thus prepared is not specifically limited, can be appropriately selected depending on the thickness of the resist film and the process of forming the resist film. Generally, the solid concentration is from about 1% by mass to about 50% by mass.

Uses and Applications of Positive Type Resist Compositions

The positive type resist composition of the present invention can form a resist pattern having fine patterns (fine traces), for example, by coating the composition on a substrate to a resist film, applying the exposure light such as i-line radiation to the resist film in a patternwise manner, and baking, or developing the exposed resist film.

The process for forming the resist pattern, thickness, size and thickness of the resist pattern formed of the positive type resist composition of the present invention are not particularly limited, and can be suitably selected according to light source, target resolution, height of the formed pattern, etching rate ratio of the resist film to the lower layer in the two-layer resist process and other relations.

In particular, the thickness can be appropriately set depending on the underlying layer (substrate) to be patterned and etching relations and is generally from about 0.1 μm to about 10 μm. When the resist film is used as an upper resist in the two-layer resist process, the thickness thereof is preferably about 1 μm or less.

The positive type resist composition can be coated by any method appropriately selected from conventional or known techniques such as spin coating, bar coating, die coating, and the like.

The positive type resist composition can be used in a variety of fields and is advantageously used in the resist pattern, the process for forming a resist pattern, the electronic device, and the process for manufacturing an electronic device of the present invention. It is also preferably used as a resist for i-line radiation photolithography or photofabrication, is more preferably used as an upper layer in a multilayer resist film and is typically preferably used in a resist film to be etched with oxygen plasma.

The positive type resist composition can be suitably used for patterning using a phase-contrast shift mask. The phase-contrast shift mask can be suitably selected according to the purposes. Examples of the phase-contrast shift mask include a half-tone mask, and the like. A resist film obtained by the positive type resist composition is excellent in effectively preventing the side lobes, and exhibits a high oxygen plasma resistance. Therefore, in a case of patterning by a half-tone mask with the positive type resist composition, the target resist is able to have finer patterns, and to very effectively prevent side lobes. When using the positive type resist composition, high-performance semiconductor devices can be efficiently obtained.

The positive type resist composition is suitably used, for example, in manufacturing electronic devices and is typically suitably used in manufacturing at least one selected from electronic devices.

Such electronic devices are not specifically limited, can be appropriately selected according to the intended purpose. Examples of the electric device include a semiconductor device, a magnetic head, a high electron mobility transistor, a plasma display, and the like. Of those, a magnetic head, a high electron mobility transistor, and a plasma display are suitably preferred.

Resist Patterns

The resist pattern of the present invention is advantageously formed by the process for forming a resist pattern according to the present invention described hereinafter.

The resist pattern of the present invention can be advantageously used for functional parts such as a mask pattern, a reticle pattern, a magnetic head, a liquid crystal display (LCD), a plasma display panel (PDP), a surface acoustic wave filter (SAW filter), and the like, optical parts for connecting optical wirings, fine parts such as microactuator and the like, a high electron mobility transistor, a semiconductor device, and the like. It is also advantageously used in the electronic devices of the present invention mentioned hereinafter.

The process for forming a resist pattern of the present invention will be illustrated below with reference to the resist pattern of the present invention.

Process for Forming Resist Patterns

The process for forming a resist pattern of the present invention comprises at least a process forming a resist film, and a process for forming a resist pattern. The process may further comprise other processes according to necessity.

Process for Forming a Resist Film

The process for forming a resist film is carried out by forming a resist film formed of the positive type resist composition of the present invention.

The process for forming the resist film is not specifically limited and can be appropriately selected from conventional or known procedures. The resist film is preferably formed by, for example, coating the positive type resist composition.

The method coating the positive type resist composition is not specifically limited, and can be appropriately selected from conventional or known coating procedures according to the intended purpose. Preferable methods include spin coating, and the like.

The resist film can be formed on an underlying layer (substrate). The underlying layer (substrate) is not specifically limited and can be appropriately selected according to the intended purpose. When the resist pattern is formed in semiconductor devices and other electronic devices, the underlying layer (substrate) is preferably a semiconductor substrate such as a silicon wafer, and the like.

Process for Forming Resist Pattern

The process for forming a resist pattern is carried out by forming a desired pattern by exposure, baking, and developing a resist film formed by the process for forming the resist film.

Examples of light for the exposure includes g-line radiation, i-line radiation, KrF excimer laser radiation, and the like. Of those, i-line radiation is preferably used.

The resist film can be selectively exposed to the light by any method selected depending on the intended purpose. Examples of the method include any known method using a mask (halftone mask) pattern, and the like. An exposure device can be used in the exposure.

Conditions and methods for the exposure are not particularly limited, and can be suitably selected according to the purposes.

Conditions and methods for the baking are not particularly limited, and can be suitably selected according to the purposes.

Baking temperature is from about 70° C. to about 150° C., and preferably from about 90° C. to about 130° C. Baking time is from about 10 seconds to about 5 minutes, and preferably from about 40 seconds to about 100 seconds.

Conditions and methods for the developing are not particularly limited, and can be suitably selected according to the purposes. Preferably, developing is carried out by using a weak alkali aqueous solution.

According to the process for forming a resist pattern of the present invention, fine patterns or traces of resist patterns can be formed, by coating the positive type resist composition onto a substrate to form a resist film, then exposing the resist film to an exposure light such as i-line radiation in fine-patternwise manner, and then baking and developing the exposed resist film.

A resist pattern formed by the process of the present invention is the resist pattern of the present invention. The resist pattern can be advantageously used for functional parts such as a mask pattern, a reticle pattern, a magnetic head, a liquid crystal display (LCD), a plasma display panel (PDP), a surface acoustic wave filter (SAW filter), and the like, optical parts for connecting optical wirings, fine parts such as microactuator and the like, a high electron mobility transistor, a semiconductor device, and the like. It is also advantageously used in the electronic device of the present invention mentioned hereinafter.

The process for forming a resist pattern of the present invention is typically suitable in forming space patterns such as line-and-space patterns. The process for forming the resist pattern can be utilized for the electronic device and the process for manufacturing the electronic device of the present invention.

Electronic Device and Process for Manufacturing the Same

The electronic device of the present invention comprises any known materials and parts. Components of the electronic device can be appropriately selected according to the intended purpose, as long as they have a pattern (traces) formed of the resist pattern of the present invention.

Examples of the electronic devices include various semiconductor device such as magnetic heads, high electron mobility transistor devices (HEMTs), plasma displays, flash memories, dynamic random access memories (DRAMs), ferroelectric random access memories (FRAMs), and the like. Of those, magnetic heads, high electron mobility transistor devices (HEMTs), and plasma displays are preferred.

The electronic devices of the present invention can be advantageously manufactured by the process for manufacturing an electronic device of the present invention.

The process for manufacturing an electronic device comprises a process for forming a resist pattern, and a process for patterning. It may further comprise other processes, if necessary.

Resist Pattern Forming Step

A step for forming a resist pattern is carried out by forming a resist pattern, which is formed by the process for forming the resist pattern of the present invention, on an underlying layer.

Examples of the underlying layer on which the resist pattern is formed include surface layers of parts in various electronic devices. The resist pattern is preferably formed on a substrate, or on its surface layer in a semiconductor device such as silicon wafers.

For example, in order to manufacture a T gate electrode for a high electron mobility transistor device (HEMT) as the electronic device, the resist pattern forming process is preferably carried out in the following manner. At least two layers of resist films may be formed using the positive type resist composition. If the resist layer comprises two layers, a larger opening is formed in the upper layer, and then a smaller opening is formed in the lower layer. If the resist layer comprises three layers, a larger opening is formed in the intermediate layer, and then a smaller opening is formed in the lower layer.

The positive type resist composition of the present invention can be used for the resist film and can be typically advantageously used for the upper layer of the two-layer resist film.

Patterning Step

A step for patterning is carried out by patterning the underlying layer by etching the underlying layer using the resist pattern formed by the resist pattern forming process as a mask or reticle.

The underlying layer can be etched by any known method appropriately selected according to the intended purpose. It is preferably etched by dry etching using oxygen plasma.

A condition for etching is not particularly limited, and appropriately selected according to the intended purpose.

The process of the present invention allows for efficiently manufacturing a variety of electronic devices including semiconductor devices such as a magnetic head, a high electron mobility transistor device (HEMT), a plasma display, a flash memory, DRAMs, FRAMs, and the like.

EXAMPLES

The present invention will be described in further detail with reference to the examples below. The present invention is not limited to those examples.

Synthesis Example 1

In a 1000-ml four-neck flask equipped with a stirring rod, a thermometer, a reflux condenser, and a nitrogen supply tube, in which nitrogen gas was flown, 100 ml of ethanol, 119 g of a 7:3 mixture of 2-[4-(tert-butoxy)phenyl]ethyldimethylchlorosilane and 1-[4-(tert-butoxy)phenyl]ethyldimethylchlorosilane, and 187.2 g of tetraethoxysilane were placed. A dropping funnel was attached to the flask, and a mixture of 25 ml of ethanol and 65 g of ion-exchanged water was gradually dropped from the dropping funnel to the mixture in the flask cooled on a water bath so that the temperature inside did not exceed 34° C. After completely dropping, the resulting mixture was stirred and allowed to react at 60° C. for 1 hour. A long-glass nitrogen supply tube was attached to the flask instead of the dropping funnel and was introduced into the mixture in the flask. The mixture was then stirred and allowed to react at 60° C. for 20 hours while bubbling the mixture with nitrogen gas to thereby remove ethanol by distillation. The resulting reacted mixture was diluted with 300 ml of 4-methyl-2-heptanone (MIBK) and was cooled to room temperature. The reacted mixture was then moved into an egg plant type flask, from which residual ethanol with 4-methyl-2-heptanone (MIBK) were removed by distillation using a rotary evaporator. A 4-methyl-2-heptanone (MIBK) concentrated solution was hence obtained.

The 4-methyl-2-heptanone (MIBK) concentrated solution was placed in a 1000-ml four-neck flask equipped with a stirring rod, a thermometer, a long-glass nitrogen supply tube, a metering receiver, and a reflux condenser, and 4-methyl-2- heptanone (MIBK) was further added. In the 4-methyl-2-heptanone (MIBK) concentrated solution and the added 4-methyl-2-heptanone (MIBK), 60 g of a 7:3 mixture of 2-[4-(tert-butoxy)phenyl]ethyldimethylchlorosilane and 1-[4-(tert-butoxy)phenyl]ethyldimethylchlorosilane were added, and 21 g of pyridine was further added at room temperature. The resulting mixture was stirred and allowed to react at room temperature for 15 hours. The resulting reaction mixture was diluted with ion-exchanged water, was stirred, was left to stand, and the aqueous layer was removed. This washing procedure with water was repeated four times.

The organic layer was moved into the flask, and 100 ml of 6N hydrochloric acid was added into the flask. The resulting mixture was stirred and allowed to react at 70° C. for 8 hours. Thereafter, the reaction mixture was left to stand, the aqueous layer was removed, the resulting organic layer was diluted with ion-exchanged water, was stirred, was left to stand, and the aqueous layer was removed. This washing procedure was repeated four times. The resulting organic layer was filtrated and was then subjected to removal of the solvent by distillation using a rotary evaporator.

The residue was dissolved in 500 ml of ethanol and was diluted with 1500 ml of n-hexane with stirring. After stirring for 15 minutes, the mixture was left to stand, and the supernatant was removed by decantation. The precipitated layer was dissolved in 500 ml of ethanol and was diluted with 1500 ml of n-hexane with stirring. The precipitated layer was moved into an egg plant type flask, followed by removal of the solvent by distillation using a rotary evaporator. The residue was dissolved in acetone, followed by removal of the solvent by distillation using a rotary evaporator, and thereby obtained 250 g of an alkali-soluble siloxane polymer expressed by the following Formula (11). The alkali-soluble siloxane polymer according to SYNTHESIS EXAMPLE 1 had a weight-average molecular weight in terms of polystyrene of 6600, a molecular weight distribution (Mw/Mn) of 1.38 and contained individual units in molar ratios "d" of 0.48, "e" of 0.11, "f" of 0.25, and "g" of 0.16 as determined by $^{29}$Si-NMR and $^1$H-NMR analysis.

were added into the resulting reacted mixture. The reacted mixture was then stirred and left to stand so as to remove aqueous layer. The mixture was washed with water 3 times. Thereafter, the organic layer was filtered with a liquid phase separating filter paper, then was recovered.

The organic layer was placed in a 1000 ml four-neck flask equipped with a stirring rod, a thermometer, a long-glass nitrogen supply tube, a metering receiver, and a reflux condenser. The organic layer was raised in temperature to 90° C., followed by removal of water by azeotropic distillation with 4-methyl-2-heptanone (MIBK) while bubbling the organic layer with nitrogen gas supplied from the nitrogen supply tube. After standing to cool, a dropping funnel was attached to the flask instead of the metering receiver. The dehydrated mixture was treated with 60 g of a 7:3 mixture of 2-[4-(tert-butoxy)phenyl]ethyldimethylchlorosilane and 1-[4-(tert-butoxy)phenyl]ethyldimethylchlorosilane and 21 g of pyridine at 60° C. for 2 hours with stirring. The resulting mixture was further treated with 36 g of chloromethyldimethylchlorosilane and 19 g of pyridine at 60° C. for 1.5 hours and further treated at room temperature for 13 hours with stirring. The reaction mixture was diluted with ion-exchanged water, was stirred, was left to stand, and the aqueous layer was removed. This washing procedure with water was repeated a total of four times. The organic layer was recovered, was subjected to removal of water and solvent by distillation using a rotary evaporator and thereby yielded a residue.

The residue was dissolved in 500 g of 4-methyl-2-heptanone (MIBK), was removed into a flask and was treated with 62 ml of 6 N hydrochloric acid at 70° C. for 8 hours with stirring. The reaction mixture was left to stand, from which the aqueous layer was removed. The organic layer was diluted with ion-exchanged water, was stirred, was left to stand, and the aqueous layer was removed therefrom. This washing procedure with water was repeated a total of five times. The resulting organic layer was filtrated and was then subjected to removal of the solvent by distillation using a rotary evaporator.

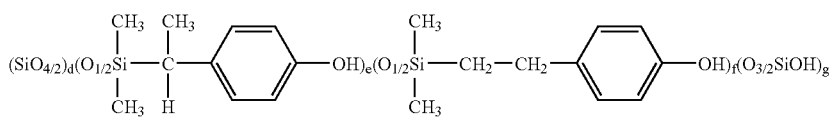

Formula (11)

Synthesis Example 2

In a 1000-ml four-neck flask equipped with a stirring rod, a thermometer, a dropping funnel, a reflux condenser, and a nitrogen supply tube, in which nitrogen gas was flown, 119 g of a 7:3 mixture of 2-[4-(tert-butoxy)phenyl]ethyldimethylchlorosilane and 1-[4-(tert-butoxy)phenyl]ethyldimethylchlorosilane, 417 g of 4-methyl-2-heptanone (MIBK), 206 g of acetone, 520 g of ion-exchanged water, and 52 ml of a concentrated hydrochloric acid were placed. The resulting mixture was heated to 60° C. 187.2 g of tetraexthoxysilane was dropped in 30 minutes from the dropping funnel. After completing the dropping, the resulting mixture was stirred and allowed to react at 60° C. for 5.5 hours. 1000 ml of 4-methyl-2-heptanone (MIBK) and ion-exchanged water The resulting residue was dissolved in 100 ml of ethanol and the solution was diluted with 2500 ml of n-hexane with stirring. After stirring for 10 minutes, the mixture was left stand, and the supernatant was removed by decantation. The precipitated layer was dissolved in 100 ml of ethanol and was diluted with 2500 ml of n-hexane with stirring. The precipitated layer was moved into an egg plant type flask, followed by removal of the solvent by distillation using a rotary evaporator. The residue was dissolved in acetone, followed by removal of the solvent by distillation using a rotary evaporator, and thereby yielded 134 g of an alkali-soluble siloxane polymer expressed by the following Formula (12). The alkali-soluble siloxane polymer according to SYNTHESIS EXAMPLE 2 had a weight-average molecular weight (Mw) in terms of polystyrene of 7500, a molecular weight distribution (Mw/Mn) of 1.42 and contained individual units in molar ratios "d" of 0.52, "e" of 0.11, "f" of 0.25, "g" of 0.08, and "h" of 0.04 as determined by $^{29}$Si-NMR and $^1$H-NMR analyses.

vidual units in molar ratios "d" of 0.59, "e" of 0.10, "f" of 0.23, "g" of 0.04, and "h" of 0.03 as determined by $^{29}$Si-NMR and $^1$H-NMR analyses.

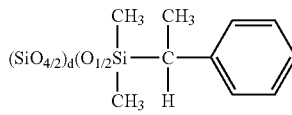 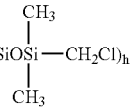

Formula (12)

$(SiO_{4/2})_d(O_{1/2}Si)$—[structure]—$(OH)_e(O_{1/2}Si$—$CH_2$—$CH_2$—[structure]—$OH)_f(O_{3/2}SiOH)_g(O_{3/2}SiOSi$—$CH_2Cl)_h$

Synthesis Example 3

An alkali-soluble siloxane polymer expressed by the Formula (11) was prepared by the procedure of SYNTHESIS EXAMPLE 1. The alkali-soluble siloxane polymer according to SYNTHESIS EXAMPLE 3 had a weight-average molecular weight (Mw) in terms of polystyrene of 4000, a molecular weight distribution (Mw/Mn) of 1.23 and contained individual units in molar ratios "d" of 0.46, "e" of 0.12, "f" of 0.28, and "g" of 0.14 as determined by $^{29}$Si-NMR and $^1$H-NMR analyses.

Synthesis Example 7

112 g of an alkali-soluble siloxane polymer expressed by the Formula (27) were prepared by the procedure of SYNTHESIS EXAMPLE 2. The alkali-soluble siloxane polymer according to SYNTHESIS EXAMPLE 7 had a molecular weight in terms of polystyrene of 7300, a molecular distribution of 1.39 and contained individual units in molar ratios "d2" of 0.55, and a relation of: (e2+f2+h2)=0.33, and "g2" of 0.12, as determined by $^{29}$Si-NMR analysis.

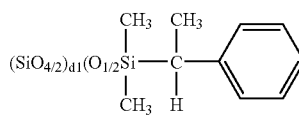

Formula (27)

$(SiO_{4/2})_{d1}(O_{1/2}Si)$—[structure]—$(OH)_{e1}(O_{1/2}Si$—$CH_2$—$CH_2$—[structure]—$OH)_{f1}(O_{3/2}SiOH)_{g1}(O_{3/2}SiOSi$-$CH_2Cl)_{h1}$

Synthesis Example 4

An alkali-soluble siloxane polymer expressed by the Formula (11) was prepared by the procedure of SYNTHESIS EXAMPLE 1. The alkali-soluble siloxane polymer according to SYNTHESIS EXAMPLE 4 had a weight-average molecular weight (Mw) in terms of polystyrene of 6400, a molecular weight distribution (Mw/Mn) of 1.30 and contained individual units in molar ratios "d" of 0.49, "e" of 0.10, "f" of 0.22, and "g" of 0.19 as determined by $^{29}$Si-NMR and $^1$H-NMR analyses.

Synthesis Example 5

An alkali-soluble siloxane polymer expressed by the Formula (12) was prepared by the procedure of SYNTHESIS EXAMPLE 2. The alkali-soluble siloxane polymer according to SYNTHESIS EXAMPLE 5 had a weight-average molecular weight (Mw) in terms of polystyrene of 10500, a molecular weight distribution (Mw/Mn) of 2.22 and contained individual units in molar ratios "d" of 0.55, "e" of 0.10, "f" of 0.24, "g" of 0.09, and "h" of 0.02 as determined by $^{29}$Si-NMR and $^1$H-NMR analyses.

Synthesis Example 6

An alkali-soluble siloxane polymer expressed by the Formula (12) was prepared by the procedure of SYNTHESIS EXAMPLE 2. The alkali-soluble siloxane polymer according to SYNTHESIS EXAMPLE 6 had a weight-average molecular weight (Mw) in terms of polystyrene of 9000, a molecular weight distribution (Mw/Mn) of 1.77 and contained indi-

Example 1

A 5:1:1 mixture of an i-line radiation resist (available from Sumitomo Chemical Co., Ltd. under the trade name of SUMIRESIST (registered trademark) PFI-38A9), an epoxy resin (available from Sumitomo Chemical Co., Ltd. under the trade name of SUMI-EPOXY ESCN-195 XL7) and 2-heptanone was prepared, was filtrated through a 0.2 μm filter and thereby yielded an undercoat solution. The undercoat solution was applied onto a silicon substrate by spin coating at 2000 rpm, was baked on a hot plate at 270° C. for 2 hours and thereby yielded an underlying layer having a thickness of 1.45 μm on the silicon substrate.

A total of 100 parts by mass of the alkali-soluble siloxane polymer prepared in SYNTHESIS EXAMPLE 2, 30 parts by mass of a photosensitive compound 1, 30 parts by mass of a photosensitive compound 2, 475.7 parts by mass of 2-heptanone, and 4.3 parts by mass of γ-butyrolactone were mixed and thereby yielded a positive type resist composition (positive type resist composition 1) as a solution. The positive type resist composition 1 was filtrated through a 0.2 μm filter before spin coating.

The photosensitive compound 1 was a condensation product of 1 mole of a phenolic compound expressed by the following Formula (13) with 2 moles of 1,2-naphthoquinonediazido-5-sulfonyl chloride. The photosensitive compound 2 was a condensation product of 1 mole of a phenolic compound expressed by the following Formula (14) with 1.8 moles of 1,2-naphthoquinonediazido-5-sulfonyl chloride.

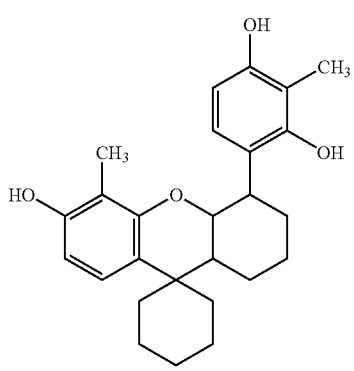

Formula (13)

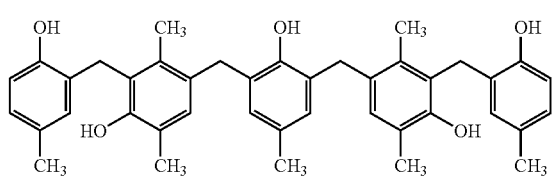

Formula (14)

The positive type resist composition 1 was applied onto the underlying layer by spin coating, was heated at 90° C. for 1 minute, so as to form a resist film of the positive type resist composition 1 having a thickness of 0.55 μm on the underlying layer.

The resist film was patterned by irradiation with light of 365 nm through a line-and-space pattern using a stepper (available from Nikon Corporation under the trade name of NSR 2005i9C; NA=0.57; sigma=0.60).

The silicon substrate having the exposed resist film was heated at 110° C. for 60 seconds, was cooled to 23° C., was subjected to puddle development in a 2.38% by mass tetramethylammonium hydroxide aqueous solution for 1 minute, was rinsed with water for 15 seconds, so as to form a resist pattern for the formation of a desired line-and-space pattern.

The cross section of the above-formed resist pattern was observed under an electron microscope. The resolution of the slit was determined at an exposure (300 mJ/cm$^2$), at which a 0.8 μm line-and-space pattern was reproduced on the underlying layer, and was found to be 0.29 μm.

Example 2

A positive type resist composition 2 was prepared by the procedure of Example 1, except that the alkali-soluble siloxane polymer prepared in SYNTHESIS EXAMPLE 3 was used instead of the alkali-soluble siloxane polymer prepared in SYNTHESIS EXAMPLE 2.

The positive type resist composition 2 was applied onto the underlying layer by spin coating, was heated at 90° C. for 1 minute by the procedure of Example 1, so as to form a resist film of the positive type resist composition 2 having a thickness of 0.55 μm on the underlying layer. The resist film was exposed, baked, developed and rinsed by the procedure of Example 1, so as to form a resist pattern having a line-and-space pattern.

The cross section of the above-formed resist pattern was observed under an electron microscope. The resolution of the slit was determined at an exposure (250 mJ/cm$^2$), at which a 0.8 μm line-and-space pattern was reproduced on the underlying layer, and was found to be 0.25 μm.

Example 3

A positive type resist composition 3 was prepared by the procedure of Example 1, except that the alkali-soluble siloxane polymer prepared in SYNTHESIS EXAMPLE 4 was used instead of the alkali-soluble siloxane polymer prepared in SYNTHESIS EXAMPLE 2.

A resist film was prepared from the positive type resist composition 3, and the oxygen plasma resistance of the resist film was determined in the following manner. Specifically, the resist film was subjected to etching with oxygen plasma in a parallel plate dry-etching reactor at a radio frequency (rf) power of 100 W/cm$^2$, an oxygen flow rate of 50 sccm, and a gas pressure of 5.0 Pa. After baking at 110° C. for 60 seconds, the etching rate of the resist film of the positive type resist composition 3 was 0 angstrom per minute. Separately, a resist film was prepared from a novolak resin-based i-line radiation resist (available from Sumitomo Chemical Co., Ltd. under the trade name of SUMIRESIST (registered trademark) PFI-38A9) and was baked at 270° C. for 2 hours. This resist film was etched under the same conditions as above and the etching rate of the novolak resin-based I-line radiation resist was 2050 angstroms per minute after baking for two hours. These results show that the positive type resist composition 3 has sufficient oxygen plasma resistance.

Example 4

A positive type resist composition 4 was prepared by the procedure of Example 1, except that the alkali-soluble siloxane polymer prepared in SYNTHESIS EXAMPLE 1 was used instead of the alkali-soluble siloxane polymer prepared in SYNTHESIS EXAMPLE 2.

To determine the storage stability of the positive type resist composition 4, changes with time in the number of particles in a solution were determined in the following manner. A solution of the positive type resist composition 4 was prepared, was left to stand for one day and was filtrated through a 0.2 μm filter. The number of particles in the solution immediately after filtration was defined as an initial value. The number of particles having an average particle diameter of 0.3 μm or more in the solution after storage at 5° C. for 20 days was 157 per milliliter with a respect to an initial value of 149 per milliliter. The number of particles having an average particle diameter of 0.3 μm or more in the solution after storage at 23° C. for 20 days was 127 per milliliter with a respect to an initial value of 137 per milliliter, and the number of particles having an average particle diameter of 0.3 μm or more in the solution after storage at 40° C. for 10 days was 129 per milliliter with a respect to an initial value of 125 per milliliter. These results show that the number of particles in the solution hardly changed.

As a comparative test, the storage stability of a Si-containing positive type resist composition described in Japanese Patent Application Publication (JP-B) No. 05-58446 was determined in the following manner. A solution of the positive type resist composition was prepared, was left to stand for one day and was filtrated through a 0.2 μm filter. The number of particles in the solution immediately after filtration was defined as an initial value. The number of particles having an average particle diameter of 0.3 μm or more in the solution after storage at 5° C. for 20 days was 362 per milliliter with a respect to an initial value of 150 per milliliter, and the number after storage at 23° C. for 20 days was 4875 per milliliter with a respect to an initial value of 146 per milliliter. These results show that the number of particles in the solution significantly changed. The solution became gel after storage at 40° C. for 10 days.

Example 5

A total of 100 parts by mass of the alkali-soluble siloxane polymer prepared in SYNTHESIS EXAMPLE 5, 50 parts by mass of the following photosensitive compound 3, 5 parts by mass of a phenolic compound expressed by the following Formula (15), 460.8 parts by mass of 2-heptanone, and 4.2 parts by mass of γ-butyrolactone were mixed, so as to form a positive type resist composition (positive type resist composition 5) as a solution. The positive type resist composition 5 was filtrated through a 0.2 μm filter before spin coating.

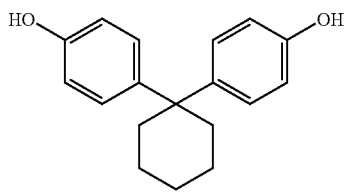

Formula (15)

The photosensitive compound 3 was a condensation product of 1 mole of a phenolic compound expressed by the following Formula (16) with 3 moles of 1,2-naphthoquinonediazido-5-sulfonyl chloride.

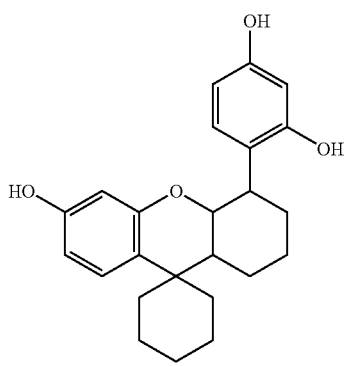

Formula (16)

The positive type resist composition 5 was applied onto the underlying layer by spin coating, was heated at 90° C. for 1 minute, so as to form a resist film of the positive type resist composition 5 having a thickness of 0.55 μm on the underlying layer.

The resist film was exposed, baked, developed and rinsed by the procedure of Example 1, so as to form a resist pattern having a line-and-space pattern.

The cross section of the above-formed resist pattern was observed under an electron microscope. The resolution of the slit was determined at an exposure (425 mJ/cm$^2$), at which a 0.8 μm line-and-space pattern was reproduced on the underlying layer, and was found to be 0.30 μm.

Example 6

A total of 100 parts by mass of the alkali-soluble siloxane polymer prepared in SYNTHESIS EXAMPLE 5, 23.1 parts by mass of the photosensitive compound 3, 26.9 parts by mass of the following photosensitive compound 4, 1.5 parts by mass of the phenolic compound expressed by the Formula (15), 450.4 parts by mass of 2-heptanone, and 4.1 parts by mass of γ-butyrolactone were mixed and thereby yielded a positive type resist composition (positive type resist composition 6) as a solution. The positive type resist composition 6 was filtrated through a 0.2 μm filter before spin coating.

The photosensitive compound 4 was a condensation product of 1 mole of a phenolic compound expressed by the following Formula (17) with 2 moles of 1,2-naphthoquinonediazido-5-sulfonyl chloride.

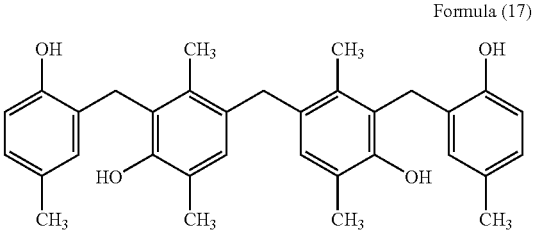

Formula (17)

The positive type resist composition 6 was applied onto the underlying layer by spin coating, was heated at 90° C. for 1 minute, so as to form a resist film of the positive type resist composition 6 having a thickness of 0.55 μm on the underlying layer.

The resist film was exposed, baked, developed and rinsed by the procedure of Example 1, so as to form a resist pattern having a line-and-space pattern.

The cross section of the above-formed resist pattern was observed under an electron microscope. The resolution of the slit was determined at an exposure (450 mJ/cm$^2$), at which a 0.8-μm line-and-space pattern was reproduced on the underlying layer, and was found to be 0.25 μm.

Example 7

A total of 100 parts by mass of the alkali-soluble siloxane polymer prepared in SYNTHESIS EXAMPLE 6, 23.1 parts by mass of the photosensitive compound 1, 26.9 parts by mass of the photosensitive compound 4, 1.5 parts by mass of the phenolic compound expressed by the Formula (16), 450.4 parts by mass of 2-heptanone, and 4.1 parts by mass of γ-butyrolactone were mixed and thereby yielded a positive type resist composition (positive type resist composition 7) as a solution. The positive type resist composition 7 was filtrated through a 0.2 μm filter before spin coating.

The positive type resist composition 7 was applied onto the underlying layer by spin coating, was heated at 90° C. for 1 minute, so as to form a resist film of the positive type resist composition 7 having a thickness of 0.55 μm on the underlying layer.

The resist film was exposed, baked, developed and rinsed by the procedure of Example 1, so as to form a resist pattern having a line-and-space pattern.

The cross section of the above-formed resist pattern was observed under an electron microscope. The resolution of the slit was determined at an exposure (500 mJ/cm$^2$), at which a 0.8 μm line-and-space pattern was reproduced on the underlying layer, and was found to be 0.27 μm.

Example 8

The resist properties of the positive type resist composition 3 were compared between immediately after the preparation and after storage at 23° C. for six months and were found that the positive type resist composition 3 exhibited the same sensitivity and resolution as immediately after the preparation even after storage at 23° C. for six months.

As a comparative test, the resist properties of a commercially available positive type resist composition (available from FUJIFILM OLIN Co., Ltd. under the trade name of FH-SP) were compared between immediately after the preparation and after storage at 23° C. for six months and were found that the positive type resist composition exhibited deterioration in sensitivity and resolution after storage at 23° C. for six months as compared with those immediately after the preparation.

A series of coated films 1 μm thick was prepared from the positive type resist compositions 1 to 7, respectively. The i-line transmittances to T (%) of the coated films were determined by calculation according to the equations by the following manner.

Initially, the i-line transmittances of the alkali-soluble siloxane polymers 1 to 6 prepared in SYNTHESIS EXAMPLEs 1 to 6 and the phenolic compound expressed by the Formula (15) were determined and were found to be 100%.

In the relational expression between A and T in the equations, T is a measured value of the i-line transmittance (%) of a coated film 0.55 μm thick, in which the coated film is formed by applying a 2-heptanone solution (solid content: 25% by mass) containing 100 parts by weight of the alkali-soluble siloxane polymer, 1.5 parts by weight of the phenolic compound expressed by the Formula (15), and 50 parts by weight of the photosensitive compound onto a glass substrate by spin coating. The i-line transmittance T (%) of the coated film was actually determined by using a spectrophotometer (available from Hitachi, Ltd. under the trade name of U-3500) with the i-line transmittance of the glass substrate as a reference. The absorbance A of a 1 μm thick resist film prepared by the application of each photosensitive compound was determined by calculation according to the relational expression between A and T based on the measured T. The results are shown in Table 1.

TABLE 1

|  | T (%) | A |
| --- | --- | --- |
| Photosensitive Compound 1 | 51.4 | 1.59 |
| Photosensitive Compound 2 | 60.4 | 1.21 |
| Photosensitive Compound 3 | 40.0 | 2.19 |
| Photosensitive Compound 4 | 55.2 | 1.42 |

Next, a series of coated 1 μm thick films was prepared from the positive type resist compositions 1 to 7 prepared in Examples 1 to 7. The i-line absorbance A' of each of the coated films was determined by calculation according to the relational expression between A and A' in the equations based on the absorbance A of the photosensitive compounds 1 to 4 and the weight ratio W of the photosensitive compound to the total solid contents in the positive type resist composition. The i-line transmittance T' (%) of the 1 μm thick resist film prepared from the tested positive type resist composition can be determined by calculation according to the relational expression between A' and T' in the equations based on the i-line absorbance A'. The results are shown in Table 2.

TABLE 2

| | Photosensitive Compound | | | |
| --- | --- | --- | --- | --- |
| | First Component | W | Second Component | W | T' (%) |
| Examples 1-4 | Photosensitive Compound 1 | 0.188 | Photosensitive Compound 2 | 0.188 | 29.8 |
| Example 5 | Photosensitive Compound 3 | 0.323 | — | — | 19.6 |
| Example 6 | Photosensitive Compound 3 | 0.153 | Photosensitive Compound 4 | 0.178 | 26.0 |
| Example 7 | Photosensitive Compound 1 | 0.153 | Photosensitive Compound 4 | 0.178 | 31.9 |

Example 9

A total of 100 parts by mass of the alkali-soluble siloxane polymer of SYNTHESIS EXAMPLE 2 having silicon atoms directly bonded to hydroxyl group (Si—OH) in a proportion of 8% of total silicon atoms, 60 parts by mass of a photosensitive compound 5 mentioned below, 475.7 parts by mass of 2-heptanone, 4.3 parts by mass of γ-butyrolactone, and 1 part by weight of a surfactant (Poly ethyleneglycol benzyl ether, available from Aoki Oil Industries, Co., Ltd. under the trade name of BLAUNON BA-1; HLB=5.8) was mixed and thereby yielded a positive type resist composition 8 as a solution. The positive type resist composition 8 was filtrated through a 0.2 μm filter before spin coating.

The photosensitive compound 5 was a 1:1 mixture of a condensation product of 1 mole of a phenolic compound expressed by the aforementioned Formula (13) with 2 moles of 1,2-naphthoquinonediazido-5-sulfonyl chloride and a condensation product of 1 mole of a phenolic compound expressed by the aforementioned Formula (14) with 1.8 moles of 1,2-naphthoquinonediazido-5-sulfonyl chloride.

A 5:1:1 (by mass) mixture of an i-line radiation resist (available from Sumitomo Chemical Co., Ltd. under the trade name of SUMIRESIST (registered trademark) PFI-38A9), an epoxy resin (available from Sumitomo Chemical Co., Ltd. under the trade name of SUMI-EPOXY ESCN-195 XL7) and 2-heptanone was prepared; was filtrated through a 0.2 μm filter and thereby yielded a solution for forming an underlying layer. The solution for forming an underlying layer was applied onto a silicon substrate by spin coating at 2000 rpm, was baked on a hot plate at 270° C. for 2 hours, so as to form an underlying layer having a thickness of 1.45 μm on the silicon substrate.

The positive type resist composition 8 was applied to the underlying layer by spin coating, was heated at 90° C. for 1 minute so as to form a resist film 0.55 μm thick on the underlying layer.

The resist film was irradiated with light of 365 nm at an exposure of 600 mJ/cm$^2$ through a halftone reticle of a hole pattern having a hole diameter of 400 nm, a duty ratio of 1:2, and a transmittance of a halftone sifter of 6% using a stepper (available from Nikon Corporation under the trade name of NSR 2005i9C; NA=0.57; sigma=0.40).

The silicon substrate having the exposed resist film was heated at 110° C. for 60 seconds, was cooled to 23° C., was subjected to puddle development in a 2.38% by mass tetramethylammonium hydroxide aqueous solution for 1 minute, was rinsed with water for 15 seconds, so as to form a resist pattern having the hole pattern.

The cross section of the above-formed resist pattern was observed under an electron microscope. A thickness ratio was determined by dividing the thickness of the deepest portion of side lobes by the thickness of the resist film of the positive type resist composition. The result is shown in Table 3.

The addition of the surfactant poly ethyleneglycol benzyl ether prevents the formation of side lobes as compared with the case where the surfactant was not added as in Comparative Test 1 below.

Example 10

A hole pattern was formed by the procedure of Example 9, except that sorbitan trioleate (available from Kanto Kagaku Co., Ltd. under the trade name of SPAN85; HLB=2.1) was used as the surfactant instead of poly ethyleneglycol benzyl ether.

The cross section of the above-formed resist pattern was observed under an electron microscope. A thickness ratio was determined by dividing the thickness of the deepest portion of side lobes by the thickness of the resist film of the positive type resist composition. The result is shown in Table 3.

The addition of the surfactant sorbitan trioleate prevents the formation of side lobes as compared with Comparative Test 1.

Example 11

A hole pattern was formed by the procedure of Example 9, except that sorbitan monostearate (available from Kao Corporation under the trade name of SP-S10; HLB=4.7) was used as the surfactant instead of poly ethyleneglycol benzyl ether.

The cross section of the above-formed resist pattern was observed under an electron microscope. A thickness ratio was determined by dividing the thickness of the deepest portion of side lobes by the thickness of the resist film of the positive type resist composition. The result is shown in Table 3.

The addition of the surfactant sorbitan monostearate prevents the formation of side lobes as compared with Comparative Test 1.

Example 12

A hole pattern was formed by the procedure of Example 9, except that a polycarboxylate surfactant (available from Kao Corporation under the trade name of DEMOL EP) was used as the surfactant instead of poly ethyleneglycol benzyl ether.

The cross section of the above-formed resist pattern was observed under an electron microscope. A thickness ratio was determined by dividing the thickness of the deepest portion of side lobes by the thickness of the resist film of the positive type resist composition. The result is shown in Table 3.

The addition of the polycarboxylate surfactant DEMOL EP prevents the formation of side lobes as compared with Comparative Test 1.

Comparative Test 1

A hole pattern was formed by the procedure of Example 9, except that the surfactant was not used.

The cross section of the above-formed resist pattern was observed under an electron microscope. A thickness ratio was determined by dividing the thickness of the deepest portion of side lobes by the thickness of the resist film of the positive type resist composition. The result is shown in Table 3.

Example 13

A hole pattern was formed by the procedure of Example 9, except that the alkali-soluble siloxane polymer of SYNTHESIS EXAMPLE 7 having silicon atoms directly bonded to hydroxyl group (Si—OH) in a proportion of 12% of total silicon atoms was used instead of the alkali-soluble siloxane polymer of SYNTHESIS EXAMPLE 2 having silicon atoms directly bonded to hydroxyl group (Si—H) in a proportion of 8% of total silicon atoms.

The cross section of the above-formed resist pattern was observed under an electron microscope. A thickness ratio was determined by dividing the thickness of the deepest portion of side lobes by the thickness of the resist film of the positive type resist composition. The result is shown in Table 3.

The addition of the surfactant poly ethyleneglycol benzyl ether prevents the formation of side lobes as compared with Comparative Test 2.

Example 14

A hole pattern was formed by the procedure of Example 10, except that the alkali-soluble siloxane polymer of SYNTHESIS EXAMPLE 7 having silicon atoms directly bonded to hydroxyl group (Si—OH) in a proportion of 12% of total silicon atoms was used instead of the alkali-soluble siloxane polymer of SYNTHESIS EXAMPLE 2 having silicon atoms directly bonded to hydroxyl group (Si—OH) in a proportion of 8% of total silicon atoms.

The cross section of the above-formed resist pattern was observed under an electron microscope. A thickness ratio was determined by dividing the thickness of the deepest portion of side lobes by the thickness of the resist film of the positive type resist composition. The result is shown in Table 3.

The addition of the surfactant, poly ethyleneglycol benzyl ether, prevents the formation of side lobes as compared with Comparative Test 2.

Example 15

A hole pattern was formed by the procedure of Example 11, except that the alkali-soluble siloxane polymer of SYNTHESIS EXAMPLE 7 having silicon atoms directly bonded to hydroxyl group (Si—OH) in a proportion of 12% of total silicon atoms was used instead of the alkali-soluble siloxane polymer of SYNTHESIS EXAMPLE 2 having silicon atoms directly bonded to hydroxyl group (Si—OH) in a proportion of 8% of total silicon atoms.

The cross section of the above-formed resist pattern was observed under an electron microscope. A thickness ratio was determined by dividing the thickness of the deepest portion of side lobes by the thickness of the resist film of the positive type resist composition. The result is shown in Table 3.

The addition of the surfactant sorbitan monostearate prevents the formation of side lobes as compared with Comparative Test 2.

Comparative Test 2

A hole pattern was formed by the procedure of Example 13, except that the surfactant was not used.

The cross section of the above-formed resist pattern was observed under an electron microscope. A thickness ratio was determined by dividing the thickness of the deepest portion of side lobes by the thickness of the resist film of the positive type resist composition. The result is shown in Table 3.

Example 16

A hole pattern was formed by the procedure of Example 9, except that the alkali-soluble siloxane polymer of SYNTHESIS EXAMPLE 4 having silicon atoms directly bonded to hydroxyl group (Si—OH) in a proportion of 19% of total silicon atoms was used instead of the alkali-soluble siloxane polymer of SYNTHESIS EXAMPLE 2 having silicon atoms directly bonded to hydroxyl group (Si—OH) in a proportion of 8% of total silicon atoms and that the exposure was changed to 400 mJ/cm$^2$.

The cross section of the above-formed resist pattern was observed under an electron microscope. A thickness ratio was determined by dividing the thickness of the deepest portion of side lobes by the thickness of the resist film of the positive type resist composition. The result is shown in Table 3.

The addition of the surfactant poly ethyleneglycol benzyl ether prevents the formation of side lobes as compared with Comparative Test 3.

Comparative Test 3

A hole pattern was formed by the procedure of Example 16, except that the surfactant was not used.

The cross section of the above-formed resist pattern was observed under an electron microscope. A thickness ratio was determined by dividing the thickness of the deepest portion of side lobes by the thickness of the resist film of the positive type resist composition. The result is shown in Table 3.

TABLE 3

| | Resin | Surfactant | Thickness ratio* |
|---|---|---|---|
| Example 9 | SYNTHESIS EXAMPLE 2 | Poly ethyleneglycol benzyl ether | 0.80 |
| Example 10 | SYNTHESIS EXAMPLE 2 | Sorbitan trioleate | 0.78 |
| Example 11 | SYNTHESIS EXAMPLE 2 | Sorbitan monostearate | 0.82 |
| Example 12 | SYNTHESIS EXAMPLE 2 | DEMOL EP | 0.92 |
| Comparative Test 1 | SYNTHESIS EXAMPLE 2 | not added | 0.70 |
| Example 13 | SYNTHESIS EXAMPLE 7 | Poly ethyleneglycol benzyl ether | 0.88 |
| Example 14 | SYNTHESIS EXAMPLE 7 | Sorbitan trioleate | 0.89 |
| Example 15 | SYNTHESIS EXAMPLE 7 | Sorbitan monostearate | 0.86 |
| Comparative Test 2 | SYNTHESIS EXAMPLE 7 | not added | 0.70 |
| Example 16 | SYNTHESIS EXAMPLE 4 | Poly ethyleneglycol benzyl ether | 0.73 |
| Comparative Test 3 | SYNTHESIS EXAMPLE 4 | not added | 0.68 |

*Thickness ratio is a value obtained by dividing the thickness of the deepest portion of side lobes by the thickness of the resist layer The results shown in Table 3 obviously show that, in each cases of the positive type resist composition of Examples 9 to 16, in which particular surfactants are added, the thickness ratio at the portions of side lobes became larger, compared with each cases of the positive type resist compositions of COMPARATIVE Tests 1 to 3, in which the particular surfactants are added. Therefore, it is clear that the side lobes were effectively prevented.

Example 17

FIGS. 1A to 1D and 2E to 2G show processes for the formation of a resist pattern using the positive type resist composition of the present invention as an upper layer in the two-layer resist process; each of which is a sectional view taken along with lines in a direction perpendicular to the line in a line-and-space (L&S) pattern.

Figure 1B:
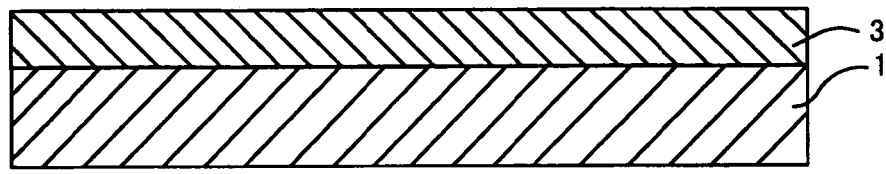

With reference to FIG. 1A, a silicon substrate 1 was prepared as a substrate. With reference to FIG. 1B, a first resist layer 3 was formed on the silicon substrate 1 by spin coating using a positive resist sensitive to far-ultraviolet rays (available from Zeon Corporation under the trade name of ZEP 7000B). The first resist layer 3 was heated on a hot plate at 180° C. for 90 seconds. The heated first resist layer 3 had a thickness of about 550 nm. To improve adhesion between the silicon substrate 1 and the first resist layer 3, pretreatments may carried out to make the surface of the silicon substrate 1 hydrophobic before the formation of the first resist layer 3. In the present example, this pretreatment was performed in the following manner. Before the formation of the first resist layer 3, the silicon substrate 1 was heated on a hot plate at 200° C. for 100 seconds and was then exposed to a vapor of hexamethyldisilazane at 100° C. for 30 seconds.

Figure 1C:
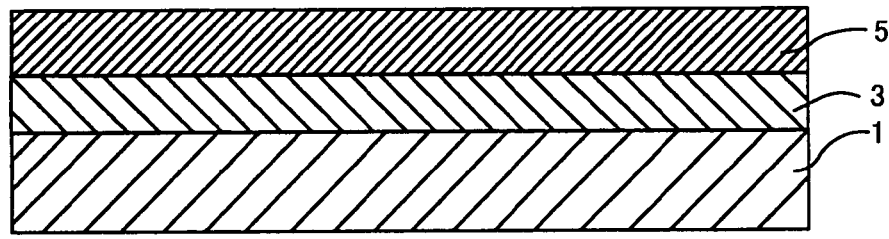
Figure 1D:
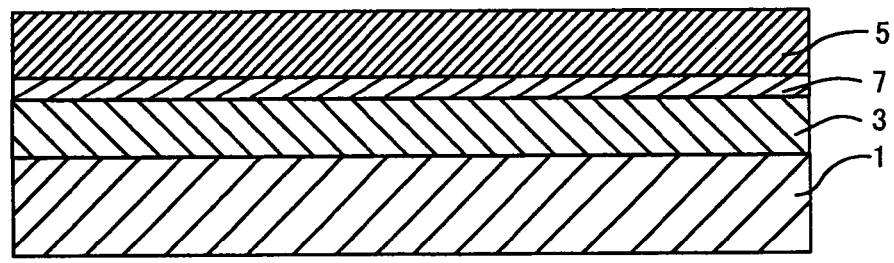

Next, with reference to FIG. 1C, a second resist layer 5 was formed on the first resist layer 3 using the positive type resist composition of the present invention sensitive to ultraviolet rays (i-line radiation). The second resist layer 5 was then heated on a hot plate at 90° C. for 90 seconds. The heated second resist layer 5 had a thickness of about 1500 nm. Upon heating of the second resist layer 5, a mixing layer 7 was formed on the interface between the first resist layer 3 and the second resist layer 5 due to mutual heat diffusion between the two resist layers, as shown in FIG. 1D. The thickness of the mixing layer 7 was unable to be actually measured, but is considered to be about several ten nanometers.

Next, the second resist layer 5 was selectively exposed to i-line radiation using a photo mask to form a line-and-space (L&S) pattern. More specifically, with reference to FIG. 2E, i-line radiation (wavelength: 365 nm) emitted from a high-pressure mercury lamp was irradiated to the second resist layer 5 through a photo mask 9 having a pattern corresponding to a desired line-and-space (L&S) pattern and also having a masking part 9a.

Figure 2E:
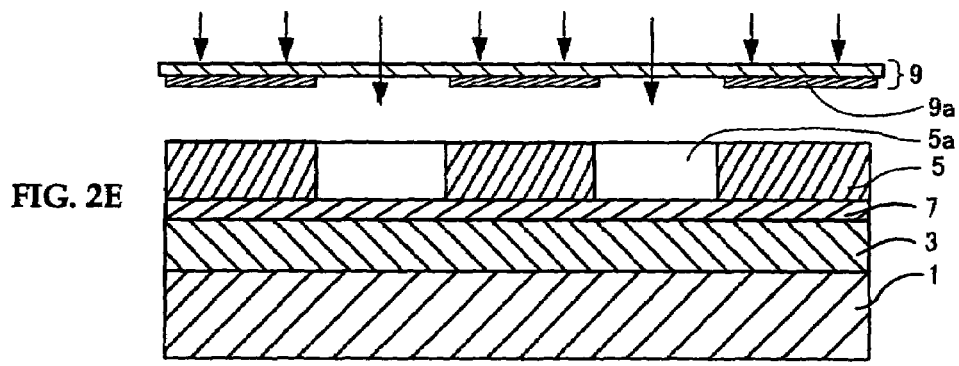
FIGS. 2E, 2F and 2G show one example of a process for the formation of a resist pattern using the positive type resist composition of the present invention as an upper layer in the two-layer resist process.
Figure 2F:
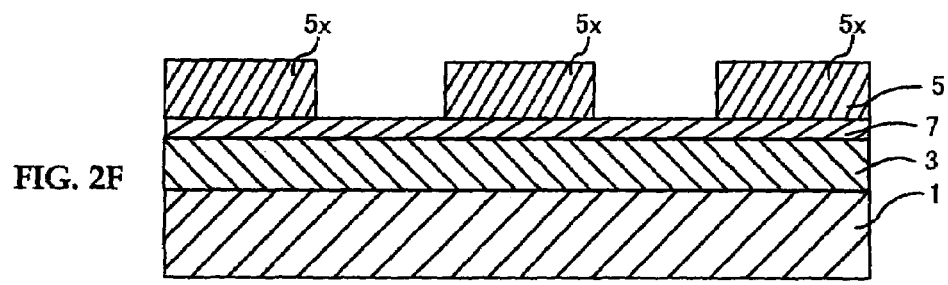

The exposed article was post-exposure baked by heating on a hot plate at 110° C. for 90 seconds and was left to stand on a hot plate to cool to room temperature. The article was subjected to puddle developing in a developer solution (available from Tokyo Ohka Kogyo Co., Ltd. under the trade name of NMD-3; concentration: 2.38% by mass) and was rinsed with pure water. The article was then heated on a hot plate at 120° C. for 90 seconds to evaporate water. By these procedures, the second resist layer 5 was patterned, so as to form a pattern 5x, where exposed portions 5a in the second resist layer 5 exposed to i-line radiation had been removed as shown in FIG. 2F.

Figure 2G:
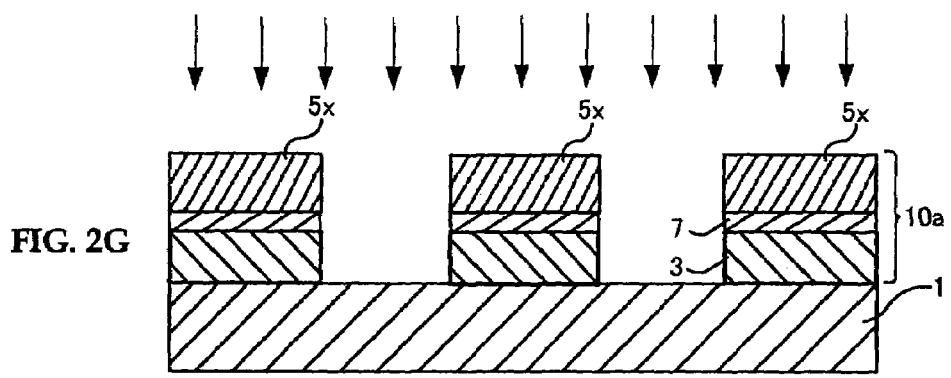

With reference to FIG. 2G, the article was etched using oxygen plasma. The pattern 5x in the second resist layer 5 had excellent oxygen plasma resistance and was thereby not etched. In contrast, the mixing layer 7 and the first resist layer 3 were etched, the pattern 5x in the second resist layer 5 was transferred to the mixing layer 7 and the first resist layer, so as to form a multilayer pattern 10a having the same shape as the pattern 5x.

Example 18

Figure 3:
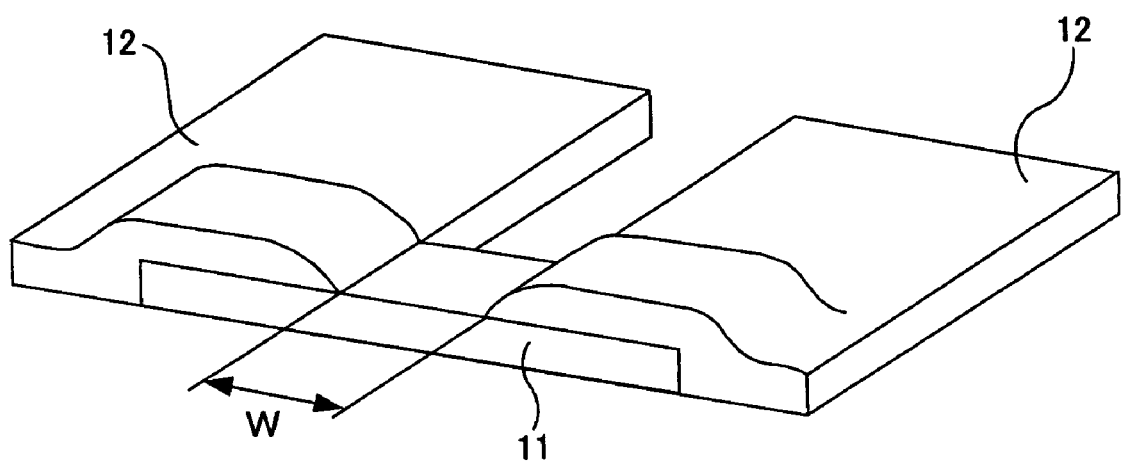
FIG. 3 is a schematic explanatory view showing one example of a magnetoresistive (MR) element in a magnetic head (magnetoresistive head, MR head)
Figure 4A:
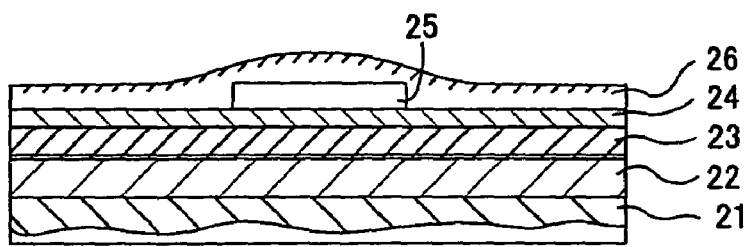
FIGS. 4A, 4B, and 4C schematically show one example of a process for manufacturing the MR element shown in FIG. 3.
Figure 4B:
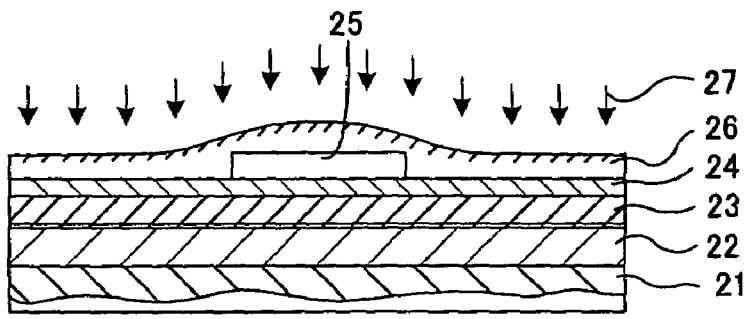
Figure 4C:
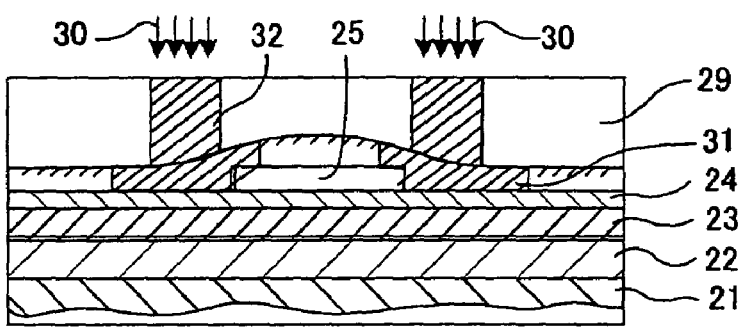

With reference to FIG. 3, an MR element 11 was manufactured in a terminal 12 of a magnetic head (an MR head) in the following manner. Initially, with reference to FIG. 4A, a substrate was prepared. The substrate includes a support 21, an alumina layer 22 disposed on the support 21, a lower shield layer 23 made of NiFe disposed on the alumina layer 22, a lower gap layer 24 made of alumina disposed on the lower shield layer 23, and an MR pattern 25 on the lower gap layer 24. A first resist layer 26 was then formed on the lower gap layer 24 and the MR pattern 25 of the substrate. Next, with reference to FIG. 4B, the entire surface of the substrate having the first resist layer 26 was irradiated with monochromatic light 27 to modify its surface layer to thereby prevent mixing with a second resist layer to be formed thereon. With reference to FIG. 4C, a second resist layer 29 was formed on the first resist layer 26 having the modified surface layer and was selectively exposed to i-line radiation 30 through a photo mask having a desired mask pattern. FIG. 4C illustrates this stage before removing exposed portions 31 and 32. After exposure, the article was baked and was developed.

Figure 5D:
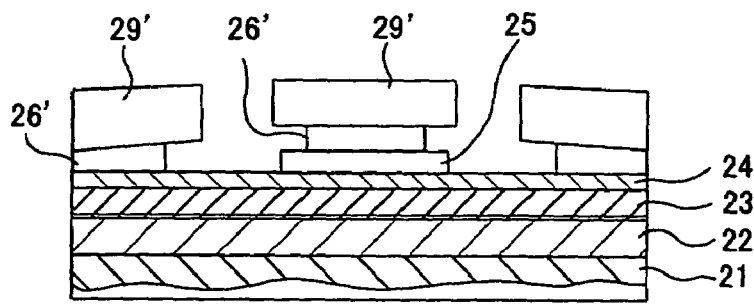
FIGS. 5D, 5E, 5F and 5G schematically show one example of a process for manufacturing the MR element shown in FIG. 3.
Figure 5E:
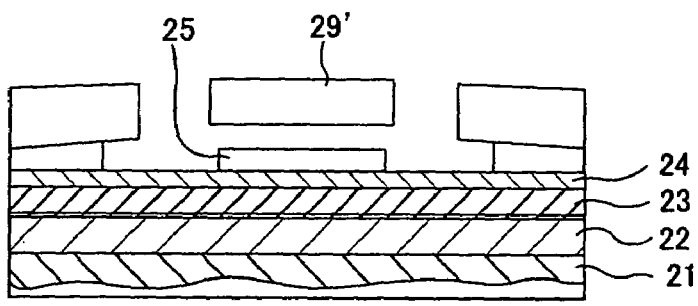
Figure 5F:
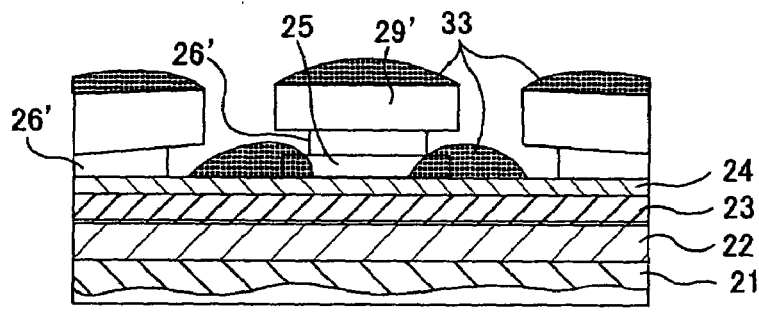
Figure 5G:
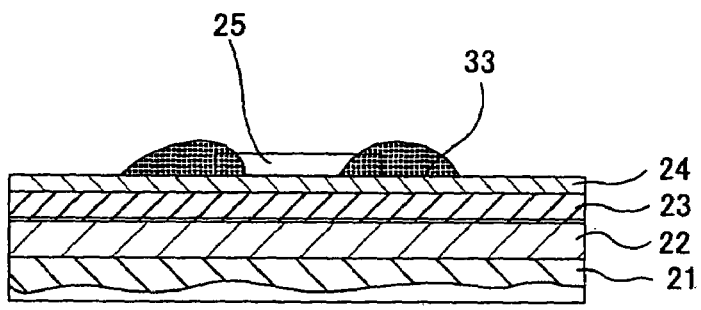

With reference to FIG. 5D, a resist pattern was thus formed having a pattern 26', which is derived from the first resist layer 26, edged into below a resist pattern 29' derived from the second resist layer 29. Alternatively, the resist pattern may have a hollow portion between the pattern 29' and the MR element 25, as shown in FIG. 5E. Next, with reference to FIG. 5F, a film of a terminal forming material 33 was formed on the surface of the substrate having the above-formed two-layer resist pattern. Thereafter, the two-layer resist pattern was dissolved using a developer solution and was removed by lift-off. Thus, a pattern derived from the terminal forming material 33 was formed as shown in FIG. 5G in areas where the two-layer resist pattern had not been formed. The MR pattern 25 in FIG. 5G corresponds to the MR element 11 in FIG. 3, and the pattern derived from the terminal forming material 33 corresponds to the terminal 12 in FIG. 3.

Figure 6A:
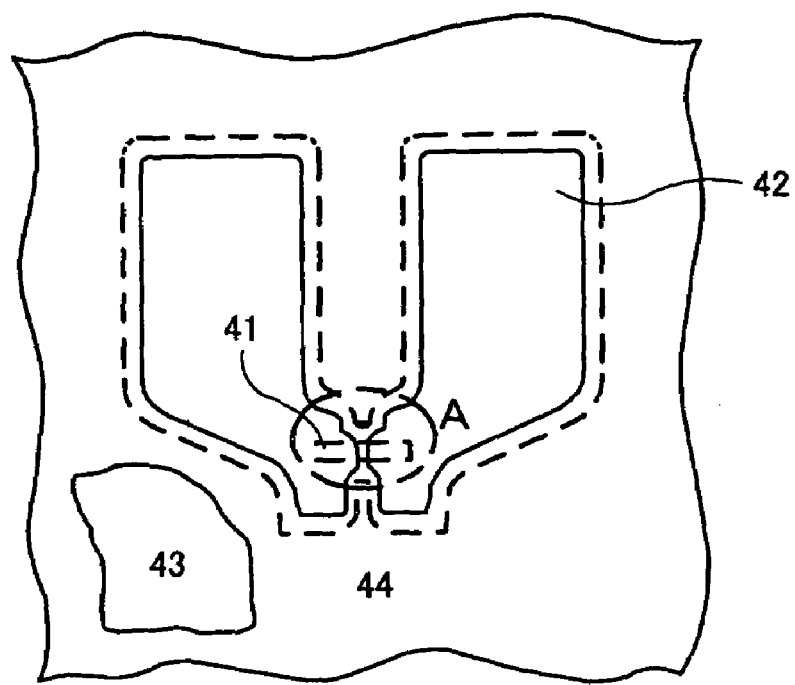
FIGS. 6A and 6B are a plan view and an enlarged view, respectively, which show one example of a terminal to be connected to an MR element formed by using a two-layer resist having a first resist layer and a second resist layer.
Figure 6B:
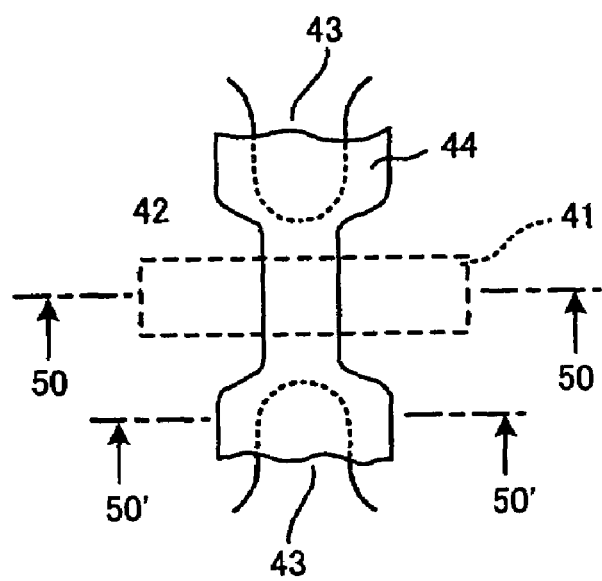
Figure 7A:
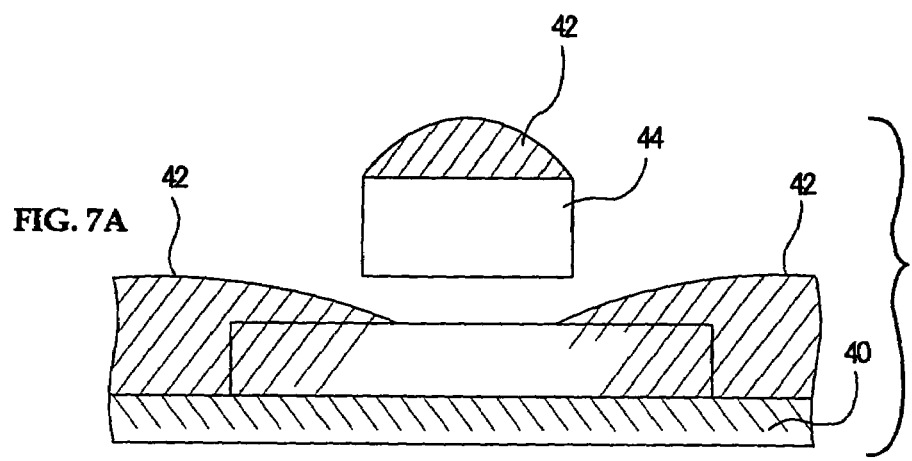
FIGS. 7A and 7B are sectional views cut at the lines 50-50 and 50'-50' in FIG. 6B.
Figure 7B:
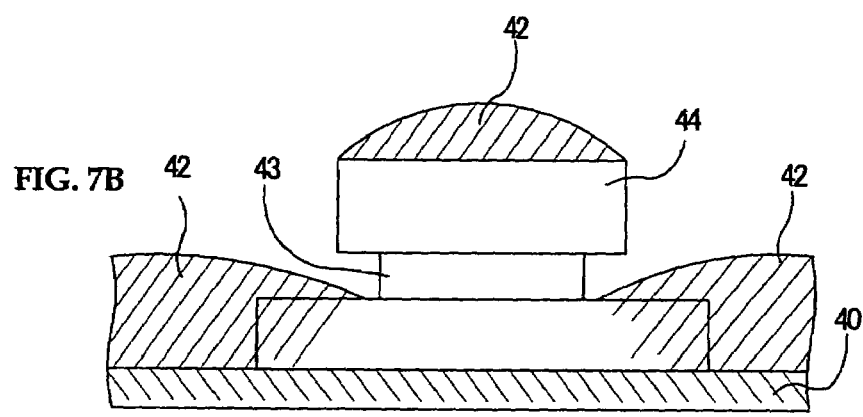

Next, a hollow-part lift off process will be illustrated with reference to FIGS. 6A, 6B, 7A and 7B. FIG. 6A is a plan view of a terminal 42 to be connected to an MR element 41 formed by using a two-layer resist comprising a first resist layer 43 and a second resist layer 44. The first resist layer 43 edges into the lower part of the second resist layer 44, and the outline thereof is indicated by a dashed line. FIG. 6B is an enlarged view of the MR element 41 surrounded by the circle A in FIG. 6A. In FIG. 6B, the outline of the first resist layer 43 below the second resist layer 44 is shown by a dashed line. Above the MR element 41, the second resist layer 44 alone is present, and this portion between the second resist layer 44 and the MR element 41 is a hollow portion. FIG. 7A is a sectional view taken along the line 50-50 in FIG. 6B, in which the hollow part is disposed between the MR element 41 and the second resist layer 44. FIG. 7B is a sectional view taken along the line 50'-50' in FIG. 6B, m which the second resist layer 44 is disposed on the first resist layer 43 on a substrate 40. In FIGS. 7A and 7B, a film 42 of a terminal material on the second resist layer 44 will be removed with the first resist layer 43 and the second resist layer 44 by a subsequent lift off process.

Figure 8A:
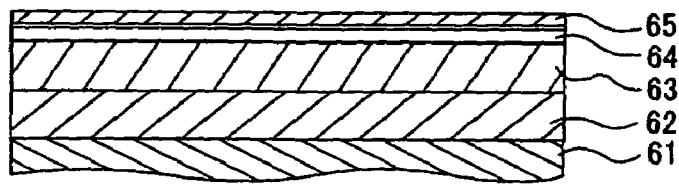
FIGS. 8A, 8B, 8C, 8D, and 8E are views which show one example of a process for manufacturing an MR element of a magnetic head (MR head) by a lift-off process.
Figure 8B:
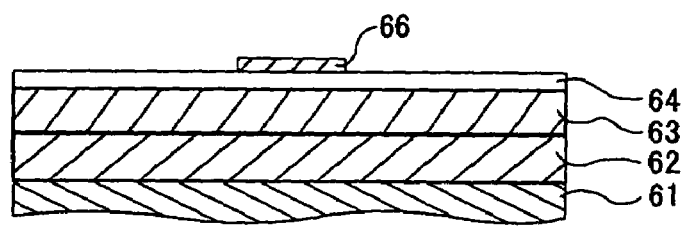
Figure 8C:
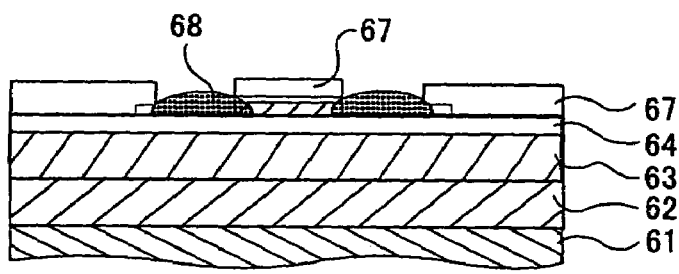
Figure 8D:
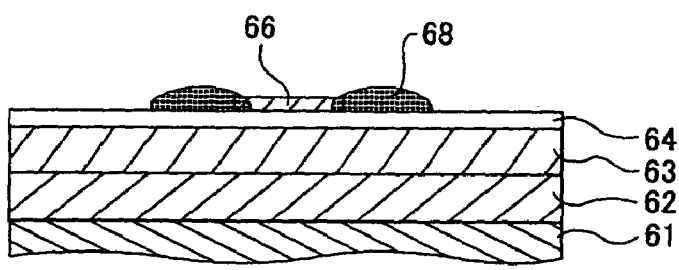
Figure 8E:
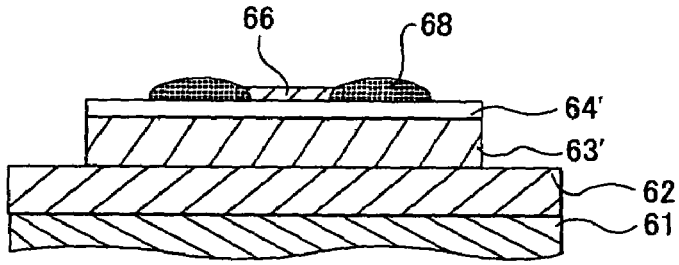
Figure 9A:
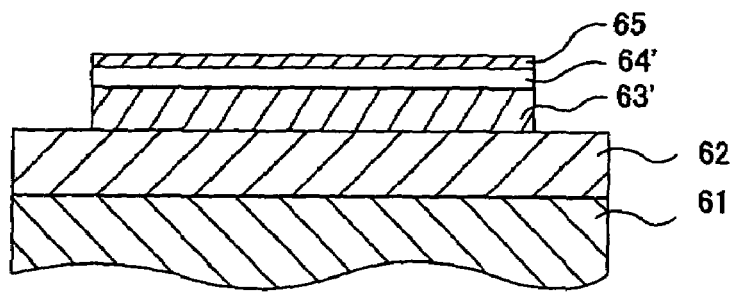
FIGS. 9A, 9B and 9C are views which show examples of processes for manufacturing an MR element of a magnetic head (MR head) by a lift-off process.
Figure 9B:
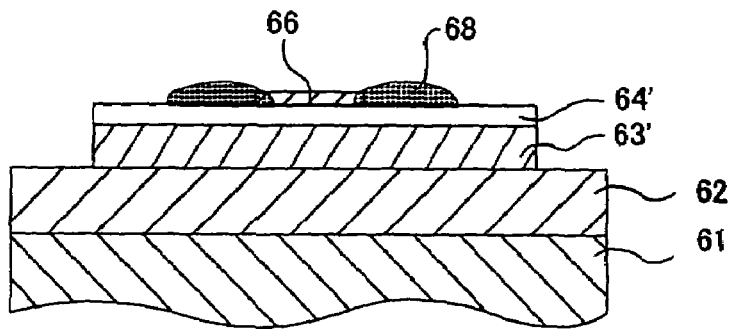
Figure 9C:
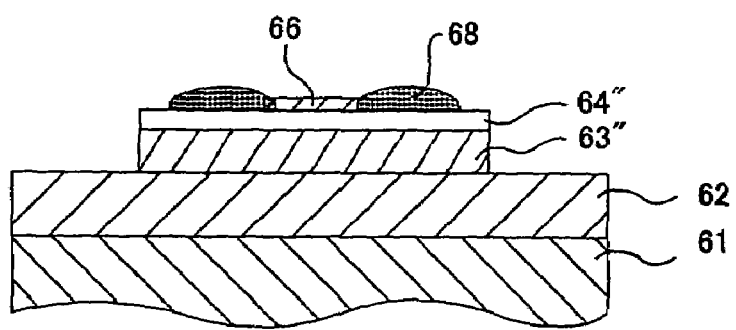

Next, manufacturing an MR element for a magnetic head (an MR head) by a lift off process will be described. With reference to FIG. 8A, a substrate was prepared. The substrate includes a support 61, an alumina layer 62 disposed on the support. 61, a lower shield layer 63 made of NiFe disposed on the alumina layer 62, a lower gap layer 64 made of alumina disposed on the lower shield layer 63, and an MR film 65 for the formation of an MR element disposed on the lower gap layer 64. With reference to FIG. 6B, the MR film 65 on the surface of the substrate was patterned and thereby yielded an MR element 66. With reference to FIG. 8C, a terminal 68 was formed on the lower gap layer 64 of the substrate using a mask pattern 67. With reference to FIG. 8D, the mask pattern 67 was removed by lift-off. With reference to FIG. 8E, the lower shield layer 63 and the lower gap layer 64 were patterned by ion milling and thereby yielded a lower shield 63' and a lower gap 64'. Alternatively, the lower shield and the lower gap can also be formed in the following manner. With reference to FIG. 9A, the substrate is patterned and thereby yield a lower shield 63' and a lower gap 64'. With reference to FIG. 9B, an MR element 66 is formed and a terminal 68 is formed by lift off. Then, with reference to FIG. 9C, the lower shield 63' and the lower gap 64' are further patterned and thereby yield a lower shield 63" and a lower gap 64" each having an intended shape.

Figure 10A:
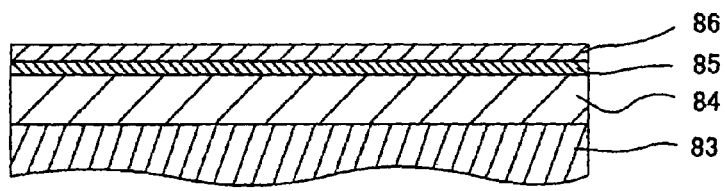
FIGS. 10A, 10B, 10C, 10D, 11E, 11F, and 11G are views which show examples of processes for manufacturing an MR element of a magnetic head (MR head) by a milling process.
Figure 10B:
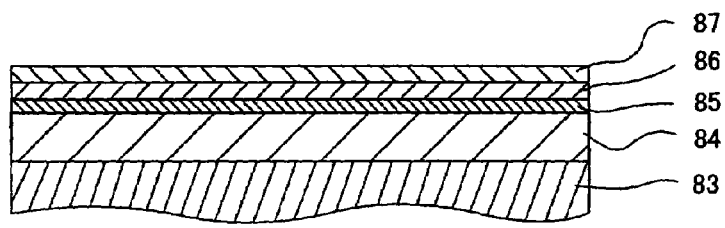
Figure 10C:
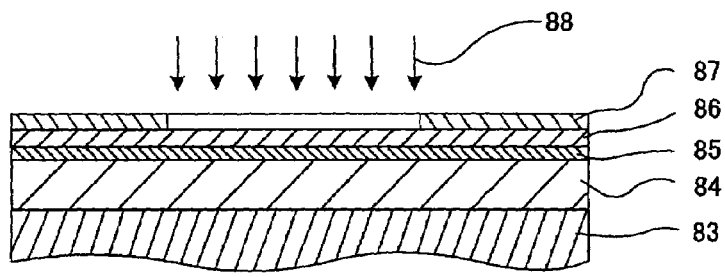
Figure 10D:
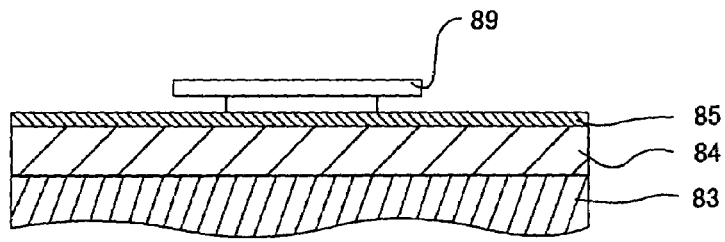
Figure 11E:
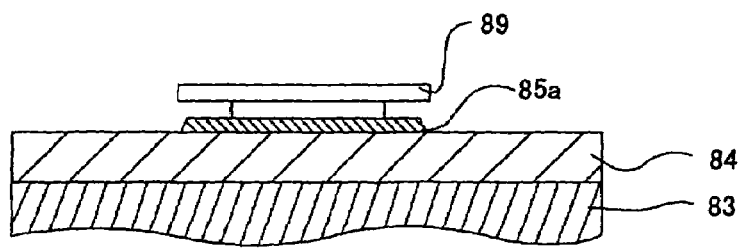
Figure 11F:
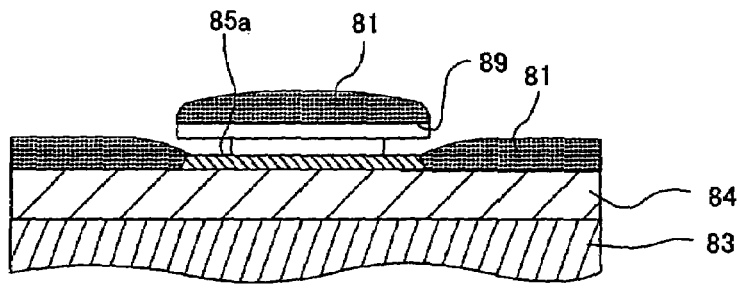
Figure 11G:
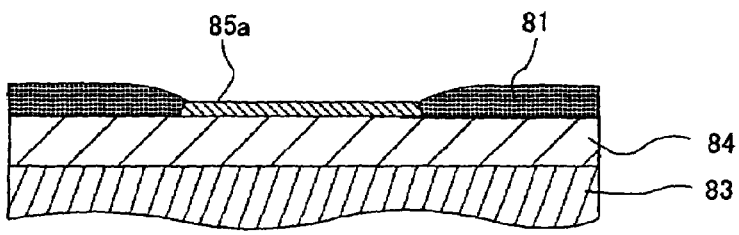

Next, another example of manufacturing a magnetic head will be illustrated with reference to FIGS. 10A to 10D and 11E to 11G. With reference to FIG. 10A, a substrate was prepared. The substrate includes a support (not shown), an alumina layer (not shown), a lower shield layer 83 made of NiFe on the alumina layer, a lower gap layer 84 made of alumina on the lower shield layer 83, and an MR film 85 for the formation of an MR element on the lower gap layer 84. Polymethylglutarimide (available from Nippon MacDermid Co., Ltd.) as a resist material for a first resist layer was applied on the surface of the substrate by spin coating to a thickness of 0.3 μm, was baked at 180° C. for 2 minutes so as to form a first resist layer 86. The substrate was moved onto a hot plane in a surface treatment chamber, and the entire surface thereof was irradiated with light having a wavelength of 172 nm ($Xe_2$ excimer laser radiation) at an irradiation distance of 1 mm for 20 seconds. The irradiated substrate was then moved again to a coater cup, the positive type resist composition of the present invention was dropped to the rotating substrate by spin coating to a thickness of 2.0 nm, was baked at 110° C. for 2 minutes so as to form a second resist layer 87 on the first resist layer 86. With reference to FIG. 10C, the substrate was exposed to i-line radiation 88 using an i-line stepper through a set mask pattern and was developed using a 2.38% by mass tetramethylammonium hydroxide aqueous solution. In this procedure, the first resist layer 86 and the second resist layer 87 were together developed, so as to form a two-layer resist pattern 89 shown in FIG. 10D. An optical microscopic observation of the two-layer resist pattern 89 revealed that the lower layer was smaller 1.0 μm than the upper layer. With reference to FIG. 11E, the MR film 85 was patterned by ion milling using the two-layer resist pattern 89 as a mask and thereby yielded an MR element 85a. With reference to FIG. 11F, a metal film 81 as a terminal was formed by sputtering, the two-layer resist pattern 89 was stripped using a resist stripper (available from FUJIFILM OLIN Co., Ltd. under the trade name of MS-2001), the article was washed with ethanol, was dried and thereby yielded a terminal 81.

Example 19

Figure 12A:
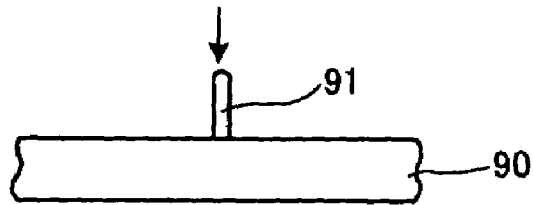
FIGS. 12A, 12B, 12C, 12D, 12E, and 12F are views which show examples of processes for manufacturing a T gate electrode of a high electron mobility transistor (HEMT)
Figure 12B:
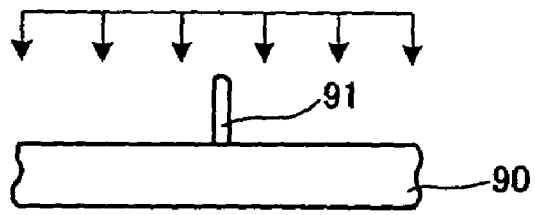
Figure 12C:
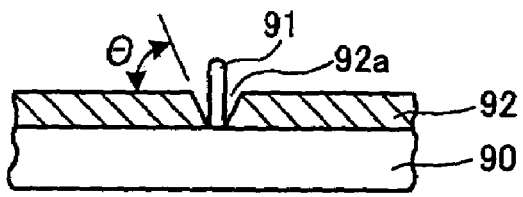
Figure 12D:
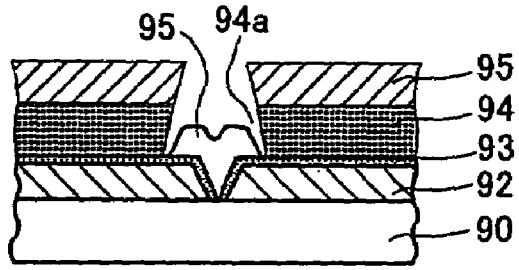
Figure 12E:
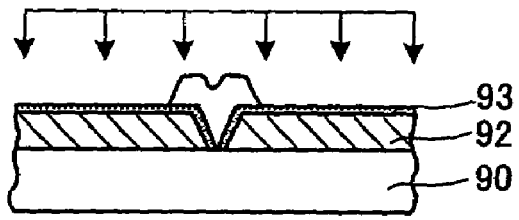
Figure 12F:
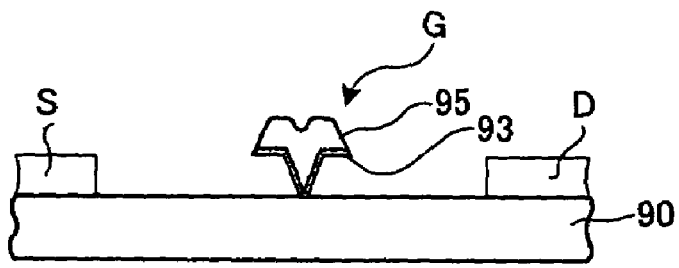

An example of manufacturing a T gate electrode of a HEMT will be illustrated with reference to processes shown in FIGS. 12A to 12F. Initially, a GaAs substrate 90 was prepared. The GaAs substrate 90 includes a buffer-epitaxial layer, an epitaxial layer for supplying secondary electrons, and a cap-epitaxial layer disposed in this order in its surface layer. With reference to FIG. 12A, a first negative electron beam resist (available from Shipley Far East Ltd. under the trade name of SAL-601) was applied onto the GaAs substrate 90 and was baked. The first resist was exposed to electron beams for the formation of a resist pattern 91 in the form of an isolated line having a gate length of 0.1 μm and a thickness of 1 μm. The irradiated first resist was developed, was washed with water, was dried, so as to form the resist pattern 91 in the form of an isolated line having a gate length of 0.1 μm and a thickness of 1 μm. With reference to FIG. 12B, the resist pattern 91 was treated with oxygen plasma, for example, at a power of 100 W and at an oxygen flow rate of 200 sccm for 30 seconds to control its wettability. With reference to FIG. 12C, a spin-on-glass coating composition for forming of an insulating film (available from Tokyo Ohka Kogyo Co., Ltd. under the trade name of OCD) was applied to the GaAs substrate 90 to a thickness of 0.5 μm, was baked at 110° C. for 2 hours, so as to form an insulating film 92. Subsequently, the isolated-line resist pattern 91 was removed using an $O_2$ asher, so as to form an opening 92a having a tapered profile (tapered angle: 60 degrees) in cross section in the insulating film 92. With reference to FIG. 12D, a film of TiW 0.1 μm thick was deposited by sputtering on the entire surface of the GaAs substrate 90, so as to form a first metal wiring layer 93 for a lower gate electrode. The positive type resist composition of the present invention was then applied to the first metal wiring layer 93 to a thickness of 0.6 μm, was baked, so as to form a resist layer 94. The resist layer 94 was then exposed to light, was developed, was washed with water, was dried, so as to form an opening 94a having a diameter larger than the opening 92a, having a reverse-tapered profile in cross section and having a gate length of 0.5 μm. Films of Ti and Al, each of which has a thickness of 0.5 μm, were deposited in this order on the entire surface of the GaAs substrate 90 by vapor deposition, so as to form a second metal wiring layer 95 for an upper gate electrode. With reference to FIG. 12E, an unnecessary portion of the second metal wiring layer 95 and the resist layer 94 under the second metal wiring layer 95 was removed by lift-off using an organic solvent, except for the second metal wiring layer 95 formed within the opening 92a. With reference to FIG. 12F, an unnecessary portion of the first metal wiring layer 93 was removed by reactive ion etching (RIE) using the remained second metal wiring layer 95 as a mask, except the first metal wiring layer 93 formed under the second metal wiring layer 95. The insulating film 92 under the removed first metal wiring layer 93 was then removed using $NH_4F$ solution so as to manufacture a fine T gate electrode G.

Example 20

Figure 13A:
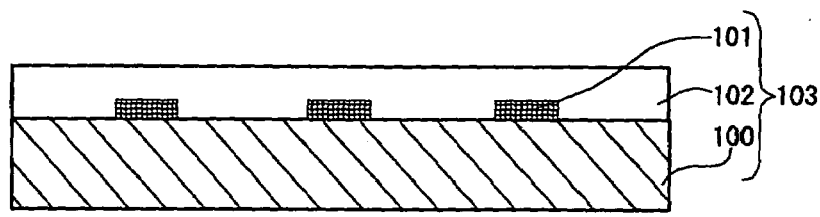
FIGS. 13A, 13B, 13C, 13D, 14E, 14F and 14G show examples of processes for the formation of barrier ribs in a plasma display panel.
Figure 13B:
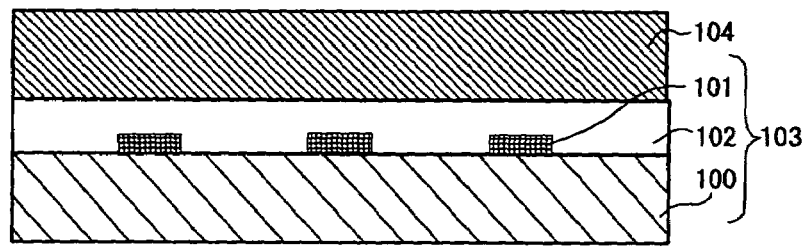
Figure 13C:
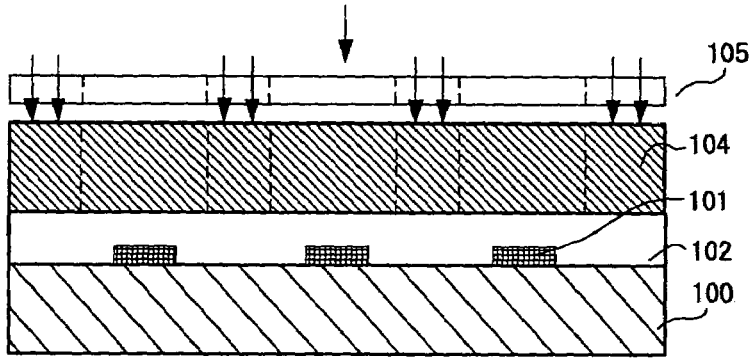
Figure 13D:
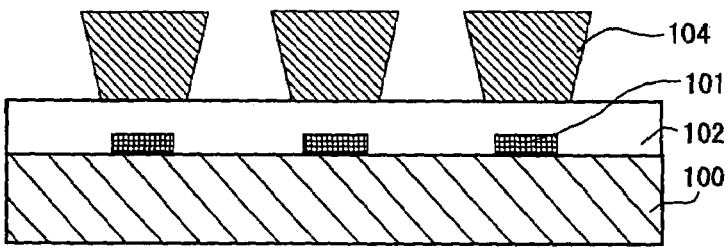
Figure 14E:
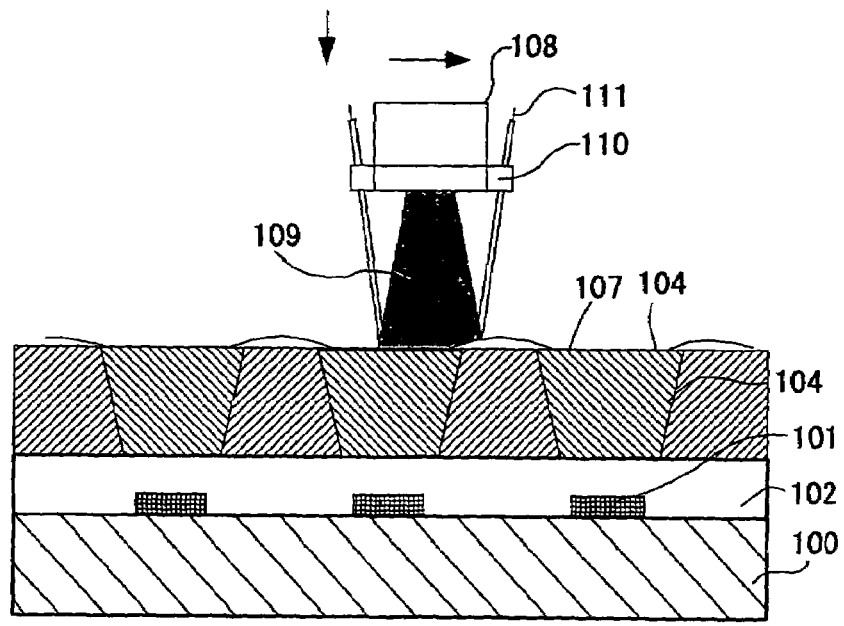
Figure 14F:
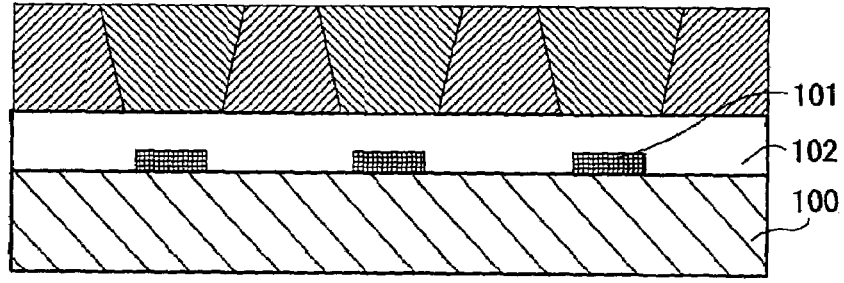
Figure 14G:
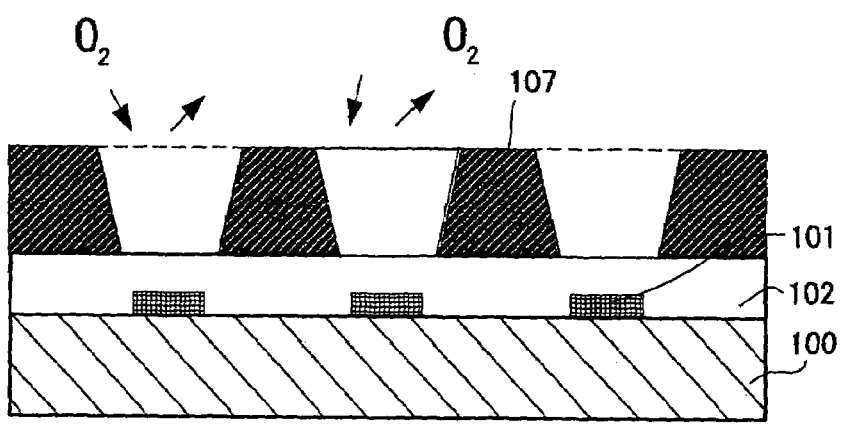

Next, a process for forming barrier ribs in a plasma display will be illustrated with reference to FIGS. 13A to 13D and 14E to 14G showing individual steps. With reference to FIG. 13A, address electrodes 101 were formed on a glass substrate 100. Examples of the glass substrate 100 include soda-lime glass or high-grade distortion-free glass about 2.8 mm thick. After forming the address electrodes 101, an underlying layer 102 made of, for example, dielectric glass was formed. Hereinafter, the glass substrate 100, the address electrodes 101, and the underlying layer 102 may be generically referred to as a substrate 103 for convenience. With reference to FIG. 13B, the positive type resist composition of the present invention was applied to the substrate 103 to a thickness of 120 μm, so as to form a photosensitive coat layer 104. With reference to FIG. 13C, i-line radiation was applied to the photosensitive coat layer 104 through a photo mask 105 having a set pattern width and pitch. The exposure herein was controlled to be optimum depending on the pattern width and pitch of the photo mask 105. With reference to FIG. 13D, the exposed photosensitive coat layer 104 was developed with a 1% by mass sodium carbonate aqueous solution for about 3 minutes and was washed with water. With reference to FIG. 14E, a barrier rib material was plasma-sprayed into trenches in the photosensitive coat layer 104 by plasma spray coating from above the substrate 103, so as to form a plasma-splayed film 107. More specifically, a plasma spray torch 108 had a cooling gas port 110, and a cooling gas 111 was sprayed to the substrate 103 upon spraying of a plasma jet 109. As the cooling gas 111, nitrogen gas was used. By action of the cooling gas 111, damage to the photosensitive coat layer 104 due to heat upon plasma spraying was mitigated, and barrier ribs could be formed with high precision. In the plasma spraying process, the sprayed film 107 was mainly deposited within the trenches of the photosensitive coat layer 104 and was further deposited to build up to the surface of the photosensitive coat layer 104. However, the sprayed film was little deposited or attached on the photosensitive coat layer 104 surrounding the trenches. With reference to FIG. 14F, portions of the sprayed film 107 built up over the surface of the photosensitive coat layer 104 were removed mainly by polishing to flatten the surface of the sprayed film 107 deposited within the trenches of the photosensitive coat layer 104. With reference to FIG. 14G, the substrate 103 was baked in an atmosphere containing oxygen at high temperatures. Thus, the organic photosensitive resin was removed as gas such as carbon dioxide gas by burning to thereby yield barrier ribs 107 having set dimensions on the substrate 103. Thus, barrier ribs in a plasma display were formed.

Figure 15:
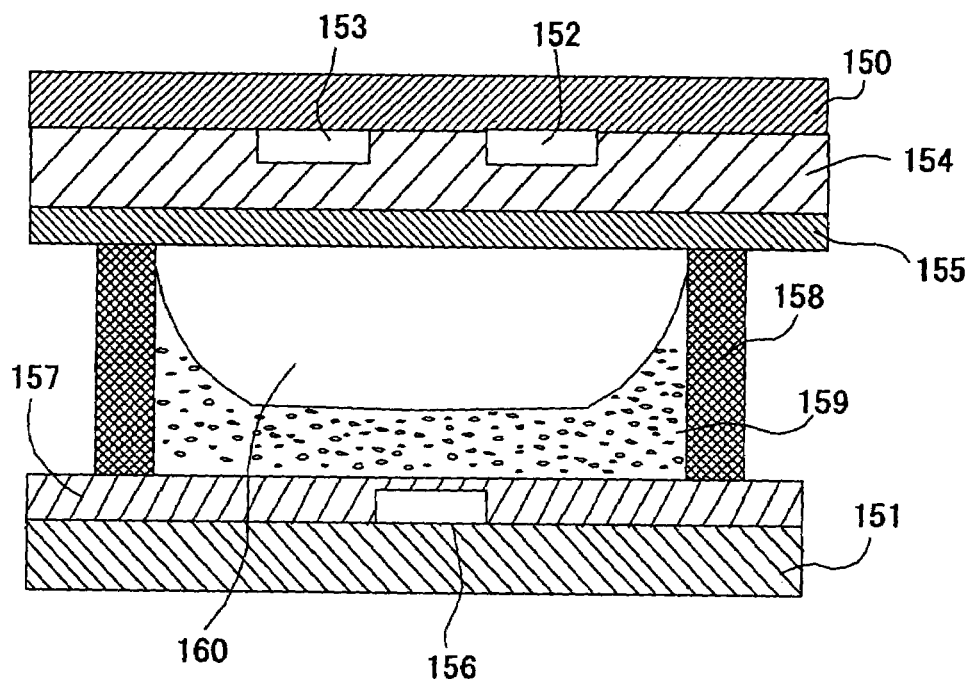
FIG. 15 is a schematic diagram of one example of a plasma display panel.

With reference to FIG. 15, the plasma display panel according to the present example has a front substrate 150 and a rear substrate 151 facing each other. On the front substrate 150, display electrodes 152 and 153, a dielectric layer 154, and a MgO dielectric-protecting layer 155 are disposed in this order. On the rear substrate 151, an address electrode 156, a dielectric layer 157, and a barrier rib 158 are disposed in this order. A phosphor layer 159 is arranged on side walls of the barrier rib 158. A discharge gas 160 is encapsulated at a set pressure in a space between the front substrate 150 and the rear substrate 151. The discharge gas 160 is subjected to electric discharge between the display electrodes 152 and 153 to thereby emit ultraviolet rays, and the ultraviolet rays are applied to the phosphor layer 159 to display images including color images.

Example 21

Flash Memories and Manufacturing the Flash Memories

The present example illustrates an electronic device of the present invention and a process for manufacturing the same using the positive type resist composition of the present invention. In the present example, resist films 226, 227, 229, and 232 were formed by using the positive type resist composition of the present invention.

Figure 16A:
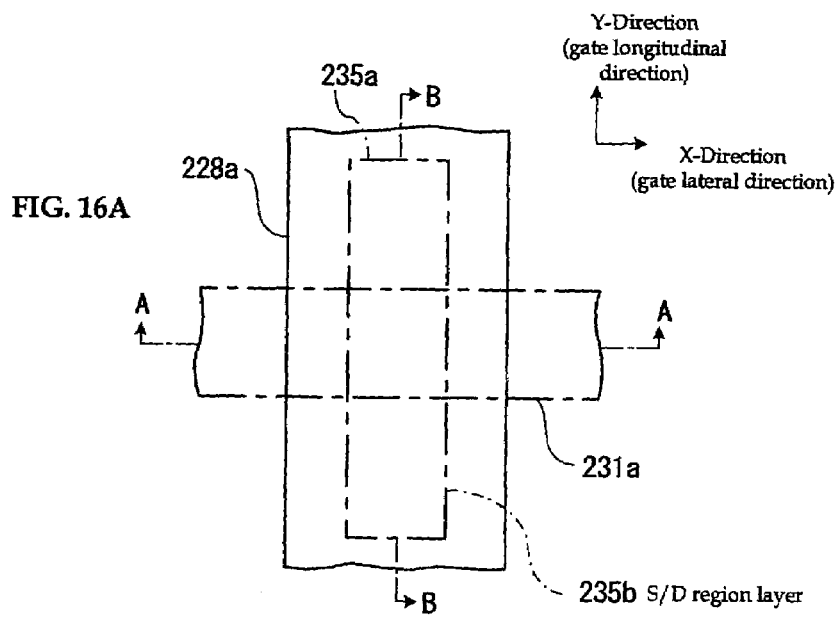
FIGS. 16A and 16B are plan views of one example of a flash erasable programmable read-only memory (flash EPROM) as one example of the electronic device of the present invention.
Figure 16B:
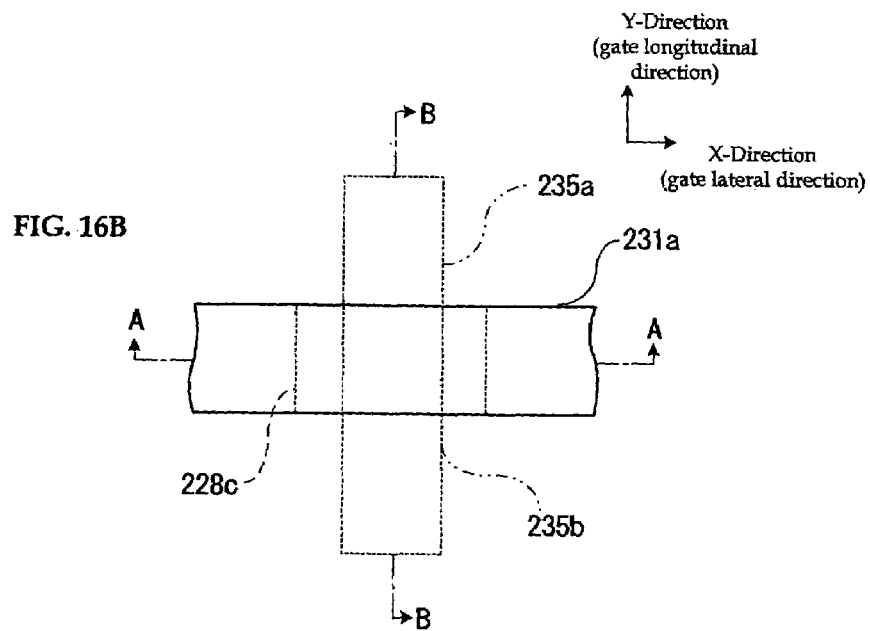

FIGS. 16A and 16B are top views (plan views) of a floating-gate tunnel oxide (FLOTOX) or EPROM tunnel oxide (ETOX) flash EPROM. FIGS. 17A, 17B, 17C, 18D, 18E, 18F, 19G, 19H, and 19I are schematic sectional views showing a process for manufacturing the flash EPROM. In these figures, the left areas are schematic sectional views (sectional views taken along lines A-A) of a memory cell unit (a first element region) in a portion in which a MOS transistor having a floating gate electrode in a gate width direction (in the X direction in FIG. 16A) is to be formed. The central areas are schematic sectional views (sectional views taken along lines B-B) of the memory cell unit in the same portion in the left areas in a gate length direction (in the Y direction in FIG. 16A) perpendicular to the X direction. The right areas are schematic sectional views (sectional views taken along the line A-A in FIGS. 16A and 16B) of a portion on which a MOS transistor is to be formed in a peripheral circuit unit (a second element region).

Initially, with reference to FIG. 17A, a $SiO_2$ film was selectively formed in a devise isolation region on a p-type Si substrate 222, so as to form a field oxide film 223. Next, a $SiO_2$ film was formed by thermal oxidation to a thickness of 100 angstroms to 300 angstroms, so as to form a first gate insulating film 224a in the MOS transistor in the memory cell unit (first element region). In other process, a $SiO_2$ film was formed by thermal oxidation to a thickness of 100 to 500 angstroms, so as to form a second gate insulating film 224b in the MOS transistor in the peripheral circuit unit (second element region). To form the first gate insulating film 224a and the second gate insulating film 224b in the same thickness, oxide films may be formed in one process.

Next, also with reference to FIG. 17A, the peripheral circuit unit was masked using a resist film 226 to control a threshold voltage for the formation of a MOS transistor having n-type depletion type channels in the memory cell unit. As a n-type dopant, phosphorus (P) or arsenic (As) was injected into a region to be a channel region directly below the floating gate electrode by ion implantation at a dose of $1\times10^{11}$ cm$^{-2}$ to $1\times10^{14}$ cm$^{-2}$, so as to form a first threshold control layer 225a. The dose and conduction type of the dopant can be appropriately selected depending on whether the channel is a depletion type or an accumulation type.

Next, with reference to FIG. 17B, the memory cell unit was masked using a resist film 227 to control a threshold voltage for the formation of a MOS transistor having n-type depletion type channels in the peripheral circuit unit. As an n-type dopant, phosphorus (P) or arsenic (As) was injected into a region to be a channel region directly below the gate electrode by ion implantation at a dose of $1\times10^{11}$ to $1\times10^{14}$ cm$^{-2}$, so as to form a second threshold control layer 225b.

Next, with reference to FIG. 17C, a first polysilicon film (first conductive film) 228 having a thickness of 500 to 2000 angstroms was formed on the entire surface of the article as a floating gate electrode of the MOS transistor of the memory cell unit and as a gate electrode of the MOS transistor in the peripheral circuit unit.

Figures 18D, 18E, 18F:
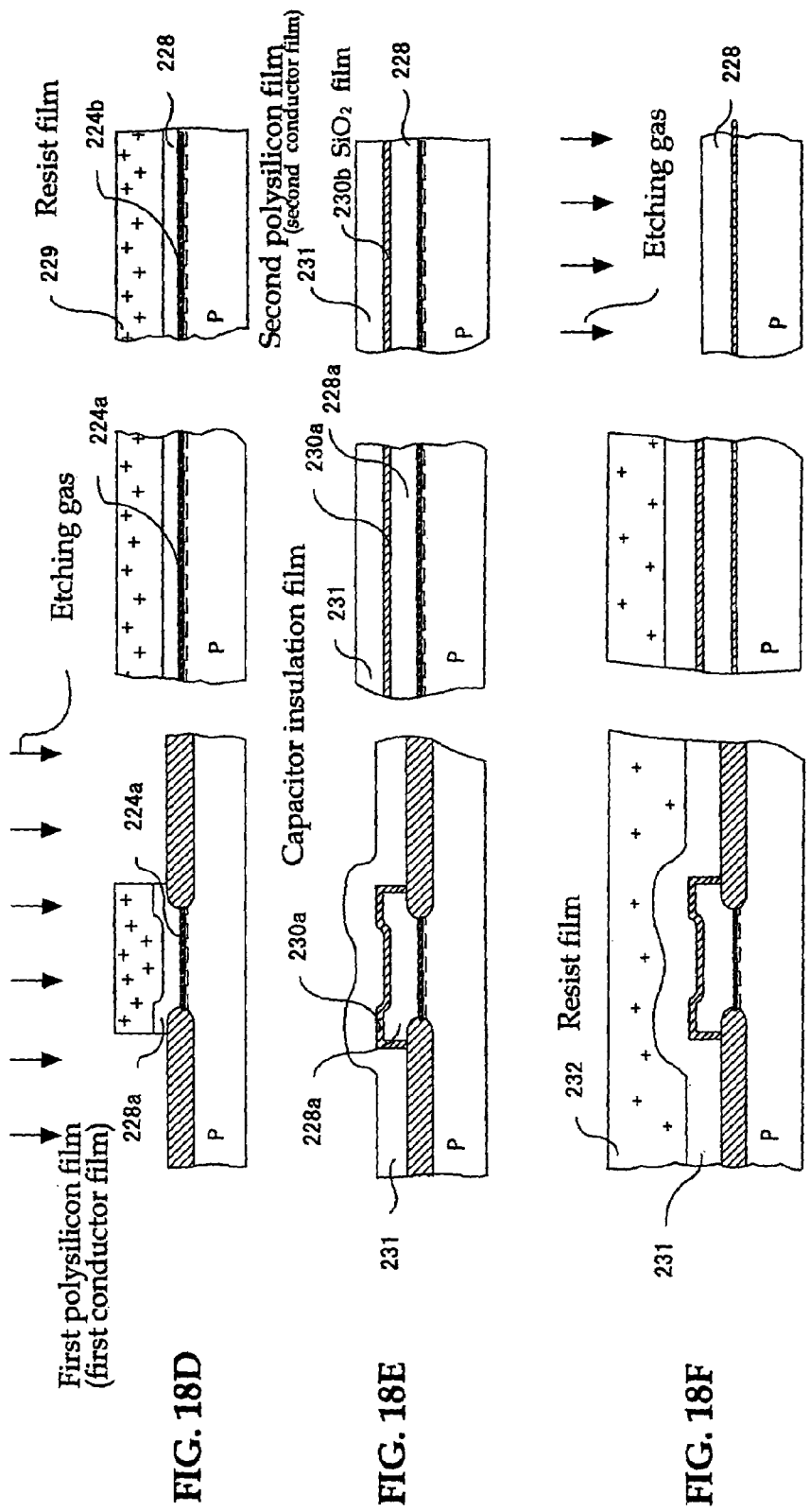
FIGS. 18D, 18E and 18F are schematic sectional views showing one example of a process for manufacturing a flash EPROM as the electronic device of the present invention.

With reference to FIG. 18D, a resist film 229 was formed, the first polysilicon film 228 was patterned using the resist film 229 as a mask, so as to form a floating gate electrode 228a in the MOS transistor in the memory cell unit. In this procedure, the first polysilicon film 228 was patterned in the X direction to be intended dimensions and was not patterned in the Y direction to thereby leave a region to be a source-drain (S/D) layer covered by the resist film 229.

With reference to FIG. 18E, the resist film 229 was stripped, a SiO$_2$ film having a thickness of about 200 angstroms to about 500 angstroms was formed by thermal oxidation, so as to form a capacitor insulating film 230a so as to cover the floating gate electrode 228. During this procedure, a capacitor insulating film 230b made of a SiO$_2$ film was also formed on the first polysilicon film 228 in the peripheral circuit unit. These capacitor insulating films 230a and 230b formed herein comprise a SiO$_2$ film alone but they may comprise a multilayer film having two to three layers of SiO$_2$ film and Si$_3$N$_4$ film.

Next, with reference to FIG. 18E, a second polysilicon film (second conductive film) 231 was formed to a thickness of 500 angstroms to 2000 angstroms so as to cover the floating gate electrode 228a and the capacitor insulating film 230a. The second polysilicon film 231 would serve as a control gate electrode.

With reference to FIG. 18F, the memory cell unit was masked with a resist film 232, the second polysilicon film 231 and the capacitor insulating film 230b in the peripheral circuit unit were removed in turn by etching to thereby expose the first polysilicon film 228.

With reference to FIG. 19G, the second polysilicon film 231, the capacitor insulating film 230a, and the first polysilicon film 228a of the memory cell unit, which first polysilicon film 228a had been patterned only in the X direction, were patterned in the Y direction to target dimensions of a first gate 233a using the resist film 232 as a mask. Thus, a multilayer assemblage of a control electrode 231a, a capacitor insulating film 230c, and a floating gate electrode 228c having a width of about 1 μm in the Y direction was formed. In addition, the first polysilicon film 228 in the peripheral circuit unit was patterned to target dimensions of a second gate 233b, so as to form a gate electrode 228b having a width of about 1 μm.

With reference to FIG. 19H, phosphorus (P) or arsenic (As) was injected at a dose of $1\times10^{14}$ to $1\times10^{16}$ cm$^{-2}$ into the element forming region of the Si substrate 222 by ion injecting using the multilayer assemblage of the control electrode 231a, the capacitor insulating film 230c, and the floating gate electrode 228c in the memory cell unit, so as to form n-type source and drain (S/D) region layers 235a and 235b. In addition, phosphorus (P) or arsenic (As) as a n-type dopant was injected at a dose of $1\times10^{14}$ to $1\times10^{16}$ cm$^{-2}$ into the element forming region of the Si substrate 222 by ion implantation using the gate electrode 228b in the peripheral circuit unit as a mask, so as to form S/D region layers 236a and 236b.

With reference to FIG. 19I, a phosphate-silicate glass film (PSG film) about 5000 angstroms thick was formed as an interlayer insulating film 237 so as to cover the first gate 233a in the memory cell unit and the second gate 233b in the peripheral circuit unit.

Subsequently, contact holes 238a, 238b, 239a, and 239b were formed on the interlayer insulating film 237 on the S/D region layers 235, 235b, 236a, and 236b, respectively. S/D electrodes 240a, 240b, 241a, and 241b were then formed respectively.

Thus, a flash EPROM was manufactured as a semiconductor device as shown in FIG. 19I.

In the above-manufactured flash EPROM, the second gate insulating film 224b in the peripheral circuit unit remains covered by the first polysilicon film 228 or the gate electrode 228b after its formation (FIGS. 17C to 18F) and thereby keeps its initial thickness after its formation. Accordingly, the thickness of the second gate insulating film 224b can be easily controlled, and the concentration of a conductive dopant can be easily controlled for the control of the threshold voltage.

In the example, the first gate 233a was formed by initially patterning in the gate width direction (the X direction in FIG. 16A) to a set width and then patterning in the gate length direction (the Y direction in FIG. 16A) to a target width to form. Alternatively, the first gate 233a may be formed by initially patterning in the gate longitudinal direction (the Y direction in FIG. 16A) to a set width and then patterning in the gate lateral direction (the X direction in FIG. 16A) to a target width.

Another flash EPROM was manufactured by the manufacturing steps shown in FIGS. 17A to 19I, except that the processes subsequent to the process of FIG. 18F are changed to those shown in FIGS. 20A, 20B, and 20C. The manufacturing is similar to the manufacturing in FIGS. 17A to 19I, except the following procedure. Specifically, with reference to FIG. 20A, a tungsten (W) film or a titanium (Ti) film having a thickness of 2000 angstroms was formed as a high-melting metal film (fourth conductive film) 242 on the second polysilicon film 231 in the memory cell unit and the first polysilicon film 228 in the peripheral circuit unit, so as to form a polycide film. Subsequent processes of FIGS. 20B and 20C to the process of FIG. 20A were performed in the same manner as in those of FIGS. 19G, 19H, and 19I and a detail description thereof is omitted. The same components in FIGS. 20A, 20B, and 20C as in FIGS. 19G, 19H, and 19I have the same reference numerals.

Thus, a flash EPROM as a semiconductor device was manufactured as shown in FIG. 20C.

The above-manufactured flash EPROM has the high-melting metal films (fourth conductive films) 242a and 242b on the control gate electrode 231a and the gate electrode 228b and can thereby further reduce an electrical resistance.

In this device, the high-melting metal films 242a and 242b are used as the fourth conductive films. Alternatively, titanium silicide films and other high-melting metal silicide films can be used.

Figure 21A:
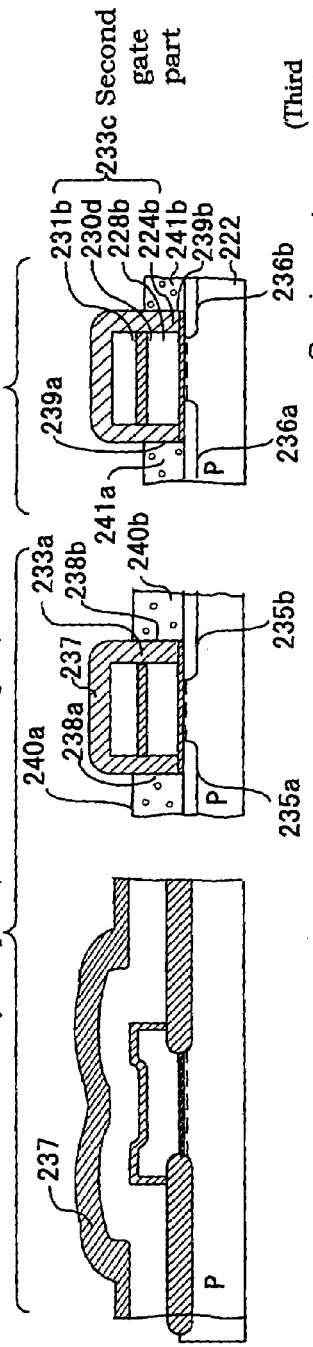
FIGS. 21A, 21B, and 21C are schematic sectional views showing other example of a process for manufacturing a EPROM as the electronic device of the present invention.
Figure 21B:
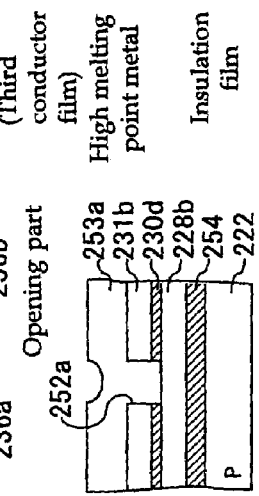
Figure 21C:
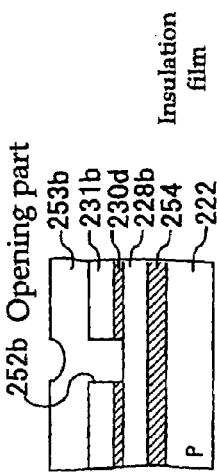

Another flash EPROM was manufactured by the manufacturing procedure shown in FIGS. 17A to 19I, except for processes shown in FIGS. 21A, 21B, and 21C. Specifically, with reference to FIG. 21A, the second gate 233c in the peripheral circuit unit (second element region) had a multilayer structure comprising a first polysilicon film (first conductive film) 228b, a $SiO_2$ film (capacitor insulating film) 230d, and a second polysilicon film (second conductive film) 231b as in the first gate 233a in the memory cell unit. With reference to FIG. 21B or 21C, the first polysilicon film 228b and the second polysilicon film 231b were bridged, so as to form a gate electrode.

More specifically, with reference to FIG. 21B, the first polysilicon film 228b and the second polysilicon film 231b were bridged by forming an opening 252a penetrating the first polysilicon film (first conductive film) 228b, the $SiO_2$ film (capacitor insulating film) 230d, and the second polysilicon film (second conductive film) 231b at another point than the second gate 233c shown in FIG. 21A, for example, on the insulating film 254, and filling the opening 252a with a third conductive film 253a such as a W film, a Ti film or another high-melting metal film. Alternatively, with reference to FIG. 21C, the first polysilicon film 228b and the second polysilicon film 231b were bridged by forming an opening 252b penetrating the first polysilicon film (first conductive film) 228b and the $SiO_2$ film (capacitor insulating film) 230d, thereby exposing the lower first polysilicon film 228b at the bottom of the opening 252b, and filling the opening 252b with a high-melting metal film 253b such as a W film or a Ti film.

In the above-manufactured flash EPROM, the second gate 233c in the peripheral circuit unit has the same structure with the first gate 233a in the memory cell unit. Accordingly, the memory cell unit and the peripheral circuit unit can be formed in the same process to thereby efficiently simplify processes of the manufacturing process.

In this procedure, the third conductive film 253a or 253b and the high-melting metal film (fourth conductive film) 242 were formed independently. Alternatively, these films may be formed concurrently as a high-melting metal film in common.

Example 22

Manufacturing Magnetic Heads

The present example relates to manufacturing a magnetic head as an application example of the resist pattern of the present invention using the positive type resist composition of the present invention. In the Example 22, the following resist patterns 302 and 326 are resist patterns formed by using the positive type resist composition of the present invention.

Figure 22:
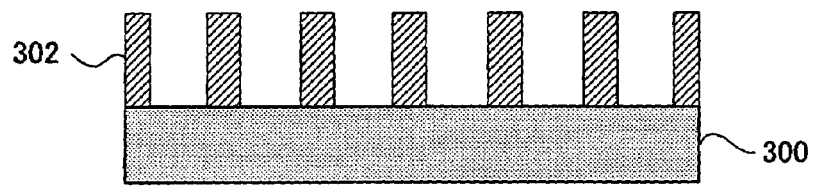
FIGS. 22A, 22B, 22C and 22D are schematic sectional views showing one example of processes for manufacturing a magnetic head using a resist pattern formed of the positive type resist composition of the present invention.
Figure 22:
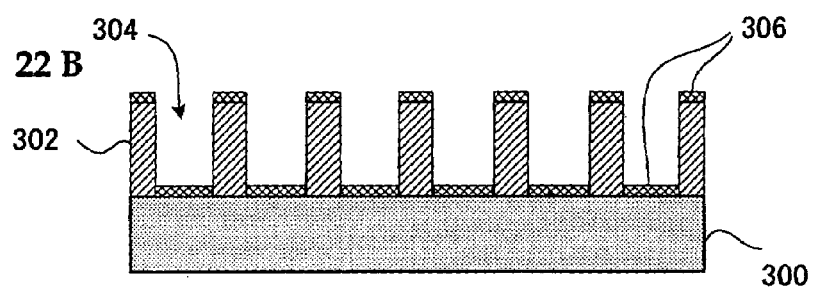
Figure 22:
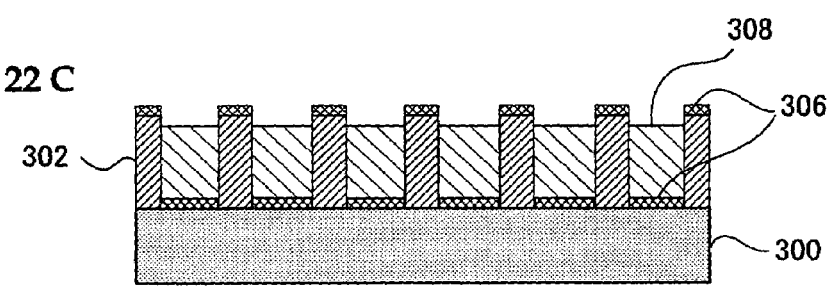
Figure 22:
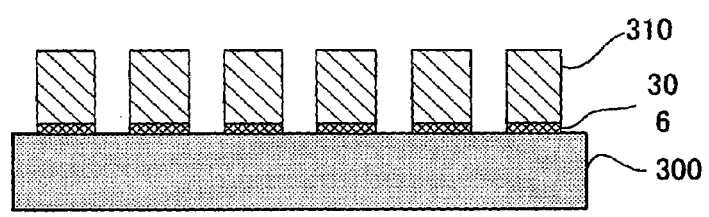

FIGS. 22A; 22B, 22C, and 22D show steps for manufacturing a magnetic head.

Initially, with reference to FIG. 22A, a resist film was formed to a thickness of 6 μm on an interlayer insulating layer 300, was exposed to light, was developed so as to form a resist pattern 302 having an opening pattern for the formation of a spiral thin film magnetic coil.

Next, with reference to FIG. 22B, a plated underlying layer 306 comprising a multilayer structure having a Ti contact film 0.01 μm thick and a Cu contact film 0.05 μm thick was formed by vapor deposition on the resist pattern 302 and on the exposed surface of the interlayer insulating layer 300 at the bottom of the opening 304 where the resist pattern 302 was not formed.

With reference to FIG. 22C, a Cu-plated film 3 μm thick as a thin film conductor 308 was formed on the surface of the plated underlying layer 306 above the exposed surface of the interlayer insulating layer 300 at the bottom of the opening 304 where the resist pattern 302 was not formed.

With reference to FIG. 22D, the resist pattern 302 was dissolved, was removed by lift-off from the interlayer insulating layer 300, so as to form a spiral thin film magnetic coil 310 derived from the spiral pattern of the thin film conductor 308.

Thus, a magnetic head was manufactured.

The above-manufactured magnetic head has the thin film magnetic coil 310 in fine and precise dimensions, since the fine spiral pattern was formed by means of the resist pattern 302 prepared by using the positive type resist composition of the present invention. In addition, the magnetic head can be satisfactorily manufactured in mass production.

Another magnetic head was manufactured by processes shown in FIGS. 23 to 28.

Figure 23:
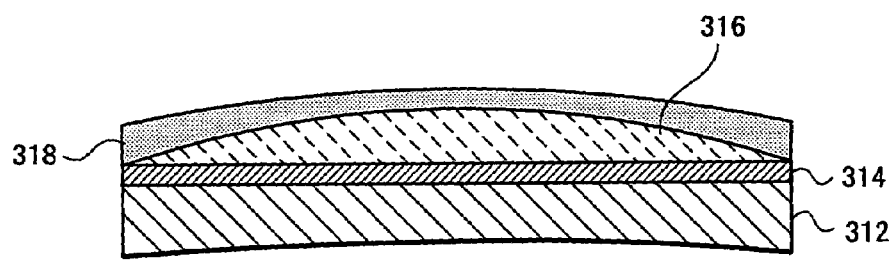
FIG. 23 is a schematic sectional view showing one example of other processes for manufacturing a magnetic head using a resist pattern formed by the use of the positive type resist composition of the present invention.

With reference to FIG. 23, a gap layer 314 was formed by sputtering so as to cover a ceramic non-magnetic substrate 312. The non-magnetic substrate 312 had an insulating layer of silicon oxide, a conductive underlying layer of a Ni—Fe permalloy formed by sputtering, and a lower magnetic layer of a Ni—Fe permalloy formed in advance on its surface. These layers are not shown in the figures. A resin insulating film 316 was formed from a thermosetting resin in a set region on the gap layer 314 except a region to be a magnetic tip (magnetic head) of the lower magnetic layer (not shown). A positive type resist composition was then applied to the resin insulating film 316 so as to form a resist film 318.

Figure 24:
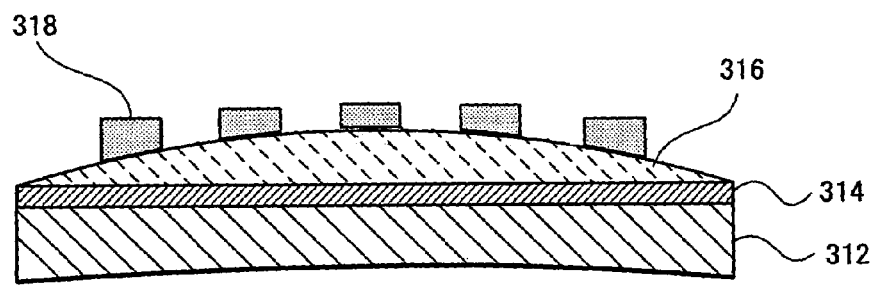
FIG. 24 is a schematic sectional view showing one example of other processes for manufacturing a magnetic head using a resist pattern formed by the use of the positive type resist composition of the present invention.
Figure 25:
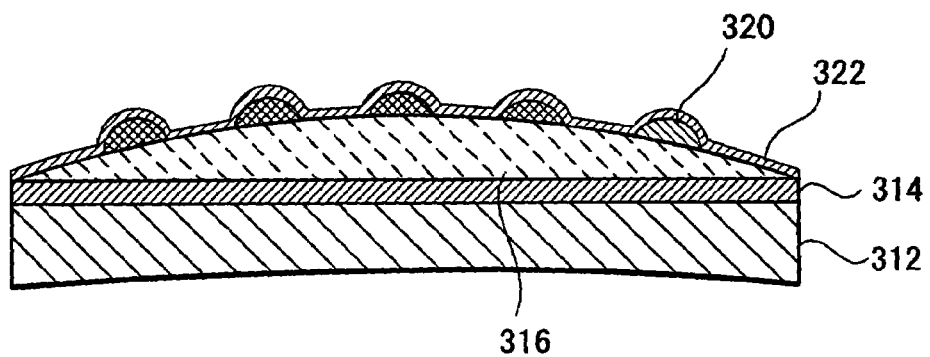
FIG. 25 is a schematic sectional view showing one example of other processes for manufacturing a magnetic head using a resist pattern formed by the use of the positive type resist composition of the present invention.

With reference to FIG. 24, the resist film 318 was exposed to light, was developed so as to form a spiral pattern. With reference to FIG. 25, the spiral-pattern resist film 318 was subjected to thermal curing at several hundred Celsius degrees for about one hour so as to form a protruded first spiral pattern 320. A conductive underlying layer 322 of Cu was formed so as to cover the surface of the first spiral pattern 320.

Figure 26:
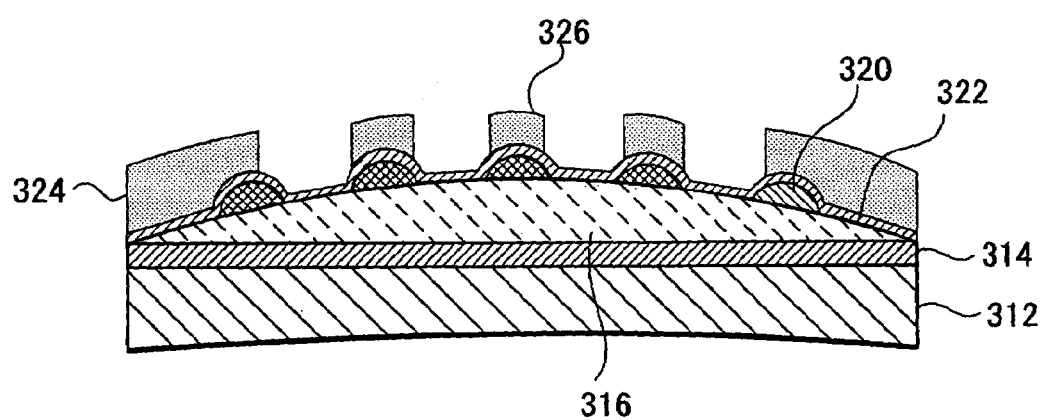
FIG. 26 is a schematic sectional view showing one example of other processes for manufacturing a magnetic head using a resist pattern formed by the use of the positive type resist composition of the present invention.

With reference to FIG. 26, the positive type resist composition of the present invention was applied to the conductive underlying layer 322 by spin coating, so as to form a resist film 324. Subsequently, the resist film 324 was patterned corresponding to the first spiral pattern 320, so as to form a resist pattern 326.

Figure 27:
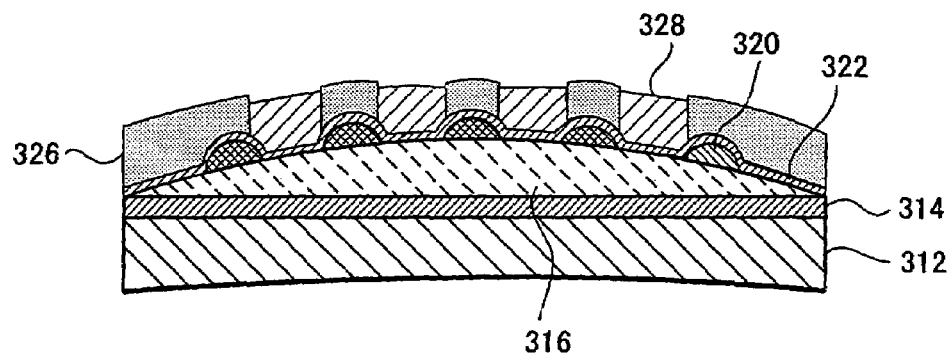
FIG. 27 is a schematic sectional view showing one example of other processes for manufacturing a magnetic head using a resist pattern formed by the use of the positive type resist composition of the present invention.
Figure 28:
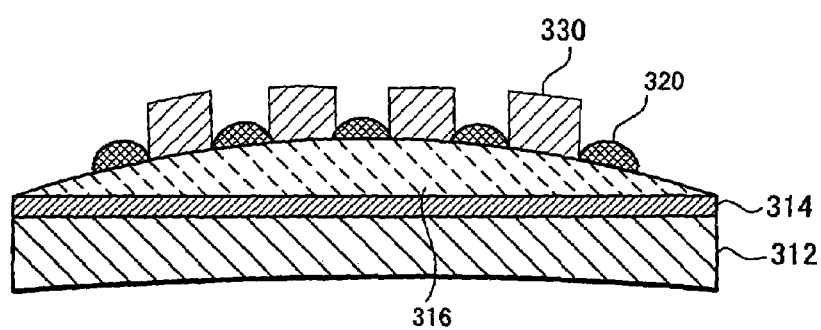
FIG. 28 is a schematic sectional view showing one example of other processes for manufacturing a magnetic head using a resist pattern formed by the use of the positive type resist composition of the present invention.

With reference to FIG. 27, a Cu conductive layer 328 was formed by plating on the exposed surface of the conductive underlying layer 322 where the resist pattern 326 was not formed. With reference to FIG. 28, the resist pattern 326 was lifted off from the conductive underlying layer 322 by dissolving and removing the resist pattern 326, so as to form a spiral thin film magnetic coil 330 derived from the Cu conductive layer 328.

Figure 29:
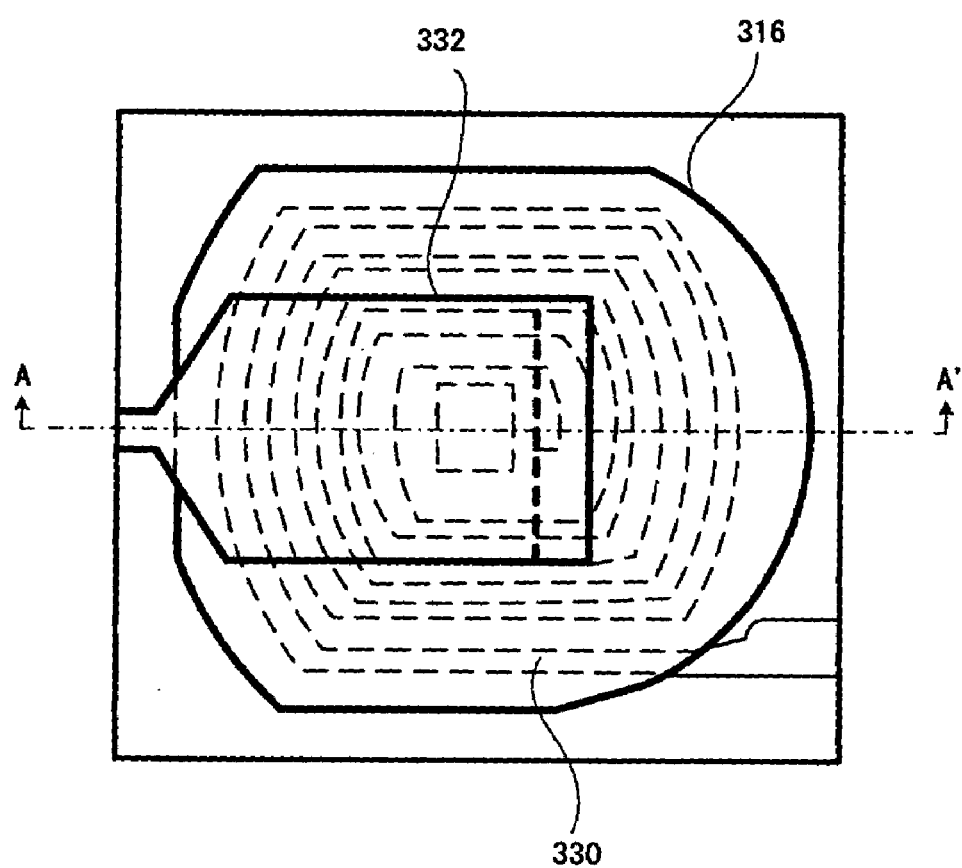
FIG. 29 is a plan view of one example of a magnetic head manufactured by the processes shown in FIGS. 23 through 28.

Thus, a magnetic head as shown in a plan view of FIG. 29 was manufactured. The magnetic head has a write magnetic pole 332 of a magnetic layer on the resin insulating film 316 with the thin-film magnetic coil 330 on its surface. In this device, the pattern of the write magnetic pole 332 made of a magnetic layer was formed by using the upper resist layer formed of the positive type resist composition of the present invention and the lower resist layer formed of the novolak resist, forming the upper pattern by exposure and development, vertically transferring the upper pattern to the lower layer by action of oxygen plasma, forming the plated layer, striping the resist, and etching the plated-base.

The above-manufactured magnetic head has the thin film magnetic coil 330 and the tip of the write magnetic pole 332 made of the magnetic layer in fine and precise dimensions with high aspect ratio, since the fine spiral pattern was formed by the use of the resist pattern 326 formed by using the positive type resist composition of the present invention. In addition, the magnetic head can be satisfactorily manufactured mass production.

The present invention can achieve the objects and solve the problems in conventional technologies. Specifically, the present invention can provide a resist pattern that is useful for manufacturing magnetic heads, semiconductor devices, and other electronic devices and can form fine patterns (fine traces); a process for forming a resist pattern which can efficiently form the resist pattern in a short time; a positive type resist composition that is useful for the formation of the resist pattern, is excellent in oxygen plasma resistance, resolution, storage stability, and other properties, is typically useful as a material for an upper resist in the two-layer resist process using i-line radiation, enables forming a resist film having fewer possibilities of side lobes when patterned with a halftone mask, and can contribute to higher integration of electronic devices; an alkali-soluble siloxane polymer that is useful for the positive type resist composition; a positive type resist composition that can form resist films having high oxygen plasma resistance with fewer side lobes upon patterning using a halftone mask; an electronic device having a fine pattern (fine traces) formed by the use of the resist pattern; and a process for manufacturing an electronic device which can efficiently manufacture the electronic device in a short time.

What is claimed is:

1. A process for manufacturing an electronic device, comprising the steps of:

forming a resist pattern on an underlying layer by a process for forming a resist pattern; and patterning the underlying layer by one of etching and lift-off, utilizing the resist pattern as a mask, wherein the process for forming a resist pattern comprises the steps of:

forming a resist film utilizing a positive type resist composition; and forming a resist pattern by developing, wherein the positive type resist composition comprises:

an alkali-soluble siloxane polymer expressed by the following Formula (1); and a photoreactive compound;

wherein a 1 μm thick resist film formed of the positive type resist composition has 5% to 60% of transmittance to i-line radiation;

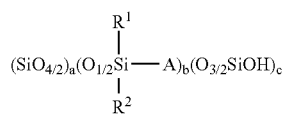

Formula (1)

$(SiO_{4/2})_a(O_{1/2}Si-A)_b(O_{3/2}SiOH)_c$
with $R^1$, $R^2$ substituents on Si in the Formula (1), $R^1$ and $R^2$ express a monovalent organic group, and may be identical or different;

"A" is a group expressed by the following Formula (2) having at least one phenolic hydroxyl group; and "a", "b," and "c" satisfy the following relation; a+b+c=1, and $0.02 \leq c \leq 0.20$, wherein in Formula (2), $R^3$, $R^4$ and $R^5$ express one of a hydrogen atom and a monovalent organic group, and may be identical or different; m expresses an integer; and n expresses an integer of 1 to 5,

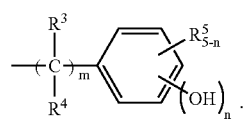

Formula (2)

2. A process for manufacturing an electronic device according to claim 1, wherein the 1 μm thick resist film formed of the positive type resist composition has 14% to 39% of transmittance to i-line radiation.

3. A process for manufacturing an electronic device according to claim 1, wherein "a" in the Formula (1) satisfies $0.25 \leq a \leq 0.60$.

4. A process for manufacturing an electronic device according to claim 1, wherein "a" in the Formula (1) satisfies $0.40 \leq a \leq 0.60$.

5. A process for manufacturing an electronic device according to claim 1, wherein the alkali-soluble siloxane polymer has a weight-average molecular weight of 1000 to 30000.

6. A process for manufacturing an electronic device according to claim 1, wherein the alkali-soluble siloxane polymer has a molecular weight distribution (Mw/Mn) of 1 to 5.

7. A process for manufacturing an electronic device according to claim 1, wherein "m" in the Formula (2) expresses an integer of 1 to 3.

8. A process for manufacturing an electronic device according to claim 1, wherein the alkali-soluble siloxane polymer is obtained by reacting at least one organosilicon compound with at least one tetraalkoxysilane, wherein the organosilicon compound is expressed either by Formula (3) or Formula (4);

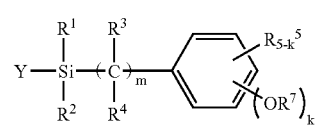

Formula (3)

in the Formula (3), $R^1$ and $R^2$ express a monovalent organic group, and may be identical or different;

$R^3$, $R^4$, and $R^5$ express one of a hydrogen atom and a monovalent organic group, and may be identical or different;

"Y" expresses one of "X" and $OR^6$, where the X expresses a halogen atom; and $R^6$ expresses one of a hydrogen atom and an alkyl group; the $R^7$ expresses a t-butyl group when Y=X, and $R^7$ expresses one of a hydrogen atom and a t-butyl group when Y=$OR^6$;

"m" expresses an integer; and

"k" expresses an integer of 1 to 5; or

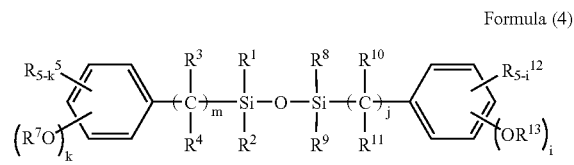

Formula (4)

in the Formula (4), $R^1$, $R^2$, $R^8$, and $R^9$ express a monovalent organic group and may be identical or different;

$R^3$, $R^4$, $R^5$, $R^{10}$, $R^{11}$, and $R^{12}$ express one of a hydrogen atom and a monovalent organic group, and may be identical or different;

$R^7$ and $R^{13}$ express one of a hydrogen atom and a t-butyl group, and may be identical or different;

"j" and "m" express an integer; and

"i" and "k" express an integer of 1 to 5.

9. A process for manufacturing an electronic device according to claim 8, wherein the reacting is carried out by hydrolysis and condensation reaction under a provision of an acid catalysis.

10. A process for manufacturing an electronic device according to claim 8, wherein the tetraalkoxysilane is at least one of tetramethoxysilane and tetraethoxysilane.

11. A process for manufacturing an electronic device according to claim 8, wherein the alkali-soluble siloxane polymer has silanol groups, and the alkali-soluble siloxane polymer is obtained by a reacting a part of the silanol groups with a compound expressed by the Formula (5):

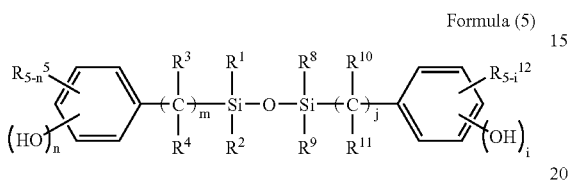

Formula (5)

in the Formula (5), $R^1$, $R^2$, $R^8$, and $R^9$ express a monovalent organic group, and may be identical or different;

$R^3$, $R^4$, $R^5$, $R^{10}$, $R^{11}$, and $R^{12}$ express one of a hydrogen atom and a monovalent organic group, and may be identical or different;

"j" and "in" express an integer; and

"i" and "n" express an integer of 1 to 5.

12. A process for manufacturing an electronic device according to claim 8, wherein the alkali-soluble siloxane polymer has silanol groups, and a part of the silanol groups is reacted with organosilicon compounds expressed by the Formula (3), in which "$R^7$" expresses a t-butyl group, and then the t-butyl group is substituted with a hydrogen atom by the acid catalysis, so as to form the alkali-soluble siloxane polymer;

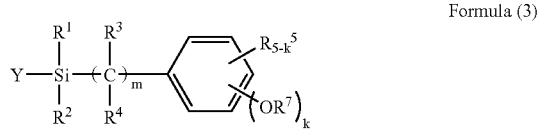

Formula (3)

in the Formula (3), $R^1$ and $R^2$ express a monovalent organic group, and may be identical or different;

$R^3$, $R^4$, and $R^5$ express one of a hydrogen atom and a monovalent organic group, and may be identical or different;

"Y" expresses a halogen atom;

"m" expresses an integer; and

"k" expresses an integer of 1 to 5.

13. A process for manufacturing an electronic device according to claim 1, wherein "A" in the Formula (1) is a group expressed by one of the Formulae (6) and (7).

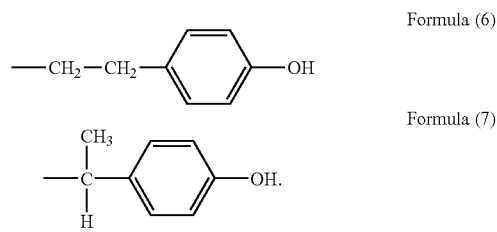

Formula (6)

Formula (7)

14. A process for manufacturing an electronic device according to claim 1, wherein the alkali-soluble siloxane polymer has silanol groups, and a part of hydrogen atoms of the silanol groups is substituted with groups expressed in the Formula (8);

Formula (8)

in the Formula (8), $R^{14}$, $R^{15}$, and $R^{16}$ express a monovalent organic group, and may be identical or different.

15. A process for manufacturing an electronic device according to claim 14, wherein 5% to 90% of the hydrogen atoms of the silanol groups are substituted with the group expressed by the Formula (8).

* * * * *